US010050041B1

(12) United States Patent
Yoon et al.

(10) Patent No.: US 10,050,041 B1
(45) Date of Patent: Aug. 14, 2018

(54) SEMICONDUCTOR DEVICE AND METHOD OF MANUFACTURING THE SAME

(71) Applicant: Samsung Electronics Co., Ltd., Suwon-si (KR)

(72) Inventors: Chan-Sic Yoon, Anyang-si (KR); Ho-In Ryu, Suwon-si (KR); Ki-Seok Lee, Busan (KR); Chang-Hyun Cho, Yongin-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/954,744

(22) Filed: Apr. 17, 2018

Related U.S. Application Data

(62) Division of application No. 14/981,975, filed on Dec. 29, 2015, now Pat. No. 9,985,034.

(30) Foreign Application Priority Data

Jan. 5, 2015 (KR) ........................ 10-2015-0000787

(51) Int. Cl.
*H01L 27/108* (2006.01)
*H01L 29/423* (2006.01)
*H01L 21/761* (2006.01)
*H01L 21/311* (2006.01)

(52) U.S. Cl.
CPC .. *H01L 27/10876* (2013.01); *H01L 21/31111* (2013.01); *H01L 21/761* (2013.01); *H01L 27/10814* (2013.01); *H01L 27/10855* (2013.01); *H01L 27/10891* (2013.01); *H01L 29/4236* (2013.01)

(58) Field of Classification Search
CPC combination set(s) only.
See application file for complete search history.

(56) References Cited

U.S. PATENT DOCUMENTS 7,612,406 B2  11/2009  Kluge
8,115,246 B2  2/2012  Kim et al.
8,274,111 B2  9/2012  Kim
(Continued)

FOREIGN PATENT DOCUMENTS

KR   10-2004-0069515 A   8/2004
KR       10-0934854     12/2009
(Continued)

*Primary Examiner* — Ratisha Mehta
(74) *Attorney, Agent, or Firm* — Muir Patent Law, PLLC

(57) ABSTRACT

A semiconductor device includes a substrate having an active region defined by a device isolation layer and at least a gate trench linearly extending in a first direction to cross the active region, the active region having a gate area at a bottom of the gate trench and a junction area at a surface of the substrate. The device further may include a first conductive line filling the gate trench and extending in the first direction, the first conductive line having a buried gate structure on the gate area of the active region. The device also may include a junction including implanted dopants at the junction area of the active region, and a junction separator on the device isolation layer and defining the junction. The junction separator may be formed of an insulative material and have an etch resistance greater than that of the device isolation layer.

10 Claims, 48 Drawing Sheets

(56) References Cited

U.S. PATENT DOCUMENTS

| | | | |
|---|---|---|---|
| 8,309,449 B2 | 11/2012 | Jeong et al. | |
| 8,581,337 B2 | 11/2013 | Kye et al. | |
| 2002/0135008 A1* | 9/2002 | Hirler | H01L 29/7813 257/302 |
| 2006/0180855 A1* | 8/2006 | Bhalla | H01L 29/1095 257/330 |
| 2014/0061736 A1 | 2/2014 | Hwang et al. | |
| 2014/0042554 A1 | 3/2014 | Yoon | |

FOREIGN PATENT DOCUMENTS

| | | |
|---|---|---|
| KR | 10-1019712 B | 3/2011 |
| KR | 10-2013-0125595 A | 11/2013 |
| KR | 10-2014-0032219 A | 3/2014 |

\* cited by examiner

SEMICONDUCTOR DEVICE AND METHOD OF MANUFACTURING THE SAME

CROSS-REFERENCE TO RELATED APPLICATIONS

This application is a divisional application of and claims priority to U.S. patent application Ser. No. 14/981,975 filed on Dec. 29, 2015, which claims priority under 35 U.S.C § 119 to Korean Patent Application No. 10-2015-0000787 filed on Jan. 5, 2015 in the Korean Intellectual Property Office, the disclosures of each of which are incorporated by reference herein in its entirety.

BACKGROUND

1. Field

This disclosure relates to semiconductor devices and methods of manufacturing the same, and more particularly, to semiconductor devices having buried gate structures and methods of manufacturing the same.

2. Description of the Related Art

As the recent semiconductor devices tend to be downsized and high integrated, the pattern width has been reduced and the channel length has been shortened in a cell transistor. Thus, it has been getting more difficult to obtain a sufficient refresh time of memory devices due to the short channel effect.

A recess channel array transistor (RCAT) has been introduced for obtaining a sufficient effective channel length. However, the RCAT frequently fails by a high gate-induced drain leakage (GIDL). A buried channel array transistor (BCAT) has been proposed in such a way that the surface of the gate electrode is positioned below the surface of the silicon substrate to thereby minimize the GIDL of the RCAT.

Particularly, the word lines of the BCAT tend to be arranged in a 6 $F^2$ (F: minimum feature size) layout and the pitch of the word lines can be reduced to about 0.5 F, the occupation area of each cell transistor can be remarkably reduced using this arrangement. Accordingly, both of the effective channel length and the chip size can be reduced in memory devices by using the BCAT.

However, the increase of the integration degree and the reduction of the occupation area tend to extremely reduce the area of the source/drain regions of the memory device, and thus in many cases the bit line contact and the storage node contact are electrically connected to each other.

Particularly, the isolation layer defining the drain region is likely to be removed from the substrate in an etching process for forming the contact hole in the drain region, thus the electrical insulation tends to be insufficient between the drain region and a neighboring source region. The insufficient electrical insulation between the drain region and the source region leads to the electrical short between the bit line contact and the storage node contact.

In addition, the gap distance between the neighboring source and drain regions may also be reduced due to the reduction of the occupation area, which makes it difficult to obtain a sufficient aligning margin when forming the bit line contact hole and the storage node contact hole.

SUMMARY

Example embodiments provide semiconductor devices having an etch stop layer on a device isolation layer such that the etch stop layer has an etching selectivity with respect to the device isolation layer by which the source region and the drain region is defined. Thus in some embodiments, the neighboring source and drain regions are sufficiently insulated from each other to thereby prevent the electrical shortage between the bit line contact and the storage node contact.

Other example embodiments provide methods of manufacturing a semiconductor device.

According to exemplary embodiments, a semiconductor device includes a substrate having an active region defined by a device isolation layer and at least a gate trench linearly extending in a first direction to cross the active region such that the active region may have a gate area at a bottom of the gate trench and a junction area at a surface of the substrate, a first conductive filling the gate trench and extending in the first direction, the first conductive line having a buried gate structure on the gate area of the active region, a junction at the junction area of the active region, and a junction separator on the device isolation layer and defining the junction such that the junction separator may have an etch resistance greater than that of the device isolation layer.

In example embodiments, the first conductive line may include a gate insulation layer covering a bottom surface and side surfaces of the gate trench, a gate line filling a lower portion of the gate trench on the gate insulation layer and a capping layer filling an upper portion of the gate trench on the gate line.

In example embodiments, the capping layer and the junction may protrude from the device isolation layer and the junction separator may be arranged on the gate insulation layer and the device isolation layer together without contacting a side surface of the capping layer such that an upper surface of the junction separator may be coplanar with an upper surface of the capping layer.

In example embodiments, the upper surface of the gate insulation layer may be coplanar with an upper surface of the device isolation layer.

In example embodiments, the gate insulation layer and the device isolation layer may have a same etching rate.

In example embodiments, the junction separator may have an etching rate smaller than that of the device isolation layer in an etching process for forming a contact hole through which the junction is exposed.

In example embodiments, the device isolation layer may include a sidewall oxide layer and the junction separator includes a silicon nitride layer.

In example embodiments, the semiconductor device may further include a buffer layer on the substrate on which the capping layer and the junction may protrude from the device isolation layer such that the buffer layer may be arranged along a surface profile of the substrate to thereby cover the capping layer, the device isolation layer and the junction and the junction separator may be arranged on the buffer layer.

In example embodiments, the buffer layer may have an etching rate greater than that of the junction separator in an etching process for forming a contact hole through which the junction member may be exposed.

In example embodiments, the buffer layer may include a silicon oxide layer and the junction separator includes a silicon nitride layer.

In example embodiments, the capping layer may include a silicon nitride layer and the device isolation layer includes a sidewall oxide layer.

In example embodiments, the buffer layer may have a thickness smaller than that of the gate insulation layer such that the buffer layer may be shaped into a ring which encloses the junction and is isolated by the junction separator.

In example embodiments, the semiconductor device may further include a buffer layer on the substrate on which the junction may protrude from the device isolation layer and the capping layer and the device isolation layer may have the same upper surface in such a configuration that the buffer layer may be arranged along a surface profile of the substrate to thereby cover the device isolation layer, the capping layer and the protruded junction and the junction separator may be arranged on the buffer layer.

In example embodiments, the buffer layer may be shaped into a loop enclosing the junction and having a thickness greater than a thickness of the gate insulation layer. The buffer layer may be isolated by the junction separator.

In example embodiments, the device isolation layer and the buffer layer may include an oxide layer and the capping layer and the junction separator includes a nitride layer.

In example embodiments, a pair of the gate trenches may cross a single active region of the substrate such that a pair of the gate areas may be provided on the single active region and the junction area may include a first junction area at a central portion of the active region between the gate areas and a second junction area at both end portions of the active region.

In example embodiments, the buried gate structure may be arranged on each of the gate areas and the junction includes a drain junction arranged on the first junction area at the central portion of the active region and a source junction arranged on the second junction area at both end portion of the active region, thereby providing a pair of buried cell array transistors on the single active region.

In example embodiments, the semiconductor device may further include a second conductive line extending in a second direction and making contact with the drain junction and a charge storage element making contact with the source junction.

In example embodiments, the second conductive line may include a bit line contact making contact with the drain junction and the junction separator and a bit line extending in the second direction and contacting the bit line contact.

In example embodiments, the active region may be shaped into a bar slanted with respect to the first direction and a unit cell has a layout of 6 $F^2$ (F: minimum feature size) in the active region.

In some embodiments, a method includes providing and/or forming the various components of the semiconductor device or devices described in the above examples.

According to exemplary embodiments a method of manufacturing a semiconductor device includes providing a substrate having at least an active region and the active region may be defined by a device isolation layer in a field region of the substrate. Then, a gate trench may be formed on the substrate to cross the active region such that the active region may be divided into a gate area lower than an upper surface of the substrate and a junction area at the upper surface of the substrate. A first conductive line may be formed to fill up the gate trench and to extend in the first direction. The first conductive line may include a buried gate structure on the gate area of the active region. A junction separator may be formed on the device isolation layer such that the junction area may be defined and isolated by the junction separator. The junction separator may have an etch resistance greater than the device isolation layer. Junctions may be formed at surface portions of the junction area.

In example embodiments, the first conductive line may be formed as follows. A gate insulation layer may be formed on a bottom surface and side surfaces of the gate trench, and a gate line may be formed on the gate insulation layer to fill a lower portion of the gate trench in the first direction. Then, a capping line may be formed on the gate line to fill an upper portion of the gate trench in the first direction.

In example embodiments, the junction separator may be formed as follows. The device isolation layer and the gate insulation layer may be partially removed from the substrate, thereby forming a recess around the junction area such that side surfaces of the junction area and the capping layer may be exposed in the recess. Then, a preliminary junction separator may be formed on the substrate to a thickness to fill the recess. The preliminary junction separator may include insulation materials of which etching resistance may be greater than that of the device isolation layer. The preliminary junction separator may be partially removed from the substrate in such a way that the preliminary junction separator may remain just in the recess.

In example embodiments, the device isolation layer and the gate insulation layer may be removed from the substrate by a wet etching process using a phosphoric aqueous solution as an etchant.

In example embodiments, the device isolation layer and the gate insulation layer may include an oxide layer.

In example embodiments, the preliminary junction separator may include a silicon nitride layer.

In example embodiments, an upper surface of the gate insulation layer may be coplanar with an upper surface of the device isolation layer in the recess.

In example embodiments, the preliminary junction separator may be partially removed from the substrate by a planarization process until upper surfaces of the junction and the capping layer are exposed.

In example embodiments, before forming the preliminary junction separator, a buffer layer may be further formed on the substrate along a surface profile of the recess and the protruded junction area and the capping layer and the preliminary junction separator may be formed on the buffer layer to fill up the recess defined by the buffer layer.

In example embodiments, the preliminary junction separator may be partially removed from the substrate by a planarization process until an upper surface of the buffer layer may be exposed.

In example embodiments, a thickness of the buffer layer may be smaller than that of the gate insulation layer, and thus the buffer layer may be formed into a loop enclosing the junction area and combinations of the loop-shaped buffer layer and the junction area may be isolated from one another by the junction separator.

In example embodiments, an etch rate of the buffer layer may be greater than that of the junction separator in a same etching process.

In example embodiments, the buffer layer may be formed by an atomic layer deposition (ALD) process for depositing an oxide layer on the substrate.

In example embodiments, before forming the buffer layer, the capping layer may be further partially removed from the substrate such that upper surfaces of the capping layer, the gate insulation layer and the device isolation layer may be coplanar with one another and the junction area may protrude from the device isolation layer, so that the recess may expand over the capping layer and the buffer layer may be formed on the substrate along a surface profile of the recess and the protruding junction area and the preliminary junction separator may be formed on the buffer layer to fill up the recess expanded over the capping layer.

In example embodiments, a pair of the gate trenches may cross a single one of the active regions, so that the single active region may be divided into a pair of the gate areas on which the buried gate structure may be formed, respectively, a first junction area between the gate areas at a central portion thereof on which a drain junction may be formed and a second junction area at both end portions thereof on which a source junction may be formed.

In example embodiments, a second conductive line may be further formed on the substrate including the first conductive line and the source and drain junctions in such a way that the second conductive line may extend in a second direction and contact the drain junction. Then, a charge storage element may be further formed on the insulation layer in such a way that the charge storage element may contact the source junction.

In example embodiments, the second conducive line may be formed as follows. A first layer may be formed on the substrate including the first conductive layer and the junction separator, and then the first layer may be partially removed from the substrate to thereby form a first contact hole through which the drain junction and a portion of the junction separator around the drain junction may be exposed. A bit line contact may be formed in the first contact hole such that the bit line contact may make contact with the drain junction and the exposed portion of the junction separator. Thereafter, a conductive bit line may be formed in such a way that the bit line may make contact with the bit line contact and may extend in the second direction.

In example embodiments, the charge storage element may be formed as follows. An insulation layer may be formed on the substrate including the first layer and the first conductive line such that a gap space between the second conductive lines may be filled, and then the insulation layer and the first layer under the insulation layer may be partially and sequentially removed from the substrate to thereby form a second contact hole through which the source junction and a portion of the junction separator around the source junction may be exposed. A storage node contact may be formed in the second contact hole such that the storage node contact may make contact with the source junction and the exposed portion of the junction separator. A capacitor may be formed on the insulation layer to make contact with the storage node contact.

In example embodiments, the junction separator may be resistive to the etching process for removing the insulation layer and the first layer, so that the storage node contact on the source junction and the exposed portion of the junction separator in the second contact hole may be electrically separated from the bit line contact on the drain junction and the exposed junction separator in the first contact hole.

According to example embodiments of the present inventive concept, the junction separator may be provided on the device isolation layer between the neighboring source junction and drain junction in a buried channel array transistor and the junction separator may have a more excellent etch resistance and electrical insulation than the device isolation layer.

Thus, although the storage node contact may expand over the alignment marginal area of the field region around the source junction due to the misalignment of the source junction and the storage node contact hole, the electrical shortage between the neighboring bit line contact and the storage node contact may be sufficiently prevented by the junction separator. Since the junction separator may have much more etch-resistive than the device isolation layer such as the sidewall oxide layer, the high insulating materials may be still remain in the neighborhood of the source junction including the alignment marginal area and thus the source junction may be sufficiently isolated by the junction separator in spite of the cell size reduction. The drain junction D may also be defined and insulated by the same junction separator in the same way. Therefore, the electrical connection between the neighboring source and drain junctions may be prevented by the junction separator when the semiconductor devices are downsized with high integration degree, thereby improving the operational reliability and stability of the semiconductor devices.

BRIEF DESCRIPTION OF THE DRAWINGS

These and other features of the inventive concept will become more apparent by describing in detail exemplary embodiments thereof with reference to the accompanying drawings of which.

Figure 1:
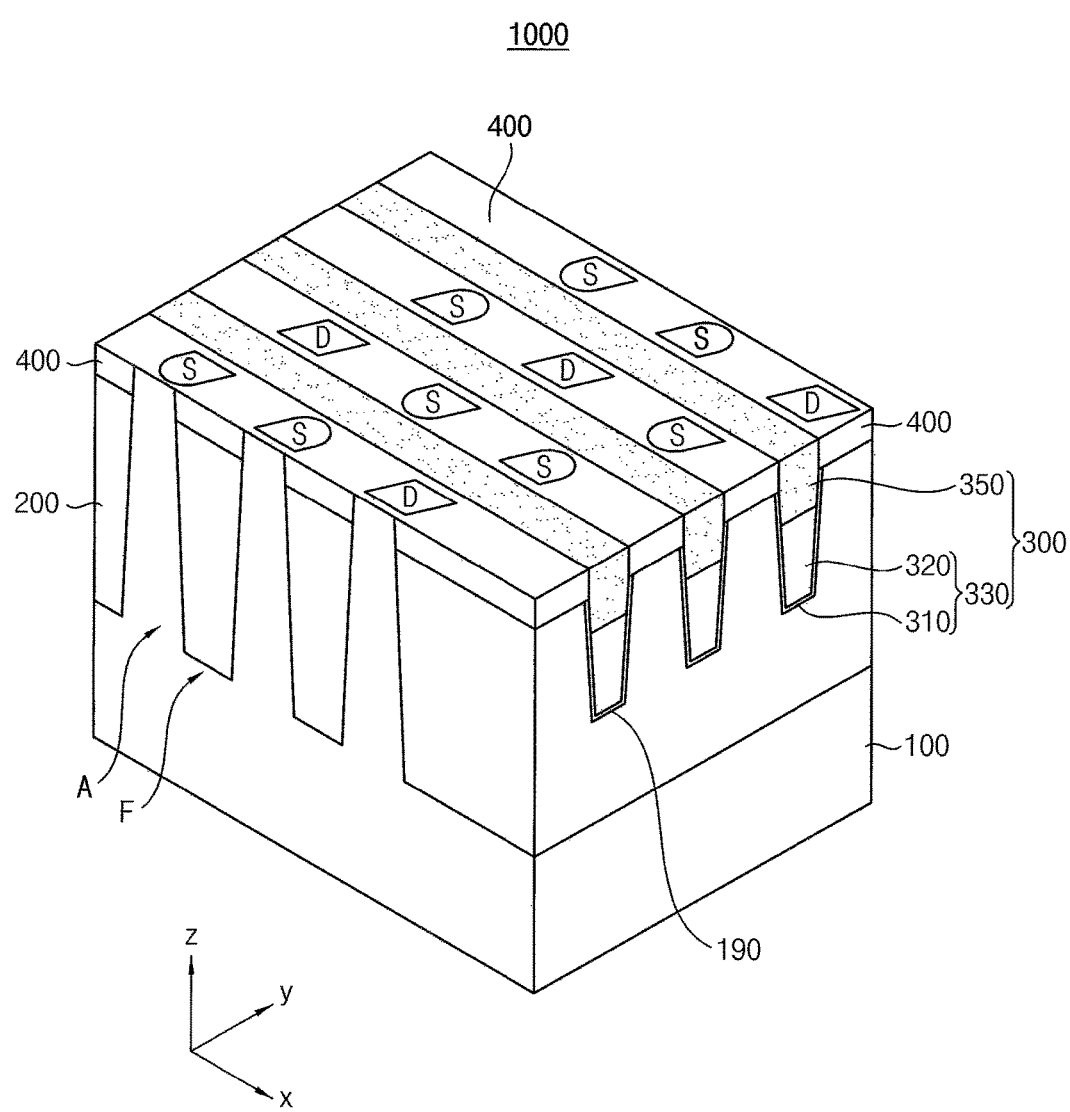
FIG. 1 is a perspective view illustrating a semiconductor device in accordance with certain example embodiments of the present inventive concept.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

Example embodiments will now be described more fully with reference to the accompanying drawings. Embodiments, however, may be embodied in many different forms and should not be construed as being limited to the embodiments set forth herein. In the drawings, the thicknesses of layers and regions may be exaggerated for clarity.

It will be understood that when an element is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. "Directly adjacently electrically connected" refers to two items that are directly adjacent to each other physically and are also electrically connected to each other.

As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. Unless the context indicates otherwise, these terms are only used to distinguish one element, component, region, layer, and/or section from another element, component, region, layer, and/or section, for example as a naming convention. For example, a first element, component, region, layer, and/or section described in one portion of the specification could be termed a second element, component, region, layer, and/or section in another portion of the specification without departing from the teachings of example embodiments. In addition, in certain cases, even if a term is not described using "first," "second," etc., in the specification, it may still be referred to as "first"

or "second" in a claim in order to distinguish different claimed elements from each other.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to limit the scope of the example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings.

Figure 2:
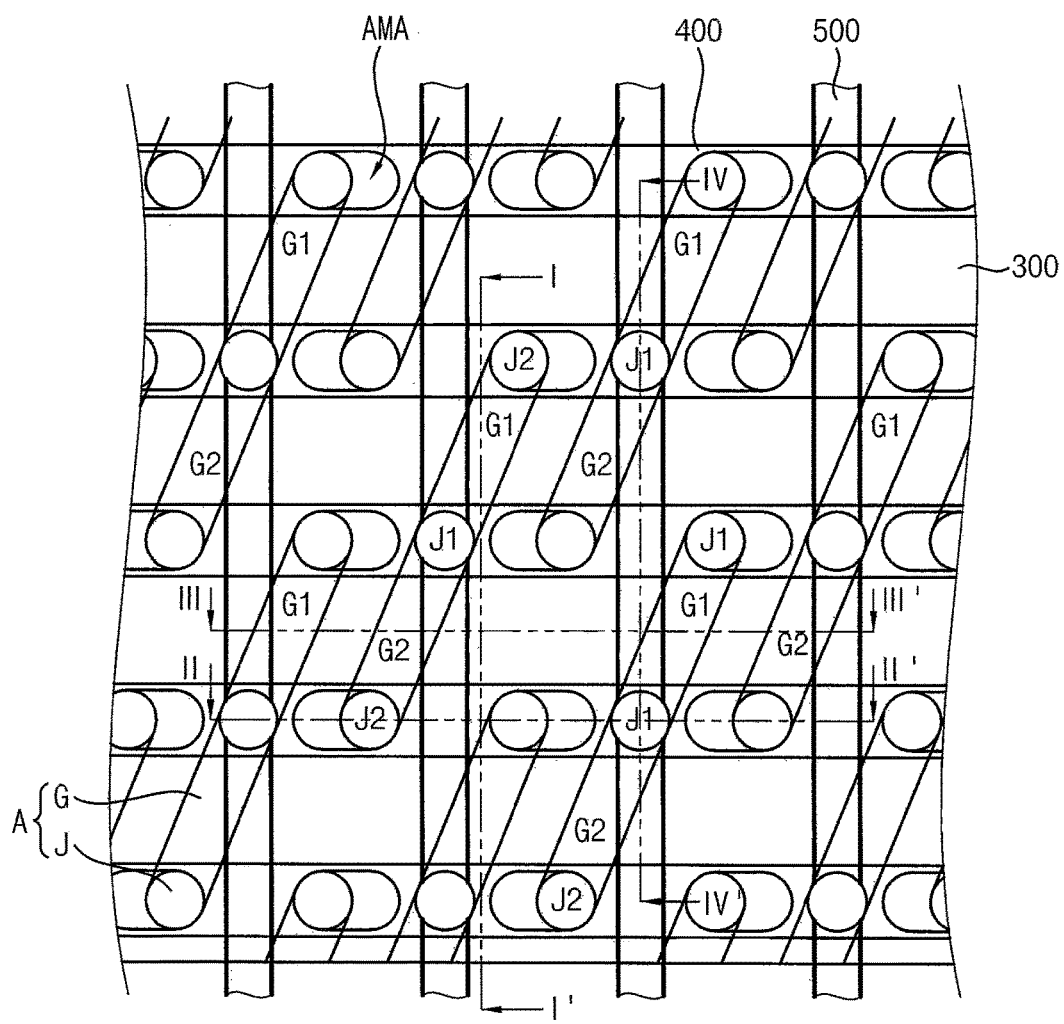
FIG. 2 is a layout of the semiconductor device shown in FIG. 1, according to certain example embodiments.
Figure 3:
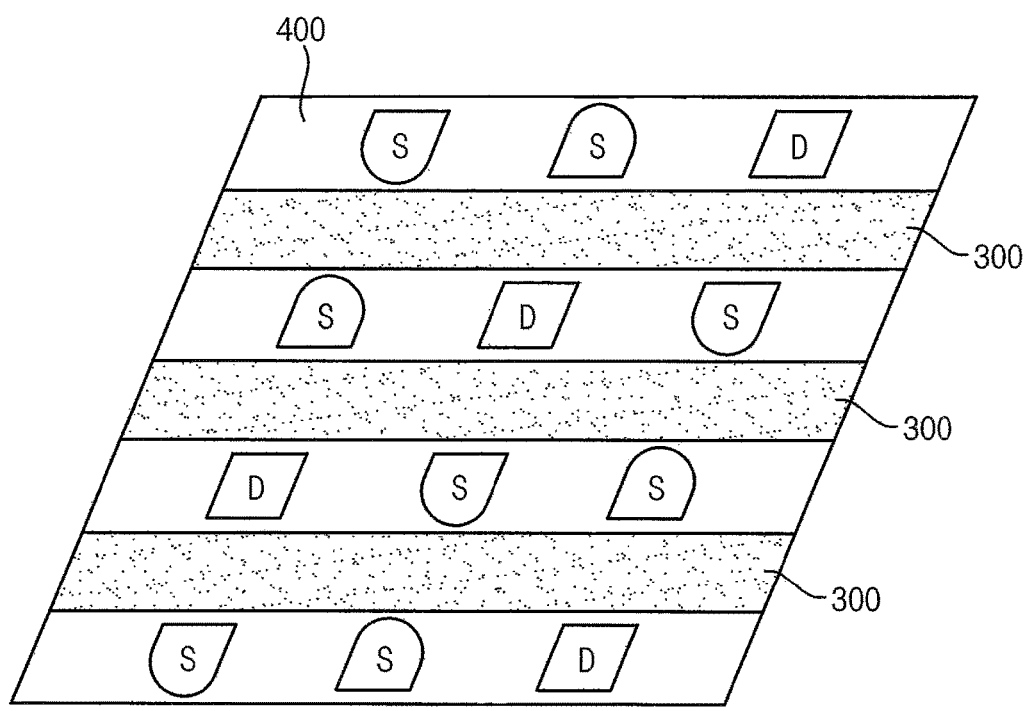
FIG. 3 is a plan view of the semiconductor device shown in FIG. 1, according to certain example embodiments.
Figure 4A:
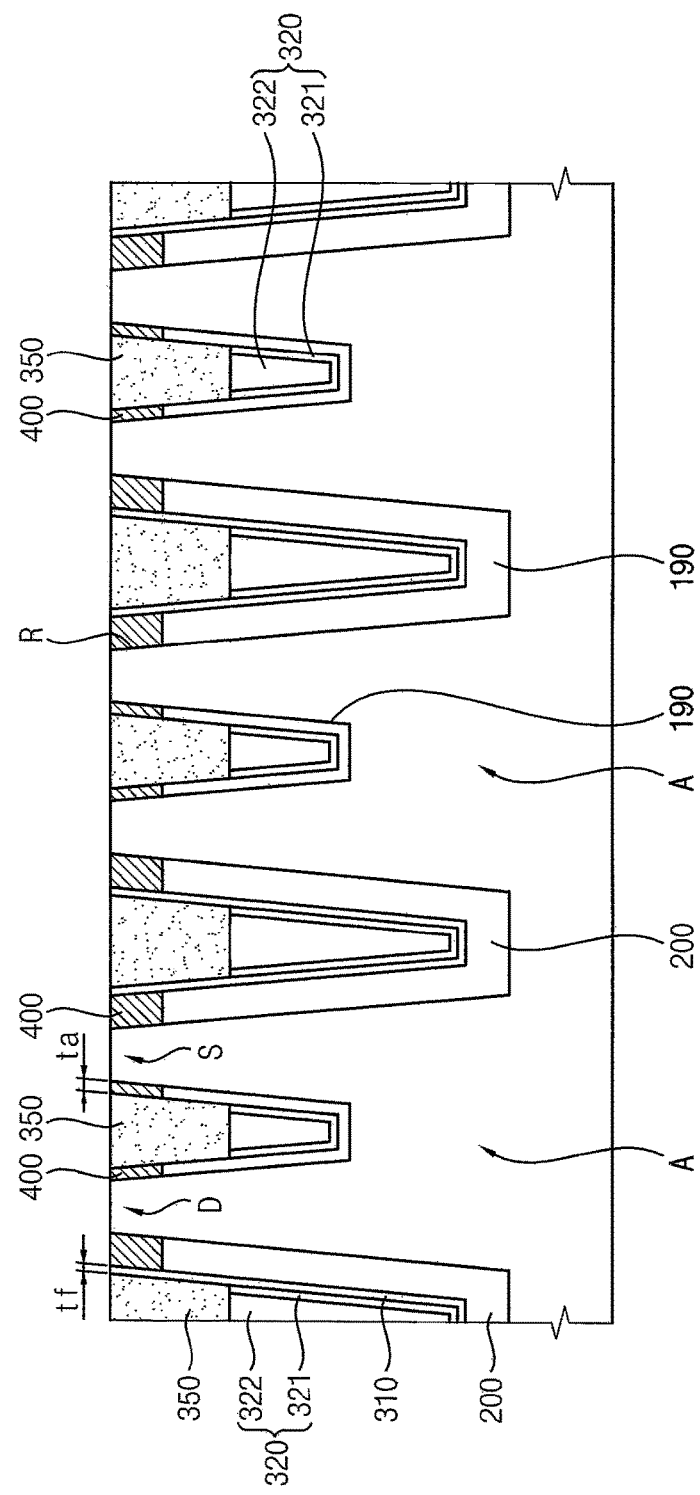
FIG. 4A is a cross-sectional view of the semiconductor device shown in FIG. 1 cut along a line I-I' of the layout shown in FIG. 2, according to certain example embodiments.
Figure 4B:
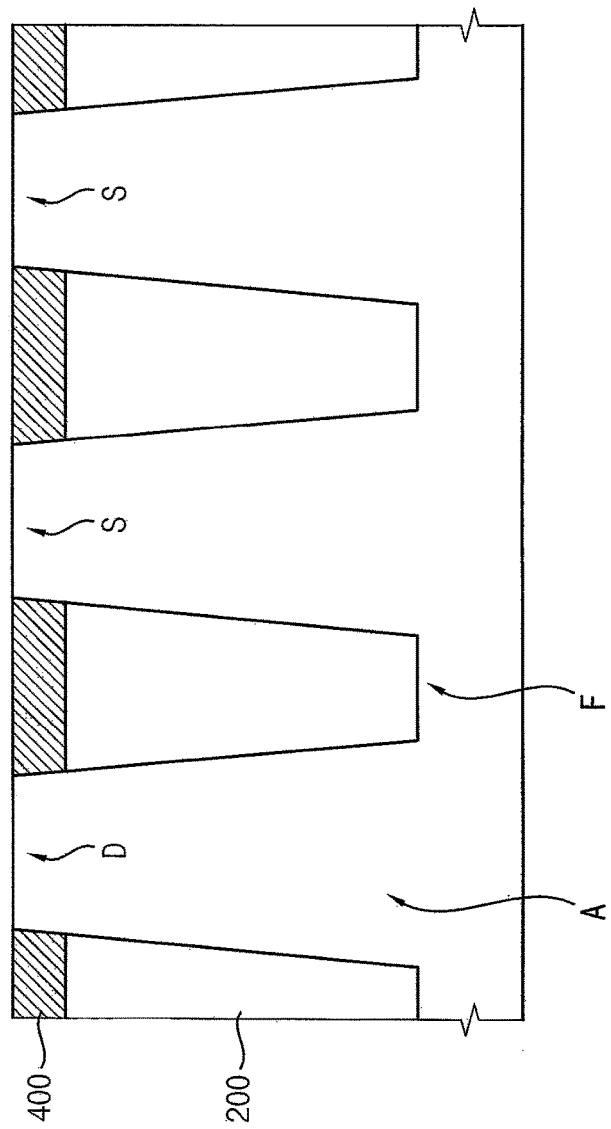
FIG. 4B is a cross-sectional view of the semiconductor device shown in FIG. 1 cut along a line II-II' of the layout shown in FIG. 2, according to certain example embodiments.

FIG. 1 is a perspective view illustrating a semiconductor device in accordance with an example embodiment of the present inventive concept, and FIG. 2 is an exemplary layout of the semiconductor device shown in FIG. 1. FIG. 3 is an exemplary plan view of the semiconductor device shown in FIG. 1. FIG. 4A is an exemplary cross-sectional view of the semiconductor device shown in FIG. 1 cut along a line I-I' of the layout shown in FIG. 2 and FIG. 4B is an exemplary cross-sectional view of the semiconductor device shown in FIG. 1 cut along a line II-II' of the layout shown in FIG. 2.

As used herein, a semiconductor device may refer to any of the various devices such as shown in FIGS. 1-30C, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIGS. 1 to 4B, the semiconductor device 100 in accordance with an example embodiment may include a substrate 100 having an active region A defined by a device isolation layer 200 and a line-shaped gate trench 190 extending in a first direction x to cross the active region A, a first conductive line 300 having a buried gate structure (BG in FIG. 15C) in the gate trench 190 at a gate area G of the active region A and extending in the first direction x, junctions S and D at a junction area J of the active region A and a junction separator 400 on the device isolation layer 200 and defining the junctions S and D. The active region A may have the gate area G at a bottom of the gate trench 190 and a junction area J at a surface of the substrate 100 and the junction separator 400 may have an etch resistance greater than that of the device isolation layer 200. The junction separator 400 may prevent an enlargement of a contact hole through which the junctions S and D may be exposed.

The substrate 100 may include a semiconductor substrate such as, for example, a silicon substrate, a silicon-germanium substrate and a silicon-on-insulator (SOI) substrate and may be classified into an active region A on which conductive structures may be located and a field region F defining the active region A. The device isolation layer 200 may be provided with the field region F, thus the neighboring conductive structures on the adjacent active region A may be electrically isolated from each other by the device isolation layer around the active region A.

For example, the device isolation layer such as a silicon oxide layer may be provided on the field region F of the substrate 100 by a device isolation process such as a shallow-trench isolation (STI) process. Thus, the neighboring gate structures on the active region A may be electrically insulated from one another by the device isolation layer 200.

The field region F may decrease in size according to a size reduction of the semiconductor device 1000, particularly in a cell area rather than a peripheral area of the substrate 100, so that some of the device isolation trenches may be insufficient for completely filling up with the insulation materials of the device isolation layer 200. For that reason, in some embodiments, the device isolation trench may be filled up just only with a sidewall oxide layer or a dual stack layer of the sidewall oxide layer and a liner covering a sidewall of the device isolation trench. In the present example embodiment, some of the device isolation trenches may be filled up with the sidewall oxide layer without another layer or liner, so a silicon oxide layer may be provided as the device isolation layer 200. Other device isolation trenches may be filled up with the sidewall oxide layer and the liner, so a silicon nitride layer enclosed by the silicon oxide layer may be provided as the device isolation layer 200.

The gate trench 190 may extend on the substrate 100 having a plurality of the active regions A linearly in the first direction x and a number of the linear trenches 190 may be uniformly spaced apart by a same gap distance in the second direction y.

The cross points of the active regions A with the trenches 190 may be partially removed from the substrate 100 in an etching process for forming the gate trench 190 in such a configuration that a top surface of the cross point of the active region A (cross surface of the active region A) may be arranged at a bottom surface of the gate trench 190, while a top surface of the active region A interposed between the neighboring trenches 190 (neighboring surface of the active region A) may remain unchanged in the etching process. Thus, the cross surfaces may be lower than the neighboring surfaces and the cross surface and the neighboring surface may be alternately arranged along the line-shaped active region A. For example, the cross surface and the neighboring surface may be vertically separated from each other by a stepped portion. A gate electrode may be arranged on the cross surface of the active region A and source/drain electrodes may be arranged on the neighboring surfaces of the active region A, so that the cross surface of the active region A may function as a gate area G and the neighboring surfaces of the active region A may function as a junction area J. The gate structure on the cross surface of the active region A may be lower than the neighboring surface or the top surface of the substrate 100 and may be buried in the gate trench 190 by a capping layer 350. That is, the gate structure on the gate area G may be provided as a buried gate structure BG.

Particularly, the device isolation layer 200 may be lower than the gate area G of the active region A along the gate trench 190, so that the gate area G of the active region A may protrude out of the device isolation layer 200 at the bottom of the gate trench 190 and the bottom of the gate trench 190 may be uneven.

In the present example embodiment, the active region A may extend in a line shape (referred to as active line) slanting with respect to the first and the second directions x and y. Thus, a single line of the active region A may cross a pair of the neighboring trenches 190. Therefore, a single active region A may be separated into a pair of gate areas G1 and G2 that may be positioned at the bottoms the neighboring trenches 190, respectively, and junction areas J1 and J2 that may be positioned at the surface of the substrate 100 around the gate trench 190.

Thus, a pair of the gate structures BG may be arranged on the gate areas G of a single active region A and a first junction area J1, which may be positioned at a central portion of the active region A between the gate structures BG, may be provided as a drain region adjacent to the gate structure BG. Further, a pair of second junction areas J2, which may be positioned at an end portion of the active region A, may be provided as a source region adjacent to the gate structure BG.

A plurality of the gate structures BG in the same gate trench 190 may be connected to a single line extending in the first direction x as the first conductive line 300 functioning as a word line of the semiconductor device 1000.

For example, the first conductive line 300 may include gate line 330 extending in the first direction x and having a plurality of the gate structures BG that may be positioned on the respective gate area G and a capping layer 350 covering the gate line 330 and sealing the gate line 330 from surroundings.

The gate line 330 may include a gate insulation layer 310 covering the uneven bottom of the gate trench 190, a sidewall of the junction area J and a sidewall of the device isolation layer 200 and a gate conductive layer 320 filling up a lower portion of the gate trench 190 along the first direction x on the gate insulation layer 310.

In some embodiments, the gate insulation layer 310 may comprise silicon oxide and the gate conductive layer 320 may comprise conductive metal such as tungsten (W), titanium (Ti) and tantalum (Ta). In the present example embodiment, the gate conductive layer 320 may include a barrier layer 321 making contact with the gate insulation layer 310 and a metal layer 322 making contact with the barrier layer 321. For example, the barrier layer 321 may comprise titanium nitride (TiN) and the metal layer 322 may comprise tungsten (W).

The capping layer 350 may be arranged on the gate line 330 in the first direction x and may fill up an upper portion of the gate trench 190 in such a configuration that the gate line 330 may be isolated and protected from surroundings. For example, the capping layer 350 may comprise silicon nitride.

Dopants may be implanted into the junction area J by an ion implantation process, thus source junction S and drain junction D may be provided with the junction area J. The source and drain junctions S and D may be arranged in series along the first direction x in parallel with the first conductive line 300. The gate structure BG buried in the gate trench 190 at the gate area G and the source and drain junction S and D around the gate structure BG may be provided as a cell transistor.

In the present example embodiment, the semiconductor device 1000 may include a memory device having a pair of gate electrodes at the first and second gate areas G1 and G2, a bit line contact making contact with the first junction area J1 and a storage contact making contact with the second junction area J2. The first conductive line 300 extending the first direction x may function as a word line and a second conductive line, described in detail hereinafter, may function as a bit line of the memory device. Particularly, the semiconductor device 1000 may be designed based on a 6 $F^2$ (F: minimum feature size) layout and thus the pitch of neighboring word lines may be reduced to about 0.5 F. Therefore, the occupying area of the cell transistor of the semiconductor device 1000 may be minimized and the overall size of the semiconductor device 1000 may be sufficiently reduced while increasing the effective channel length.

The junction separator 400 may be arranged on the device isolation layer 200 and may enclose the source and drain junctions S and D. Thus, the junction separator 400 may be interposed between the neighboring junctions on the device isolation layer 200 and may function as an etch stop layer for an etch process for exposing the source and drain junctions S and D. The junction separator 400 may be described as being arranged on a top of the device isolation layer, which may be contrasted with the junction separator 400 being formed on a sidewall of the gate insulation layer 310

For example, when forming a first contact hole for exposing the drain junction D and forming a second contact hole for exposing the source junction S, the first or second contact hole may expand to the field region F around the drain junction D or the source junction S due to a misalignment of the etching process. However, the etch resistance of the junction separator 400 may be higher than that of the device isolation layer 200 and the source and drain junctions S and D may be sufficiently separated from each other in spite of the misalignment of the contact holes, so the first and second contact holes adjacent to each other in the first direction x may be sufficiently prevented from being connected to each other in the etching process for forming the first and the second contact holes. Therefore, the bit line contact and the storage node adjacent to each other in the first direction x contact may be sufficiently separated from each other and be prevented from electrical connection due to the junction separator 400. Particularly, although the cell size of the semiconductor device 1000 may be reduced, the neighboring bit line and the storage capacitor may be sufficiently separated from each other.

For example, the junction separator 400 may comprise an insulative material such as silicon nitride (SiN) having a good adhesiveness to the device isolation layer 200 that may comprise silicon oxide having a good insulation characteristic. Accordingly, an upper portion of the source and drain junctions S and D may be defined by the junction separator 400 and a lower portion of the source and drain junctions S and D may be defined by the device isolation layer 200.

The device isolation layer 200 and the gate insulation layer 310 may be removed to a depth from a top surface thereof to thereby form a recess R around the source and drain junctions S and D. Silicon nitride may be filled up into the recess R and the junction separator 400 may be formed around the source and drain junctions S and D.

Therefore, the capping layer 350 and the junctions S and D may protrude from the device isolation layer 200 and the junction separator 400 may contact an upper surface of the gate insulation layer 310 and a side surface of the capping layer 350. In the present example embodiment, an upper surface of the junction separator 400 may be coplanar with an upper surface of the capping layer 350, as illustrated in FIG. 4A.

Particularly, since the device isolation layer 200 may include a sidewall oxide and the gate insulation layer 310 may include a gate oxide, the device isolation layer 200 and the gate insulation layer 310 may be removed at the same etching rate when forming the recess R, so that an upper surface of the gate insulation layer 310 may be coplanar with an upper surface of the device isolation layer 200 in the recess R.

In addition, the junction separator 400 may comprise a material having an etching rate lower than that of the device isolation layer 200 in the etching process for forming the contact holes for exposing the source and drain junctions S and D.

When the etching rate of the junction separator 400 is higher than or equal to that of the device isolation layer 200, there may be no need for replacing the device isolation layer 200 with the junction separator 400. Thus, various materials such as the silicon nitride (SiN) may be used for the junction separator 400 as long as the material has an etching rate lower than that of the device isolation layer 400 and has an etching selectivity with respect to an insulation interlayer in the etching process for forming the contact holes.

Accordingly, although the source and drain junctions S and D may be misaligned with the respective contact holes, the source and drain junctions S and D may be sufficiently defined and enclosed by the junction separator 400, and thus the bit line contact making contact with the drain junction D may be sufficiently separated from the storage node contact making contact with the source junction S.

In addition, some of the gate insulation layer 310 interposed between the capping layer 350 and the junction area J may also be removed together with the device isolation layer 200 in the etching process for forming the recess R, so that the junction separator 400 may be provided between the capping layer 350 and the source and drain junctions S and D. Thus, the buried gate structure BG and the source and drain junctions S and D may be much more insulated from each other by the junction separator 400 therebetween, so the parasitic capacitance and the gate-induced drain leakage GIDL may be sufficiently reduced at the buried gate structure BG, which may increase the reliability of the semiconductor device 1000.

Figure 5:
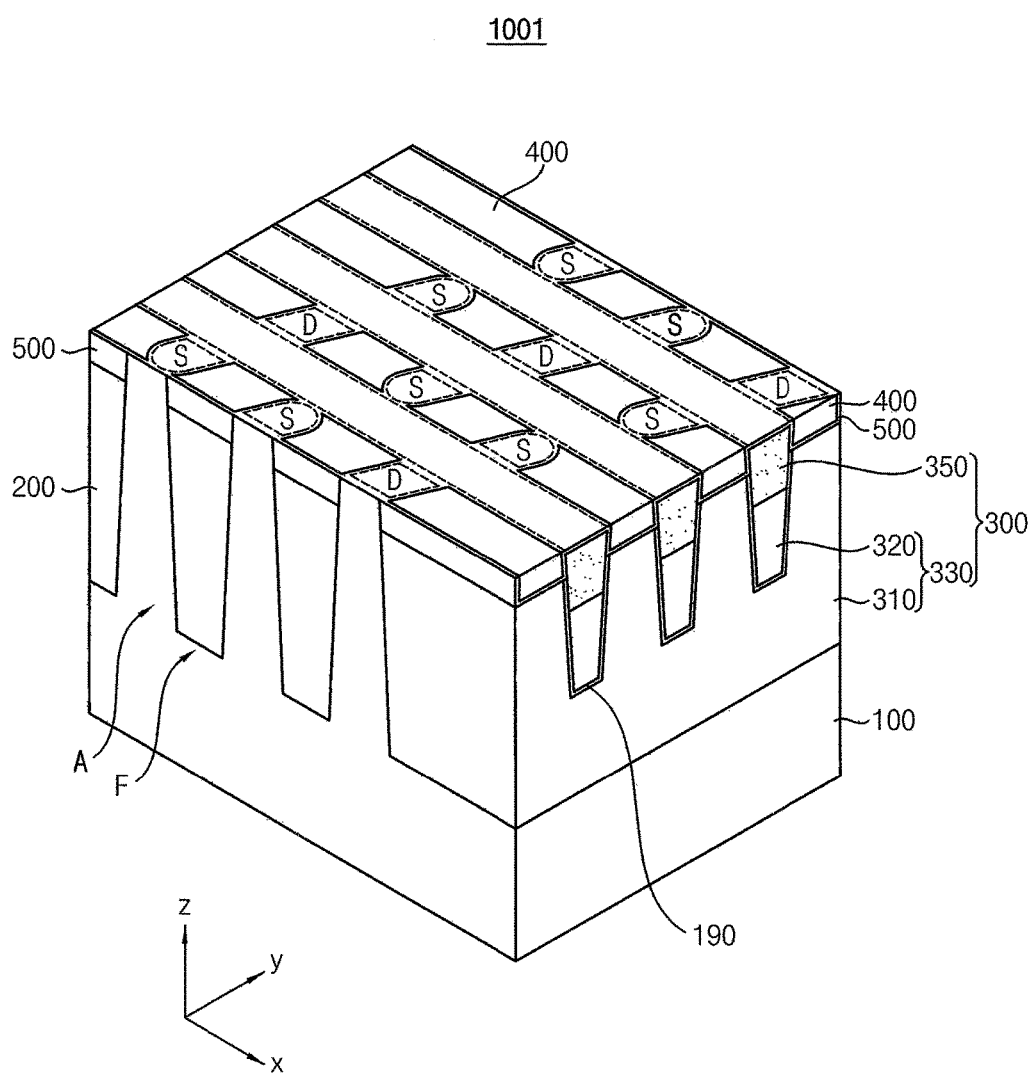
FIG. 5 is a perspective view illustrating a semiconductor device in accordance with certain example embodiments of the present inventive concept.
Figure 6:
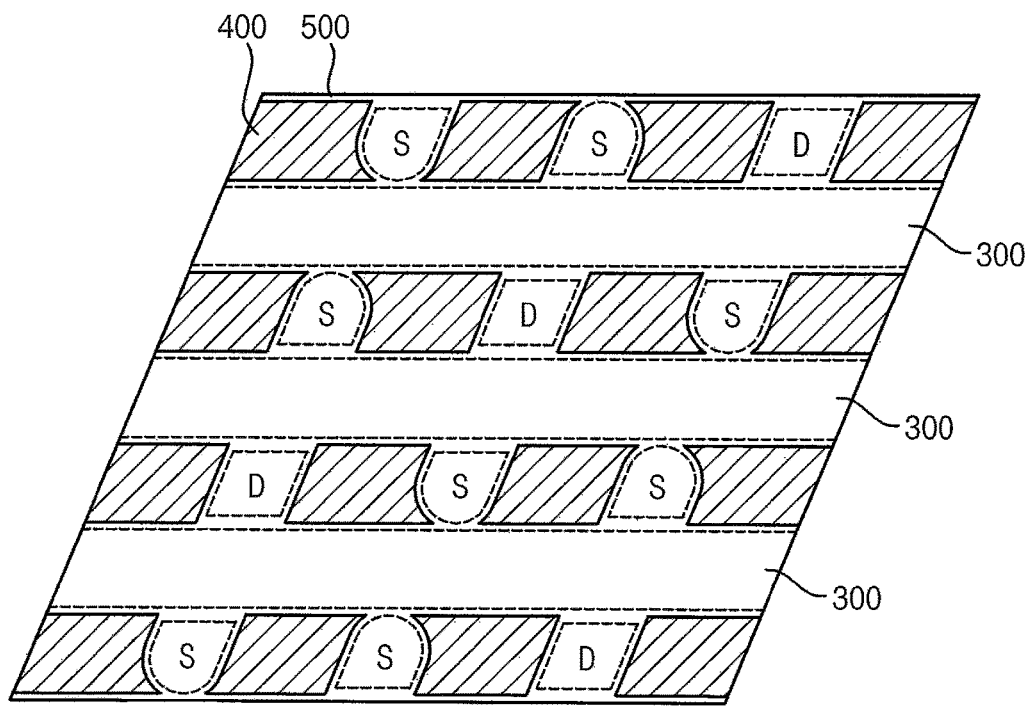
FIG. 6 is a plan view of the semiconductor device shown in FIG. 5, according to certain example embodiments.
Figure 7A:
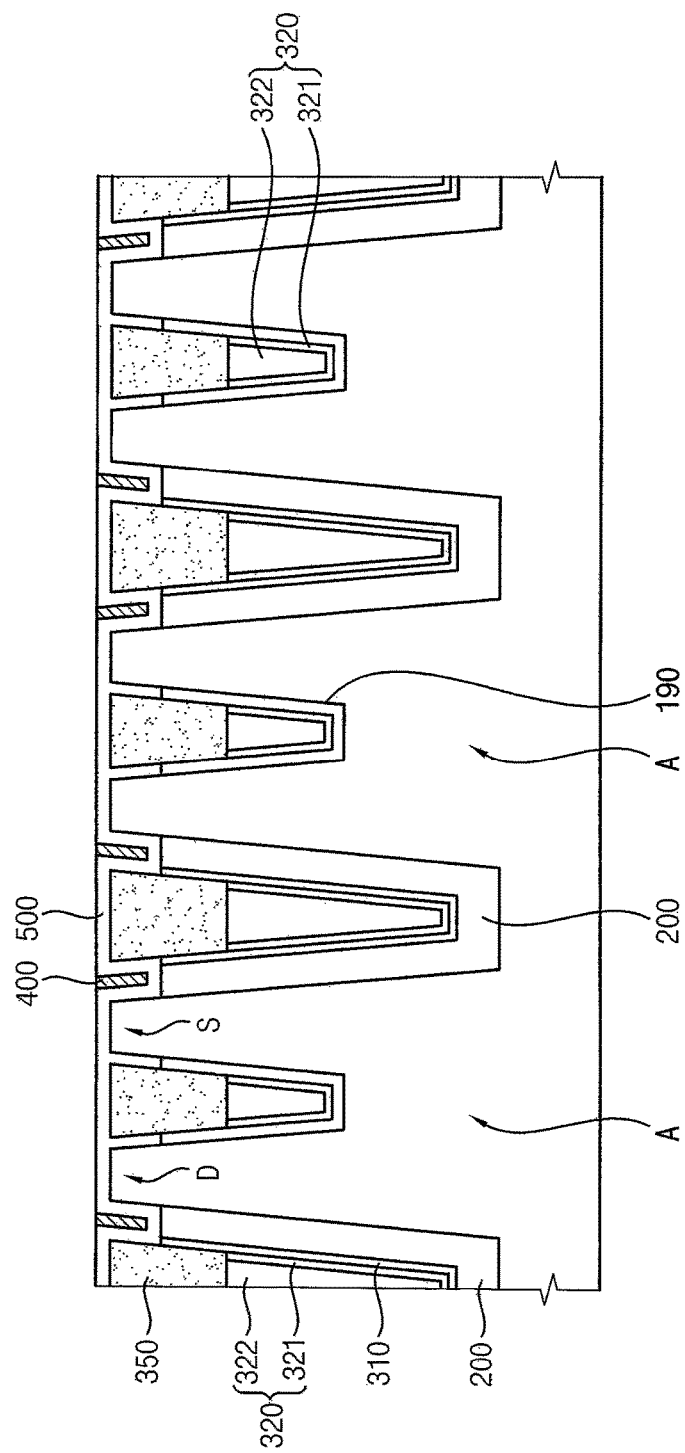
FIG. 7A is a cross-sectional view of the semiconductor device shown in FIG. 5 cut along the line I-I' of the layout shown in FIG. 2, according to certain example embodiments.
Figure 7B:
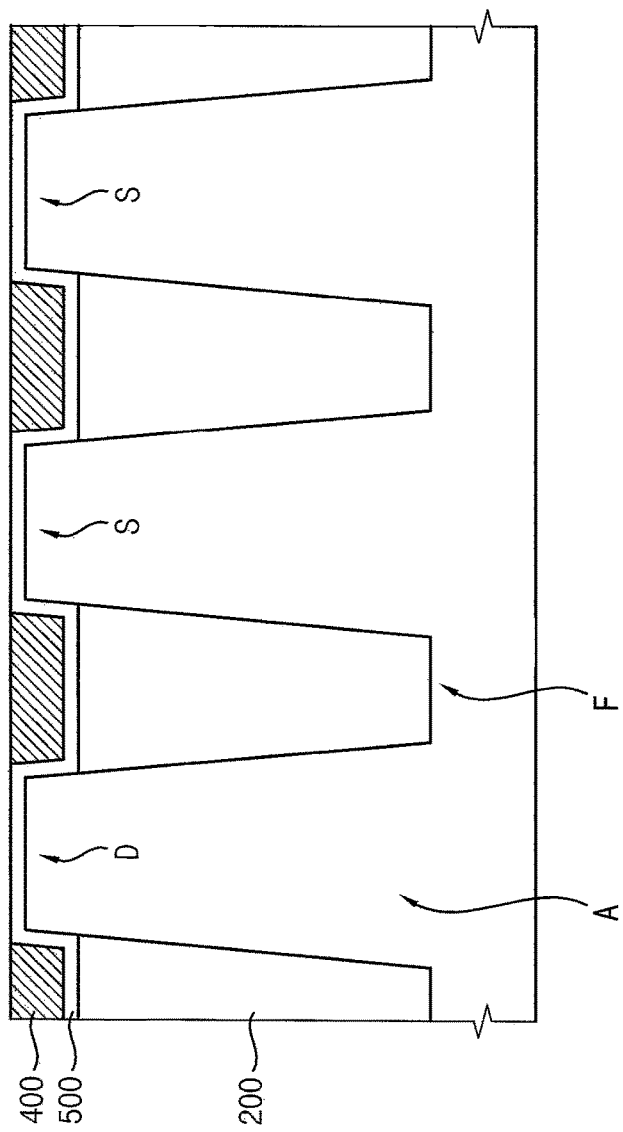
FIG. 7B is a cross-sectional view of the semiconductor device shown in FIG. 5 cut along the line II-II' of the layout shown in FIG. 2, according to certain example embodiments.

FIG. 5 is a perspective view illustrating a semiconductor device in accordance with another example embodiment of the present inventive concept, and FIG. 6 is a plan view of the semiconductor device shown in FIG. 5. FIG. 7A is a cross-sectional view of the semiconductor device shown in FIG. 5 cut along the line I-I' of the layout shown in FIG. 2 and FIG. 7B is a cross-sectional view of the semiconductor device shown in FIG. 5 cut along the line II-II' of the layout shown in FIG. 2. The semiconductor device 1001 shown in FIG. 5 may have the same layout as illustrated in FIG. 2.

The semiconductor device 1001 in FIG. 5 may have the same structures as the semiconductor device 1000 in FIG. 1, except that a buffer layer 500 may be further provided under the junction separator 400. Thus, the same reference numerals in FIG. 5 denote the same elements in FIG. 1 and any further detailed descriptions on the same elements will be omitted hereinafter. Detailed descriptions on the semiconductor device 1001 will be focused on the buffer layer 500 hereinafter.

Referring to FIGS. 5 to 7B, the semiconductor device 1001 in accordance with another example embodiment of the present inventive concept may further include a buffer layer 500 covering the capping layer 350, the device isolation layer 200 and the source and drain junctions S and D. The capping layer 350 and the junctions S and D may protrude from the device isolation layer 200 and the buffer layer 500 may be arranged along a surface profile of the capping layer 350 and the junctions S and D, so the capping layer 350, the junctions S and D and the device isolation layer 200 may be covered with the buffer layer 500. Therefore, the junction separator 400 may be positioned on the buffer layer 500 in the recess R around the junctions S and D in such a configuration that the upper surface of the junction separator 400 may be coplanar with an upper surface of the buffer layer 500.

For example, an oxide layer may be formed as the buffer layer 500 along a surface profile of the capping layer 350 and the junctions S and D by a deposition process such as an atomic layer deposition (ALD) process that may precisely control a layer thickness. Thus, the buffer layer 500 may be uniformly arranged on an upper surface and a side surface of the capping layer 350 and an upper surface and a side surface of the junctions S and D.

A size of the recess R around the neighboring junctions S and D may be reduced due to the buffer layer 500 therein, and thus the recess R may be formed into a reduced recess R1 and the junction separator 400 may fill up the reduced recess R1. Accordingly, the neighboring junctions S and D may be separated from each other by the buffer layer 500 and the junction separator 400 and the capping layer 350 and the junctions S and D may be separated by the buffer layer 500.

The buffer layer 500 may be removed from the junctions S and D in the etching process for forming the contact hole through which the junctions S and D may be exposed. In such a time, although the contact hole and the respective junction S or D may be misaligned with each other, the junction separator 400 that may be exposed through misaligned contact hole may sufficiently resist against the etching process and thus remain around the junctions S and D due to the high etch resistance thereof. Therefore, the first contact hole for exposing the drain junction D and the second contact hole for exposing the source junction S may not be connected with each other and thus the bit line contact and the storage node contact may be sufficiently separated from each other. That is, the electrical connection or the electrical shortage between the bit line contact and the storage node contact may be sufficiently prevented in the semiconductor device 1001.

Particularly, the contact hole may be expanded due to the removal of the buffer layer 500 around the junctions S and D. When the buffer layer 500 is removed from the neighborhood of the junctions S and D due to the misalignment of the contact hole and the junctions S and D, the contact hole may expand around the junctions S and D as much as the thickness of the removed buffer layer 500. When the buffer layer 500 is replaced by the contact around the junctions S and D, the contact may make contact with a side surface of the junctions S and D. Therefore, the neighboring contacts on the junctions S and D may be sufficiently prevented from the electrical shortage and may enlarge the contact surface between the contact and the junction S or D although the contact hole and the junction S or D may be misaligned with each other.

While the present example embodiment discloses an oxide layer as the buffer layer 500, any other materials may also be utilized for the buffer layer 500 as long as the material has an etching rate greater than the junction separator 400 and a good step coverage for coating a surface profile of the protruded capping layer and the junctions S and D.

Particularly, when the buffer layer 500 has a thickness smaller than that of the gate insulation layer 310, the buffer layer 500 may be shaped into a loop enclosing the junction S or D and isolated in the junction separator 400.

Figure 8:
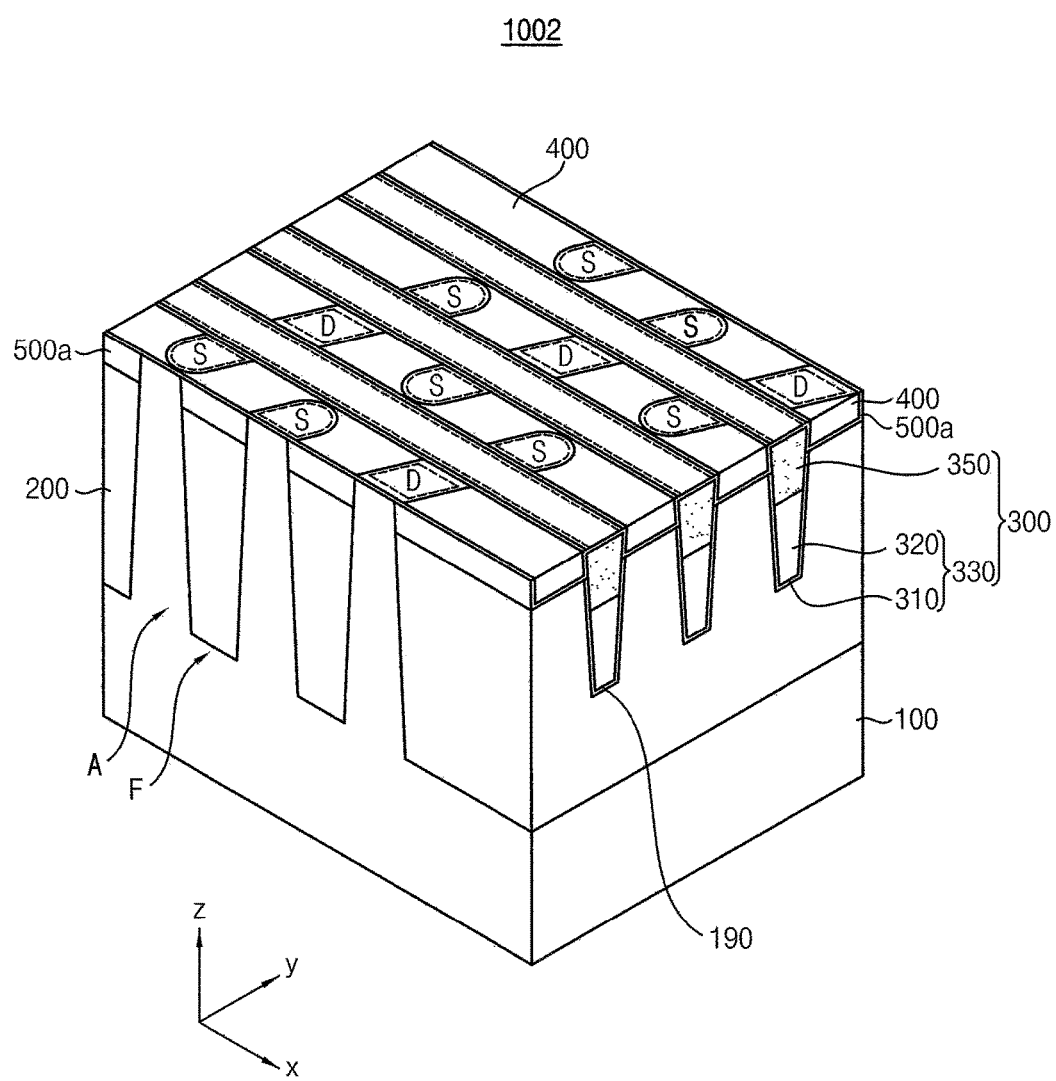
FIG. 8 is a perspective view illustrating a semiconductor device in accordance with certain example embodiments of the present inventive concept.
Figure 9:
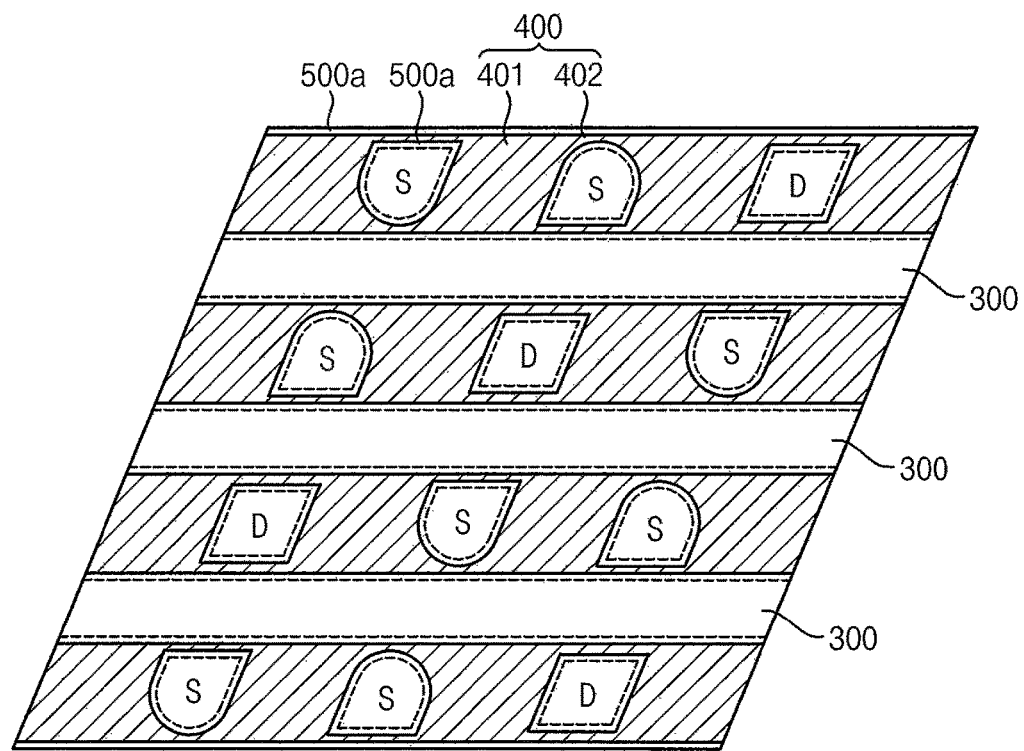
FIG. 9 is a plan view of the modified semiconductor device shown in FIG. 8, according to certain example embodiments.
Figure 10:
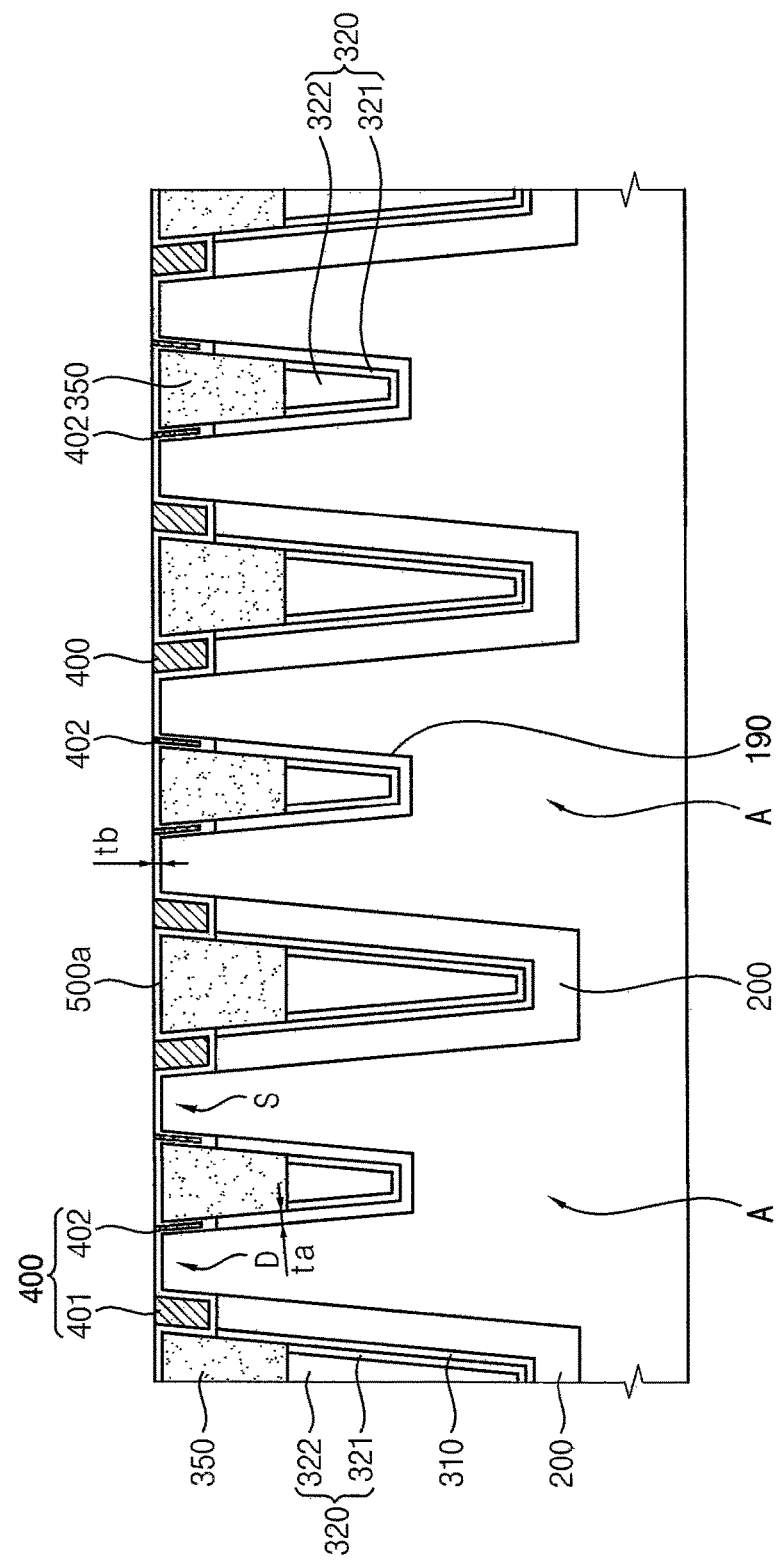
FIG. 10 is a cross-sectional view of the semiconductor device shown in FIG. 8 cut along the line I-I' of the layout shown in FIG. 2, according to certain example embodiments.

FIG. 8 is a perspective view illustrating a semiconductor device in accordance with still another example embodiment of the present inventive concept and FIG. 9 is a plan view of the modified semiconductor device shown in FIG. 8. FIG. 10 is a cross-sectional view of the semiconductor device shown in FIG. 8 cut along the line I-I' of the layout shown in FIG. 2. The semiconductor device 1002 shown in FIG. 8 may have the same layout as illustrated in FIG. 2. The semiconductor device 1002 may have substantially the same structures as the semiconductor device 1001, except that the thickness of the buffer layer 500 may be reduced.

Referring to FIGS. 8 to 10, the semiconductor device 1002 in accordance with certain example embodiments may include a reduced buffer layer 500a in place of the buffer layer 500 of the semiconductor device 1001. In the present example embodiment, the thickness $t_b$ of the reduced buffer layer 500a may be smaller than the thickness $t_a$ of the gate insulation layer 310 (thicknesses $t_b$ and $t_a$ referring to a thickness of the layer extending away from the adjacent layer or material on which it is formed).

Thus, the junctions S and D may be enclosed by the reduced buffer layer 500a and the junction separator 400 may fill up the recess R around the junctions S and D and the capping layer 350. Particularly, the junction separator 400 may include a planar separator 401 filling up the recess R around the neighboring junctions S and/or D in the first direction x and a separation strap 402 interposed between the reduced buffer layer 500a and the capping layer 350.

Accordingly, the reduced buffer layer 500a may be shaped into the loop enclosing the junctions S or D and isolated just like an island in such a configuration that the neighboring reduced buffer layer 500a in the first direction x may be isolated by the planar separator 401 and the reduced buffer layer 500a may be separated from the capping layer 350 by the separation strap 402.

Thus, although the reduced buffer layer 500a may be partially replaced with the contact due to the misalignment between the junctions S and D and the contact hole, the contact making contact with the side surfaces of the junctions S and D may be sufficiently insulated from the buried gate structure BG by the separation strap 402 and the capping layer 350.

Accordingly, the buried gate structure BG and the junctions S and D may be much more insulated from each other by the separation strap 402, thereby decreasing the parasitic capacitance and the gate-induced drain leakage current at the gate electrode of the semiconductor device 1002.

Figure 11:
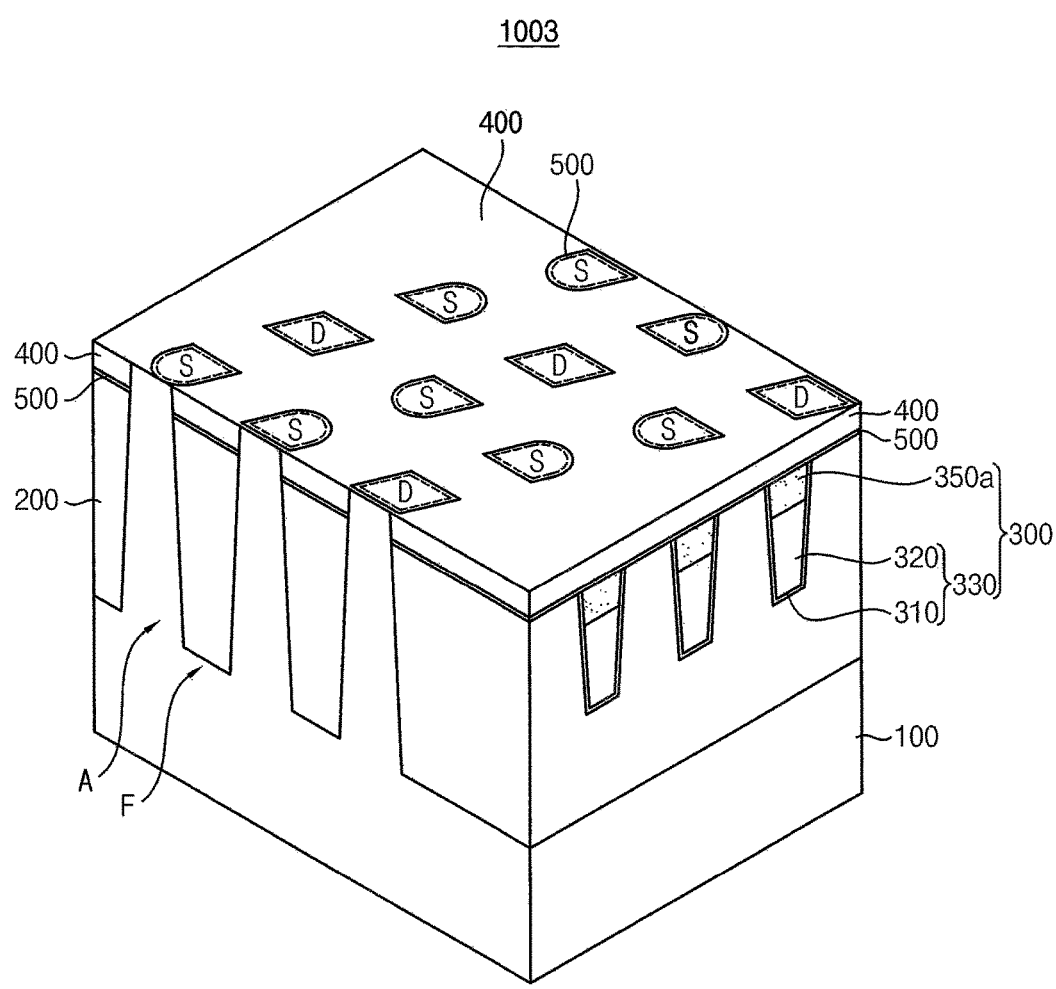
FIG. 11 is a perspective view illustrating a semiconductor device in accordance with certain example embodiments of the present inventive concept.
Figure 12:
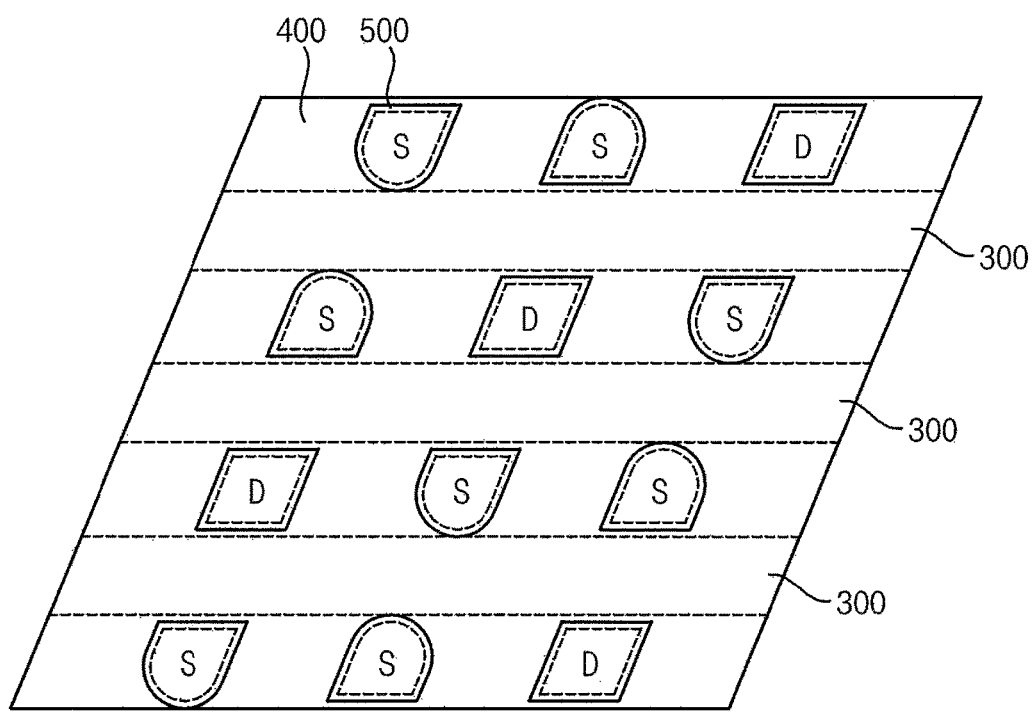
FIG. 12 is a plan view of the semiconductor device shown in FIG. 11, according to certain example embodiments.
Figure 13A:
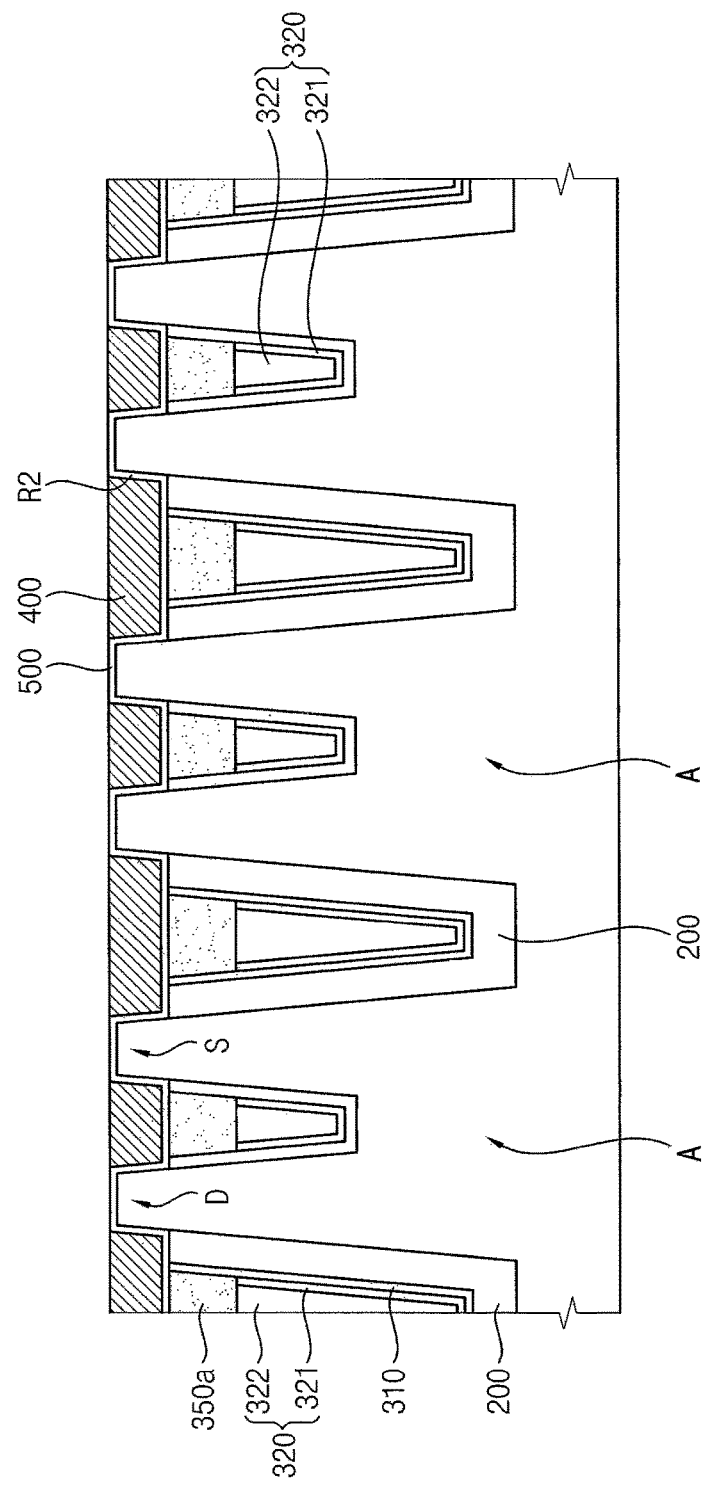
FIG. 13A is a cross-sectional view of the semiconductor device shown in FIG. 11 cut along the line I-I' of the layout shown in FIG. 2, according to certain example embodiments.
Figure 13B:
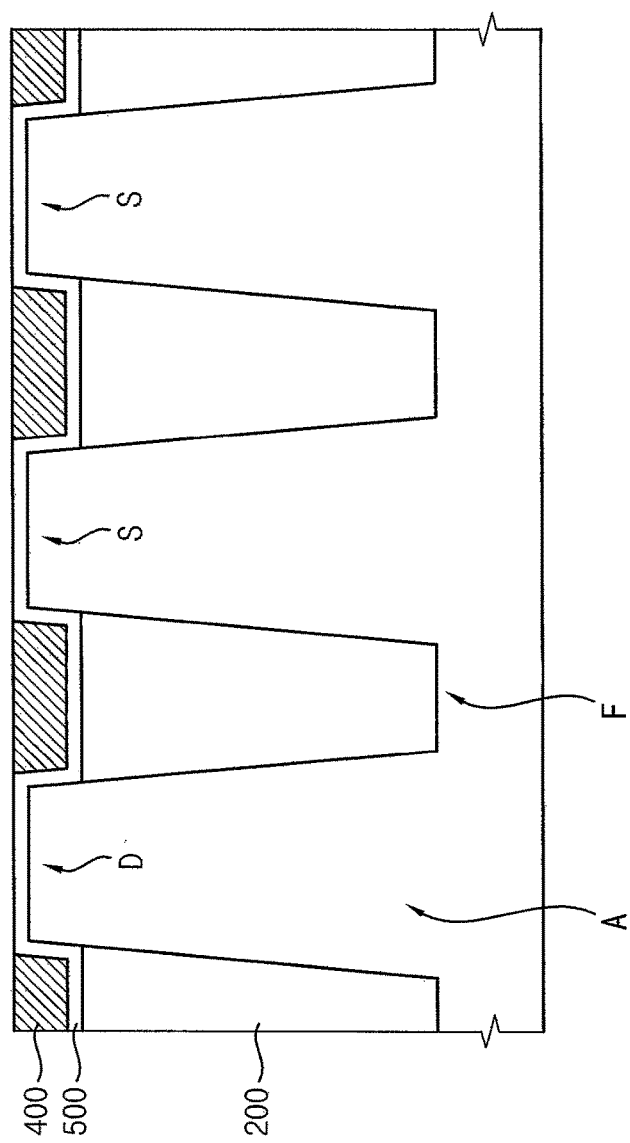
FIG. 13B is a cross-sectional view of the semiconductor device shown in FIG. 11 cut along the line II-II' of the layout shown in FIG. 2, according to certain example embodiments.

FIG. 11 is a perspective view illustrating a semiconductor device in accordance with further still another example embodiment, and FIG. 12 is a plan view of the semiconductor device shown in FIG. 11. FIG. 13A is a cross-sectional view of the semiconductor device shown in FIG. 11 cut along the line I-I' of the layout shown in FIG. 2 and FIG. 13B is a cross-sectional view of the semiconductor device shown in FIG. 11 cut along the line II-II' of the layout shown in FIG. 2. The semiconductor device 1003 shown in FIG. 11 may have the same layout as illustrated in FIG. 2.

The semiconductor device 1003 in FIG. 11 may have the same structures as the semiconductor device 1001 in FIG. 5, except that an upper surface of the capping layer 350 may be coplanar with an upper surface of the device isolation layer 200. Thus, the same reference numerals in FIG. 11 denote the same elements in FIG. 5 and any further detailed descriptions on the same elements will be omitted hereinafter. Detailed descriptions of the semiconductor device 1003 will be focused on a reduced capping layer hereinafter.

Referring to FIGS. 11 to 13B, some of the upper portion of the capping layer 350 may be removed from the substrate 100 together with the gate insulation layer 310 and the device isolation layer 200, thereby reducing the height of the capping layer 350 and forming the reduced capping layer 350a. Thus, an upper surface of the reduced capping layer 350a may be coplanar with the upper surfaces of the device isolation layer 200 and the gate insulation layer 310, and the junctions S and D may be protrude from the device isolation layer 200 and the reduced capping layer 350a. Further, the recess R around the junctions S and D may be enlarged over the reduced capping layer 350a and may expand to an expanded recess R2.

The buffer layer 500 may be formed along a surface profile of the protruded junctions S and D in such a configuration that the reduced capping layer 350a, the device isolation layer 200 and the junctions S and D may be covered with the buffer layer 500. The junction separator 400 may be provided on the buffer layer 500 in the expanded recess R2 in such a way that an upper surface of the junction separator 400 may be coplanar with an upper surface of the buffer layer 500.

The junctions S and D may be enclosed by the buffer layer 500 and the buffer layer 500 may be separated by a unit of the junction S or D just like an island. For example, the buffer layer 500 may be shaped into the loop enclosing the junctions S and D and the neighboring loops may be separated from each other by the junction separator 400 in the expanded recess R2.

Thus, although the buffer layer 500 may be partially replaced with the contact due to the misalignment between the junctions S and D and the contact hole, the contact making contact with the side surfaces of the junctions S and D may be sufficiently insulated from the buried gate structure BG by the junction separation 400. Accordingly, the neighboring contacts may be sufficiently insulated from each other by the junction separator 400 in spite of the misalignment between the junctions and the contact hole, thereby preventing the electrical shortage between the neighboring contacts in the semiconductor device 1003.

Particularly, since the upper surface of the reduced capping layer 350a may be coplanar with the upper surfaces of the device isolation layer 200 and the gate insulation layer 310, the buffer layer 500 may have a thickness greater than that of the gate insulation layer 310, thereby increasing a process margin of the etching process for forming the contact holes through which the junctions S and D may be exposed.

Figure 14:
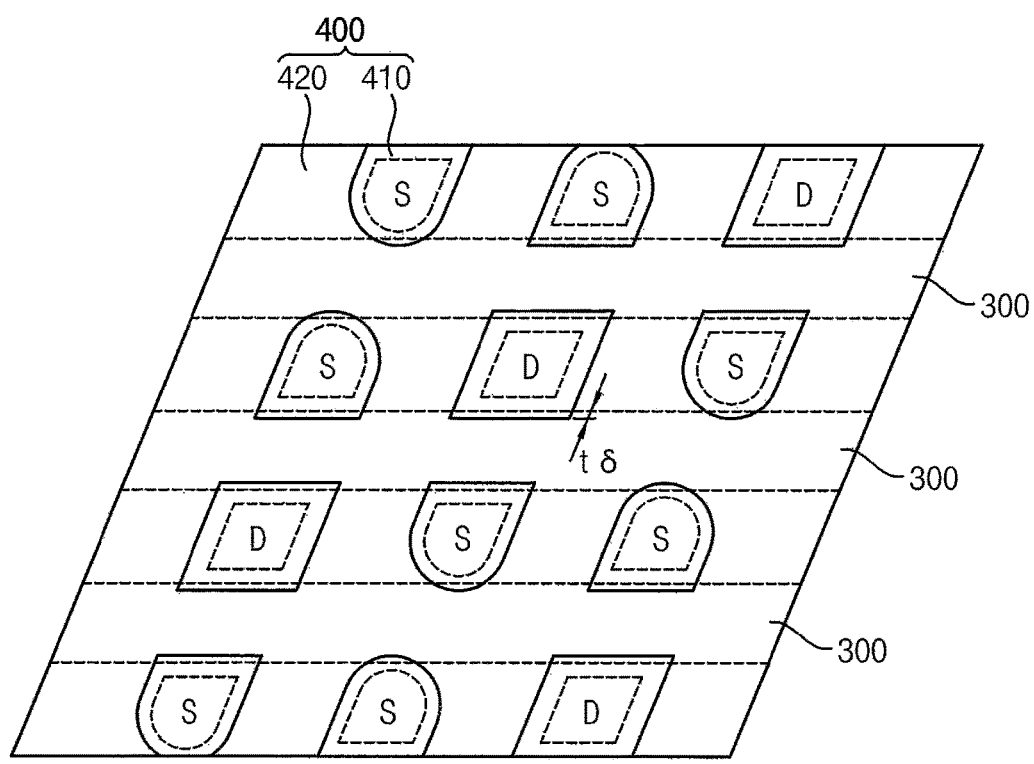
FIG. 14 is a plan view illustrating an expansion of the buffer layer of the semiconductor device shown in FIG. 12, according to certain example embodiments.

The buffer layer 500 may be extended along the active line as illustrated in FIG. 14.

FIG. 14 is a plan view illustrating an expansion of the buffer layer of the semiconductor device shown in FIG. 12.

As illustrated in FIG. 14, the buffer layer 500 may be elongated in a direction of the active line as long as an incremental thickness $t_\delta$ in such a configuration that an incremental portion of the buffer layer 500 may be at least partially overlapped with the reduced capping layer 350a. Therefore, the process margin of the etching process for forming the contact hole may be increased along the active line.

However, the increase of the buffer layer 500 along the active line may cause the reduction of the junction separator 400 interposed between the neighboring junctions S and D along the first direction x, and the size reduction of the junction separator 400 may tend to generate the electrical shortage between the neighboring contacts in the first direction x. For those reasons, the incremental thickness $t_\delta$ of the buffer layer 500 may be allowable on condition that the size of the junction separator 400 may not be substantially reduced in the first direction x.

Figure 15A:
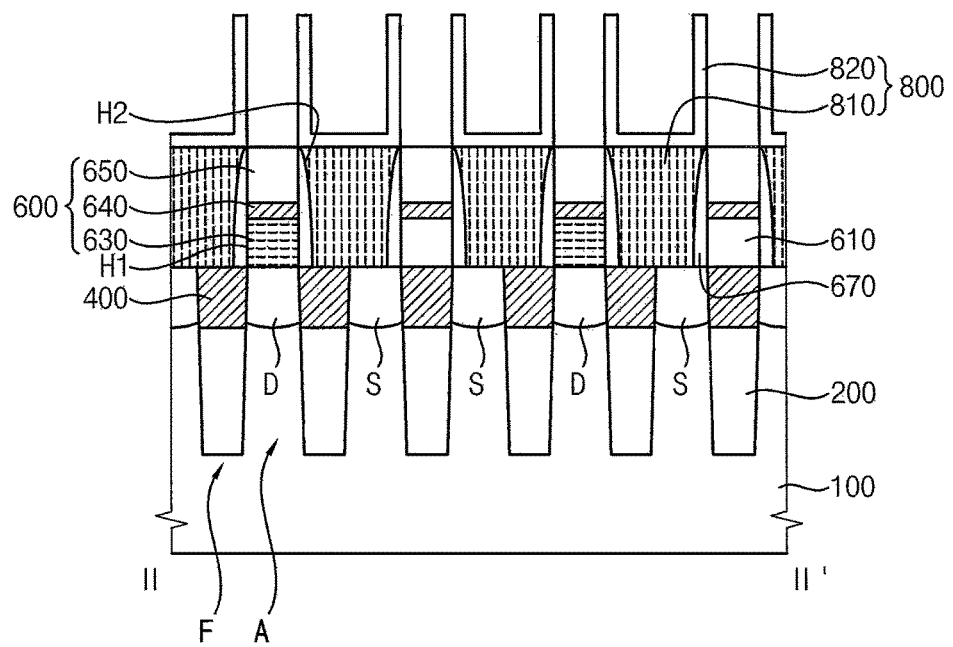
FIG. 15A is a cross-sectional view cut along the line II-II' of the layout shown in FIG. 2, according to certain example embodiments.
Figure 15B:
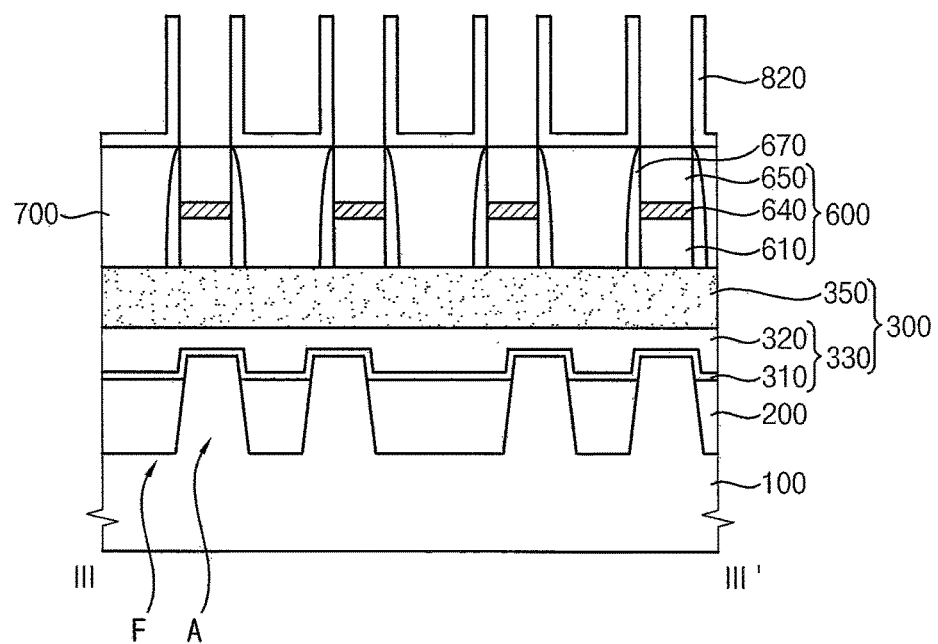
FIG. 15B is a cross-sectional view cut along the line III-III' of the layout shown in FIG. 2, according to certain example embodiments.
Figure 15C:
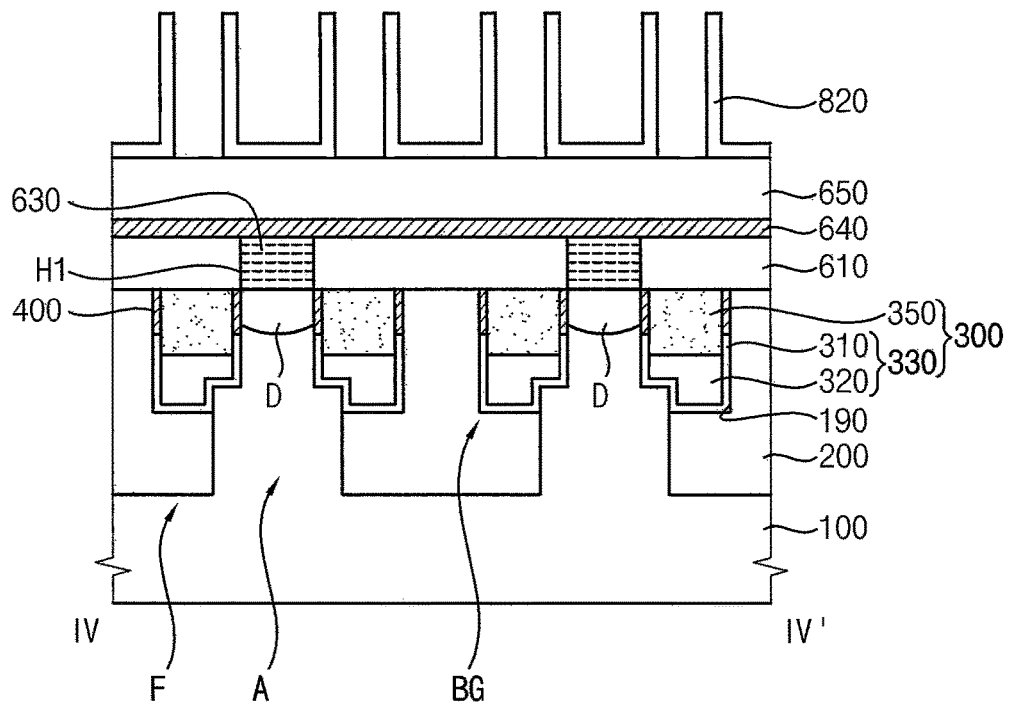
FIG. 15C is a cross-sectional view cut along the line IV-IV' of the layout shown in FIG. 2, according to certain example embodiments.

FIGS. 15A to 15C are cross-sectional views illustrating a memory device in accordance with an example embodiment of the present inventive concept. In FIGS. 15A to 15C, the memory device may include a DRAM device having a plurality of buried channel array transistors each of which may include the same structures as the semiconductor devices 1000 shown in FIG. 1 based on the layout of FIG. 2.

FIG. 15A is a cross-sectional view cut along the line II-II' of the layout shown in FIG. 2, and FIG. 15B is a cross-sectional view cut along the line III-III' of the layout shown in FIG. 2. FIG. 15C is a cross-sectional view cut along the line IV-IV' of the layout shown in FIG. 2. In FIGS. 15A to 15C, the same reference numerals denote the same elements in FIGS. 1 and 2 and thus any further detailed descriptions on the same elements will be omitted.

Referring to FIGS. 15A to 15C, a second conductive line 600 may extend along the second direction y and may contact with the drain junctions D that may be defined by the junction separator 400. A charge storage element 800 may contact the source junction S that may also be defined by the junction separator 400.

For example, the second conductive line 600 may include a bit line contact 630 making contact with the drain junction D, a conductive bit line 640 making contact with the bit line contact 630 and extending in the second direction y and a bit line mask 650 covering the bit line 640 and separating the bit line 640 from surroundings. The bit line mask 650 may determine an overall height of the second conductive line 600. The second conductive line 600 may be substantially perpendicular to the first conductive line 300 and the first conductive line may function as a word line of the memory device and the second conductive line 600 may function as a bit line of the memory device.

For example, the buried gate structure BG, the source and drain junctions S and D and the junction separator 400 may be formed on the substrate 100 and a layer may be formed on the substrate 100 to cover the junction separator 400, the capping layer 350 and the junctions S and D. Then, the layer may be partially removed from the substrate 100 by an etching process to thereby form a first contact hole H1 through which the drain junction D may be exposed and conductive materials may be filled into the first contact hole H1 to thereby form the bit line contact 630. The layer may include a first insulation interlayer or a conductive layer for forming a lower gate structure at a pad area of the memory device. In the present example embodiment, the junction separator 400, the capping layer 350 and the junctions S and D may be covered with the first insulation interlayer.

When an etch mask pattern for forming the first contact hole H1 may be misaligned with the drain junction D, the etching process may be performed to the junction separator 400 around the drain junction D. However, the junction separator 400 may have a sufficiently high etch resistance to the etching process and thus the junction separator 400 may remain around the drain junction D. Therefore, the drain junction D may be still defined by the junction separator 400 when the first contact hole H1 may be misaligned with the drain junction D and thus the bit line contact 630 filling up the first contact hole H1 may be sufficiently prevented from the electrical connection with the neighboring storage node contact making contact with the source junction S.

The bit line contact 630 and the bit line 640 may be arranged in various configurations in view of the device performance. For example, the bit line contact 630 may be provided as a plug for preventing a leaning defect caused by a high aspect ratio of the first contact hole H1. Further, the bit line contact 630 may be shaped into a reverse trapezoid for enlarging the contact surface with the bit line 640. Further still, the bit line contact 630 may be provided as a bit line pad covering the drain junction D for reducing the height of the bit line. When the bit line contact 630 is provided as a contact pad, the bit line 640 may be provided as a gate bit line (GBL) that may be positioned adjacent to the drain junction D.

A spacer 670 may be arranged on a sidewall of the second conductive line 600 and a gap space between the neighboring second conductive lines 600 may be filled up with the second insulation interlayer 700. A second contact hole H2 may be provided through the second insulation interlayer 700 and a storage node contact 810 may be provided in the second contact hole H2 in such a configuration that the storage node contact 810 may make contact with the source junction S. A capacitor 820 may be provided on the second insulation interlayer 700 and the storage node contact 810 may make contact with the capacitor 820. Therefore, the charge storage element 800 electrically connected to the source junction S may be provided with the memory device.

Various wiring structures (not shown) and passivation layers may be further provided with the memory device thus various electrical signals may be communicated between signal sources and the buried gate structures BG, the source and drain junctions S and D, the first and the second conductive lines 200 and 600 and the charge storage element 800.

Figure 16A:
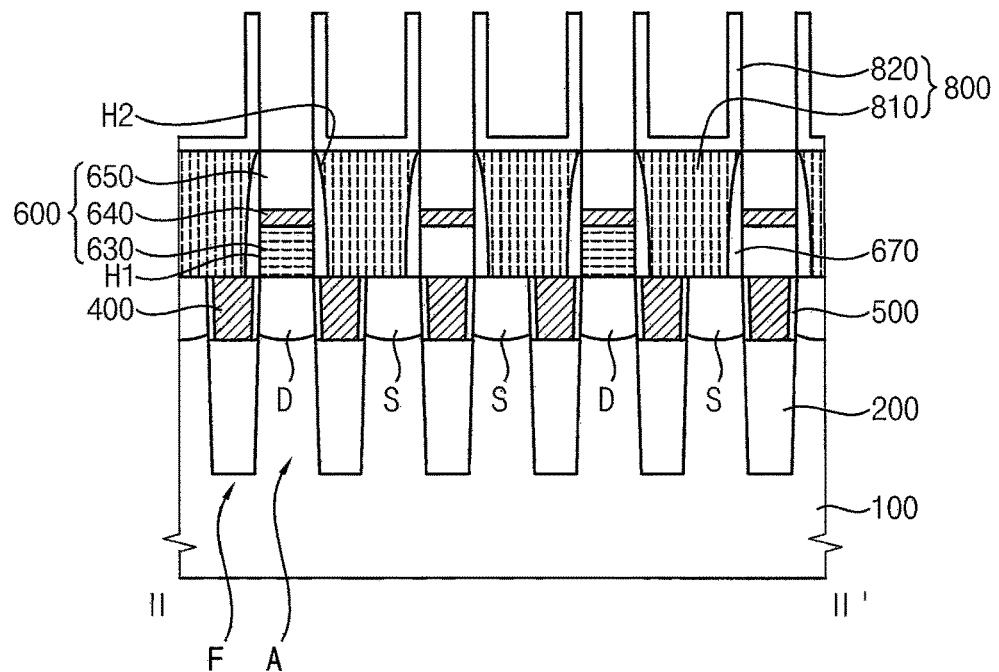
FIG. 16A is a cross-sectional view cut along the line II-II' of the layout shown in FIG. 2, according to certain example embodiments.
Figure 16B:
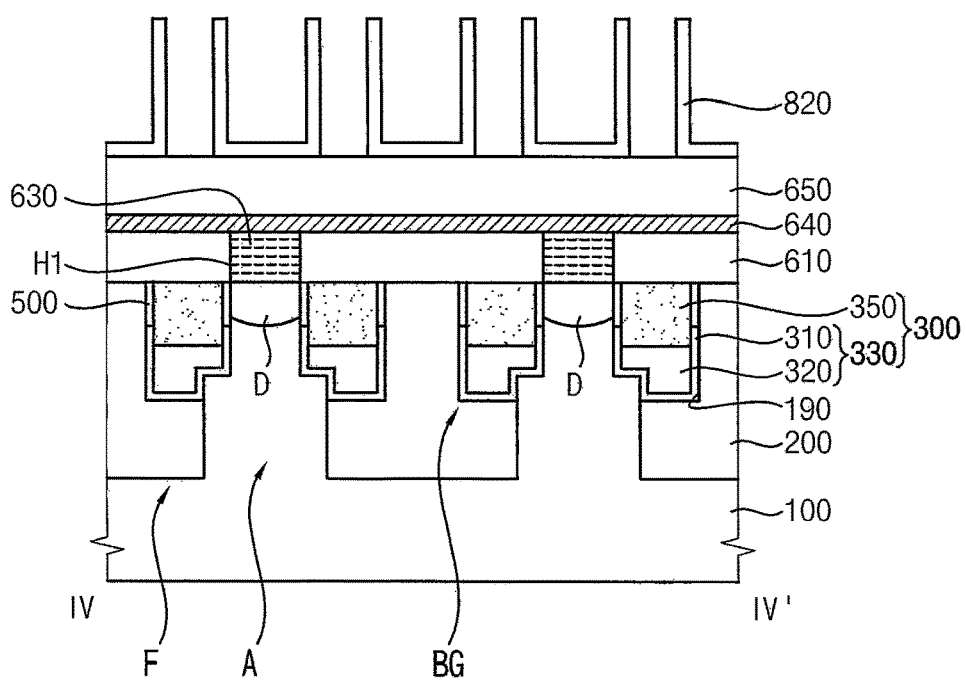
FIG. 16B is a cross-sectional view cut along the line IV-IV' of the layout shown in FIG. 2, according to certain example embodiments.

FIGS. 16A and 16B are cross-sectional views illustrating a memory device in accordance with another example embodiment. In FIGS. 16A and 16B, the memory device may include a DRAM device having a plurality of buried channel array transistors each of which may include the same structures as the semiconductor devices 1001 shown in FIG. 5 based on the layout of FIG. 2.

FIG. 16A is a cross-sectional view cut along the line II-II' of the layout shown in FIG. 2 and FIG. 16B is a cross-sectional view cut along the line IV-IV' of the layout shown in FIG. 2. In FIGS. 16A and 16B, the same reference numerals denote the same elements in FIGS. 2 and 5 and thus any further detailed descriptions on the same elements will be omitted.

As illustrated in FIGS. 16A and 16B, the junctions S and D may be enclosed by the buffer layer 500 and the buffer layer 500 may be isolated from each other by the junction separator 400. Thus, the junctions S and D may be defined by the buffer layer 500 and the junction separator 400.

When the misalignment may be generated between the first contact hole H1 and the drain junction D and between the second contact hole H2 and the source junction S in the etching process for forming the first and the second contact holes H1 and H2, the buffer layer 500 may be etched off from the substrate 100 while the junction separator 400 may remain around the junctions S and D. Thus, the process margin of the etching process for forming the contact holes H1 and H2 may increase as much as the thickness of the buffer layer 500. In addition, when the bit line contact 630 and the storage node contact 810 are filled into the first and the second holes H1 and H2, the size of the contacts 630 and 810 may also be enlarged as much as the thickness of the buffer layer 500. Further, since the junction separator 400 may still remain around the source and drain junctions S and D, the bit line contact 630 and the storage node contact 810 may be sufficiently separated from each other by the junction separator 400. Therefore, the electrical shortage between the neighboring contacts 630 and 810 may be sufficiently prevented in spite of the size reduction of semiconductor devices.

Figure 17A:
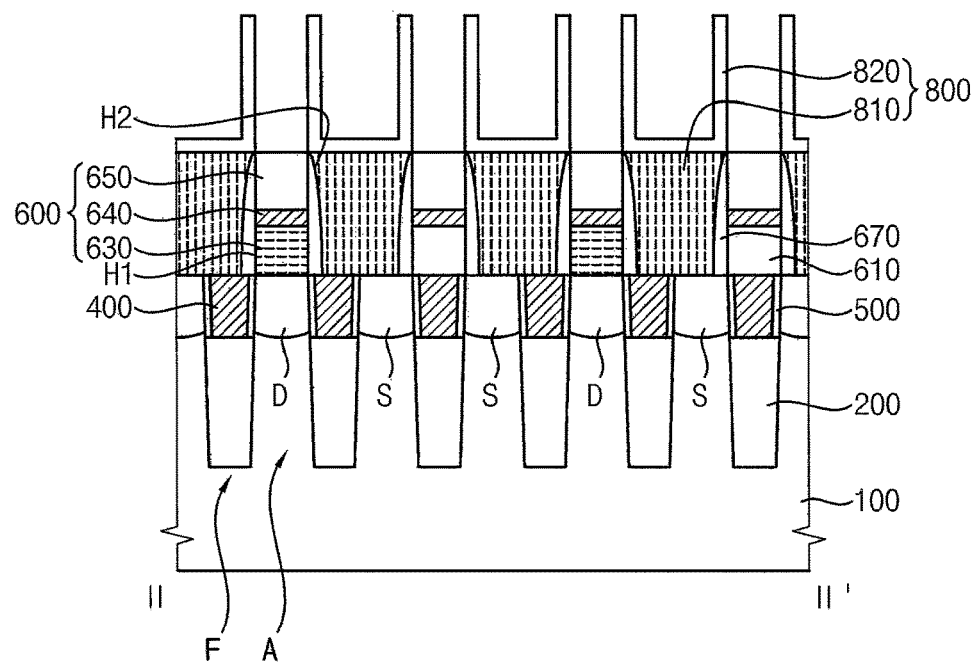
FIG. 17A is a cross-sectional view cut along the line II-II' of the layout shown in FIG. 2, according to certain example embodiments.
Figure 17B:
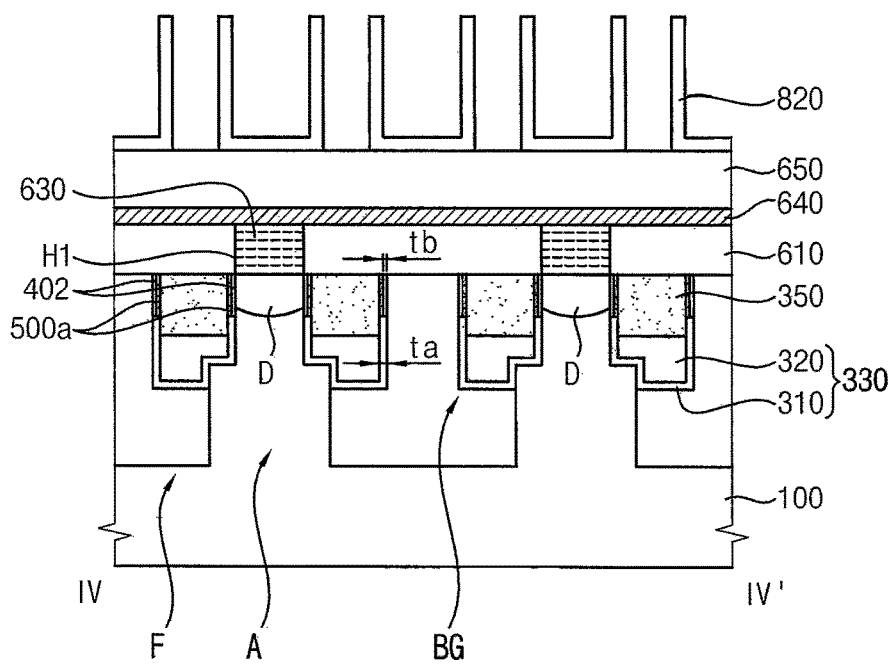
FIG. 17B is a cross-sectional view cut along the line IV-IV' of the layout shown in FIG. 2, according to certain example embodiments.

FIGS. 17A and 17B are cross-sectional views illustrating a memory device in accordance with another example embodiment. In FIGS. 17A and 17B, the memory device may include a DRAM device having a plurality of buried channel array transistors each of which may include the same structures as the semiconductor devices 1002 shown in FIG. 8 based on the layout of FIG. 2.

FIG. 17A is a cross-sectional view cut along the line II-II' of the layout shown in FIG. 2 and FIG. 17B is a cross-sectional view cut along the line IV-IV' of the layout shown in FIG. 2. In FIGS. 17A and 17B, the same reference numerals denote the same elements in FIGS. 2 and 8 and thus any further detailed descriptions on the same elements will be omitted.

As illustrated in FIGS. 17A and 17B, the junctions S and D may be enclosed by the reduced buffer layer 500a and the reduced buffer layer 500a may be isolated from each other by the junction separator 400. Thus, the junctions S and D may be defined by the reduced buffer layer 500a and the junction separator 400. The thickness $t_b$ of the reduced buffer layer 500a may be smaller than the thickness $t_a$ of the gate insulation layer 310, and thus the junction separator 400 may be further interposed between the capping layer 350 and the reduced buffer layer 500a. Therefore, the reduced buffer layer 500a may be shaped into a loop encircling the junctions S and D.

The junction separator 400 may include the planar separator 401 filling up the recess R around the neighboring junctions S and D in the first direction x and the separation strap 402 interposed between the reduced buffer layer 500a and the capping layer 350. The bit line contact 640 and the storage node contact 810 may be sufficiently separated by the planar separator 401. In addition, the insulation distance between the buried gate structure BG and the junctions S and D may increase as much as the thickness of the separation strap 402, thereby sufficiently decreasing the gate-induced drain leakage (GIDL) in the memory device.

Figure 18A:
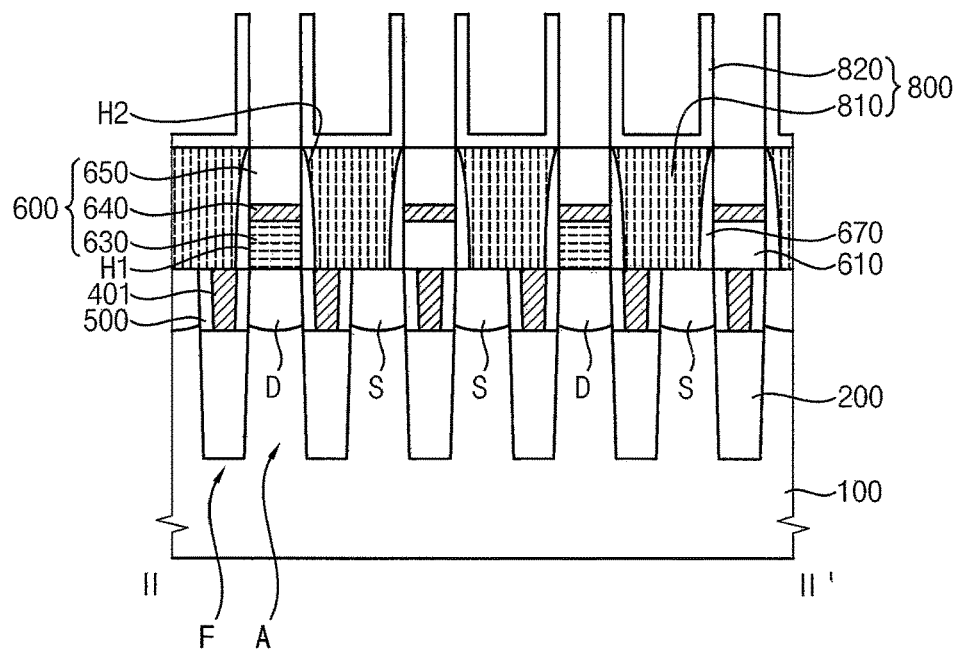
FIG. 18A is a cross-sectional view cut along the line II-II' of the layout shown in FIG. 2, according to certain example embodiments.
Figure 18B:
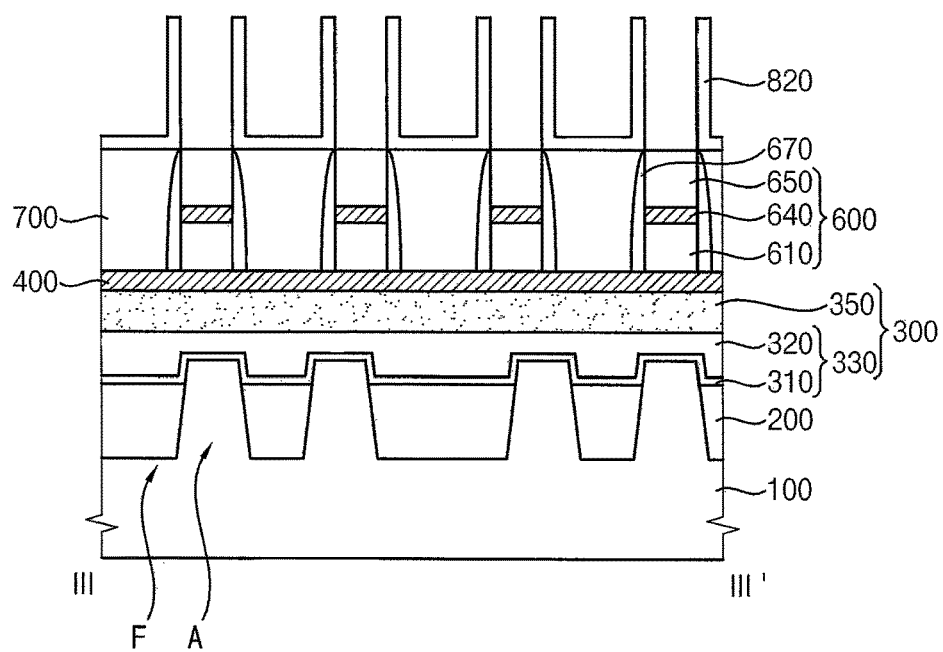
FIG. 18B is a cross-sectional view cut along the line III-III' of the layout shown in FIG. 2, according to certain example embodiments.
Figure 18C:
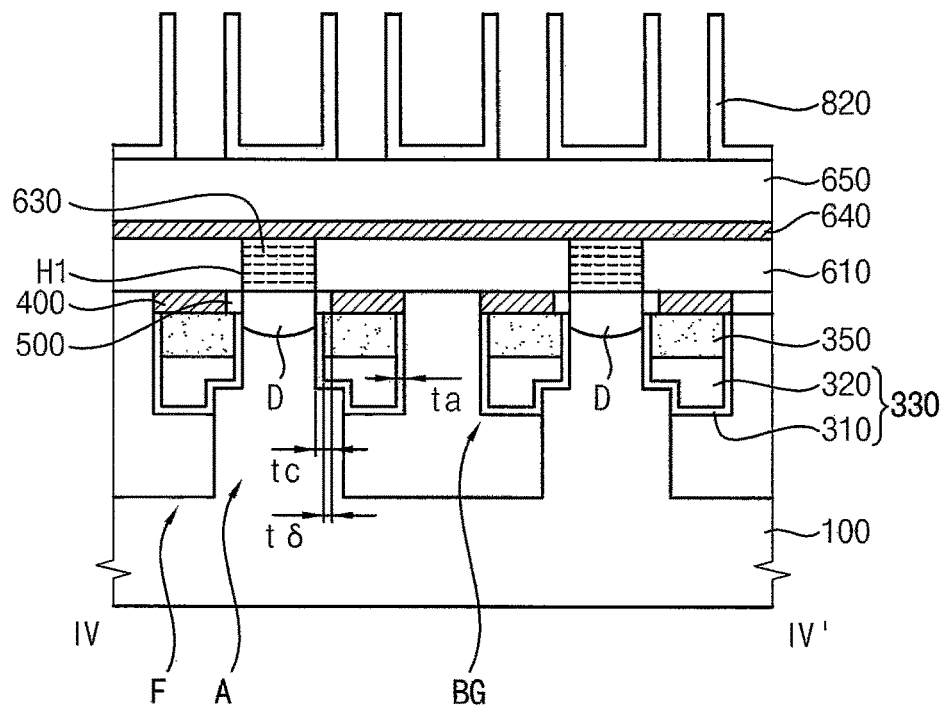
FIG. 18C is a cross-sectional view cut along the line IV-IV' of the layout shown in FIG. 2, according to certain example embodiments.

FIGS. 18A and 18C are cross-sectional views illustrating a memory device in accordance with another example embodiment. In FIGS. 18A and 18C, the memory device may include a DRAM device having a plurality of buried channel array transistors each of which may include the same structures as the semiconductor devices 1003 shown in FIG. 11 based on the layout of FIG. 2.

FIG. 18A is a cross-sectional view cut along the line II-II' of the layout shown in FIG. 2 and FIG. 18B is a cross-sectional view cut along the line III-III' of the layout shown in FIG. 2. FIG. 18C is a cross-sectional view cut along the line IV-IV' of the layout shown in FIG. 2. In FIGS. 18A to 18C, the same reference numerals denote the same elements in FIGS. 2 and 11 and thus any further detailed descriptions on the same elements will be omitted.

As illustrated in FIGS. 18A to 18C, the junctions S and D may be enclosed by the buffer layer 500 and the buffer layer 500 may include portions isolated from each other by the junction separator 400. The buffer layer 500 may be shaped into a loop encircling the junctions S and D.

The junction separator 400 may extend over the capping layer 350. Particularly, when the junction separator 400 comprises the same materials as the capping layer 350, the junction separator 400 may function just like the capping layer 350.

In the present example embodiment, the loop-shaped buffer layer 500 may be expanded in such a way that the thickness of the loop may increase along the active line to an incremental thickness $t_\delta$ and the thickness $t_c$ of the buffer layer 500 may be greater than the thickness $t_a$ of the gate insulation layer 310 (e.g., thicknesses here referring to a distance in a horizontal direction away from the active region (e.g., away from the drain D in FIG. 18C). Thus, an incremental portion of the buffer layer 500 may be at least partially overlapped with the capping layer 350 (e.g., vertically overlapped) and the process margin of the etching process for forming the contact hole may be increased along the active line.

However, the increase of the buffer layer 500 along the active line may cause the reduction of the junction separator 400 between the neighboring junctions S and D along the first direction x, and the size reduction of the junction separator 400 may tend to generate the electrical shortage between the neighboring contacts 630 and 810 in the first direction x. For those reasons, the incremental thickness $t_\delta$ of the buffer layer 500 may have a particular thickness on condition that the size reduction of the junction separator 400 does not cause the electrical shortage between the neighboring contacts 630 and 810.

Hereinafter, the manufacturing process for the memory devices having a plurality of buried channel array transistors each of which may include substantially the same structures as the semiconductor devices shown in FIGS. 1, 5, 8 and 11 based on the layout of FIG. 2. In FIGS. 19A to 30C, the alphabetic letter A in each figure number denotes a cross-sectional view cut along the line II-II' of the layout shown in FIG. 2 and the alphabetic letter B in each figure number denotes a cross-sectional view cut along the line III-III' of the layout shown in FIG. 2. The alphabetic letter C in each figure number denotes a cross-sectional view cut along the line IV-IV' of the layout shown in FIG. 2.

FIGS. 19A to 27C are cross-sectional views illustrating process steps for a method of manufacturing memory devices including the semiconductor device shown in FIG. 1 in accordance with an example embodiment of the present inventive concept. In FIGS. 19A to 27C, the same reference numerals denote the same elements in FIGS. 1 and 2. As a result of these various steps, a semiconductor device such as described in the above embodiments, including the various described features, may be provided.

Figure 19A:
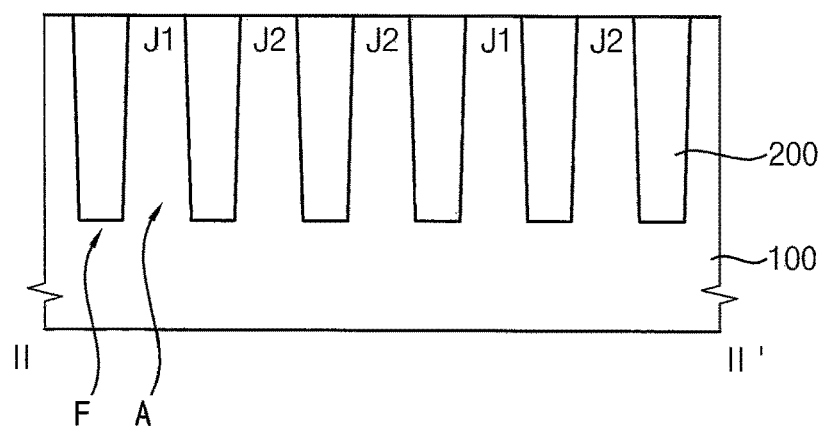
FIGS. 19A to 27C are cross-sectional views illustrating process steps for a method of manufacturing memory devices including the semiconductor device shown in FIG. 1 in accordance with certain example embodiments of the present inventive concept.
Figure 19B:
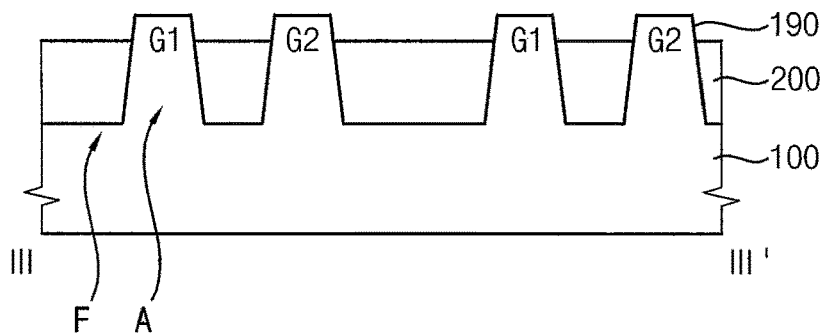
Figure 19C:
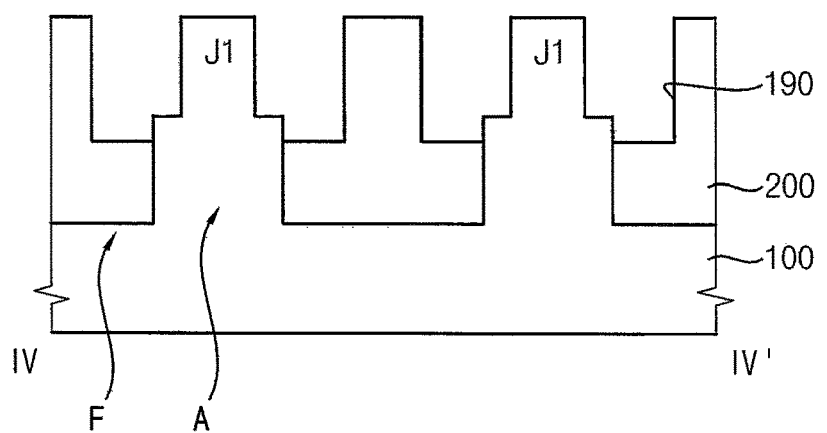

Referring to FIGS. 19A to 19C, the gate trench 190 may be formed on the substrate 100 on which the active region A may be defined by the device isolation layer 200 along the first direction x in such a way that the active region A and the gate trench 190 may cross each other. Thus, the active region A of the substrate 100 may be separated into the gate area G that may be lower than the top-most surface of the substrate 100 and the junction area J that may be provided on the top-most surface of the substrate 100.

For example, a device isolation trench (not shown) may be formed on the substrate 100 and insulation materials may be filled up into the device isolation trench, thereby forming the device isolation layer 200 defining the active region A.

The substrate 100 may include a semiconductor substrate such as a silicon substrate, a silicon-germanium substrate and a silicon-on-insulator (SOI) substrate and may be classified into the active region A on which conductive structures may be located and the field region F defining the active region A. The device isolation layer 200 may be provided with the field region F, so the neighboring conductive structures on the adjacent active region A may be electrically isolated from each other by the device isolation layer 200 around the active region A.

For example, the device isolation layer 200 may be provided on the field region F of the substrate 100 by a device isolation process such as a shallow-trench isolation (STI) process. The device isolation trench may be formed on the substrate 100, for example by a plasma etching process, and may be filled up with the insulation materials such as BPSG, USG, HDP oxides, and nitrides.

In the present example embodiment, the active region A may be slanted (e.g., diagonal) with respect to the first or the second directions x and y and shaped into a bar having a length much greater than a width. The neighboring slanted active regions A may be separated from each other by the device isolation layer 200. Thus, a plurality of the slanted active regions A may be arranged on the device isolation layer 200 just like isolated islands.

Particularly, the device isolation trench may be have a relatively large aspect ratio, so that only the sidewall oxide (or further with the liner) may fill up the device isolation trench before the gap-fill process with insulation materials such as silicon nitride to the device isolation trench. Thus, only the sidewall oxide or the stack layer of the sidewall oxide and the liner may be provided as the device isolation layer 200 in some portions of the field region F.

A thermal oxidation process may be performed on the device isolation trenches and thus a silicon oxide layer may be formed on the sidewall and the bottom of the device isolation trench as the sidewall oxide layer. Then, silicon nitride layer may be formed on the sidewall oxide layer by a deposition process as the liner. Thus, when the gap distance between the active regions A is so small that the field region F has a narrow size (referred to as a first field region F1), the device isolation trench in the first field region F1 may be filled up only with the sidewall oxide and thus the device isolation layer 200 may include only the silicon oxide layer. In contrast, when the gap distance between the active regions A is relatively long and thus the field region F has a relatively larger size than the first field region F1 (referred to as a second field region F2), the device isolation trench in the second field region F2 may be filled up with the stack layer of the sidewall oxide and the liner and thus the device isolation layer 200 may include the silicon oxide layer and the silicon nitride layer. When the size of the second field region F2 is small just like the first field region F1, the device isolation layer 200 in the second field region F2 would just include the sidewall oxide layer.

Then, the gate trenches 190 may be formed on the substrate 100 along the first direction x with being spaced apart by the same distance in the second direction y. Since the active region A may be slanted with respect to the first direction x, the active region A and the device isolation layer 200 around the active region A may be alternately removed to a depth in the first direction, thereby forming the gate trench 190 on the substrate 100. As a result, the active region A may be separated into the gate area G that may be positioned at the bottom of the gate trench 190 and the junction area J corresponding to the top surface of the substrate 100 around the gate trench 190 without being removed.

Since the etching rate of the device isolation layer 200 may be higher than that of the substrate 100 of the active region A, an upper surface of the device isolation layer 200 may be lower than that of the active region A at the bottom of the gate trench 190.

In the present example embodiment, a pair of the gate trenches 190 may cross a single active region A that may be shaped into the bar and slanted with respect to the gate trench 190. Therefore, the gate area G may include first and second gate areas G1 and G2 and the junction area J may include a first junction area J1 that may be positioned at a central portion of the bar-shaped active region A and a second junction area J2 that may be positioned at both end portions of the bar-shaped active region A.

Figure 20A:
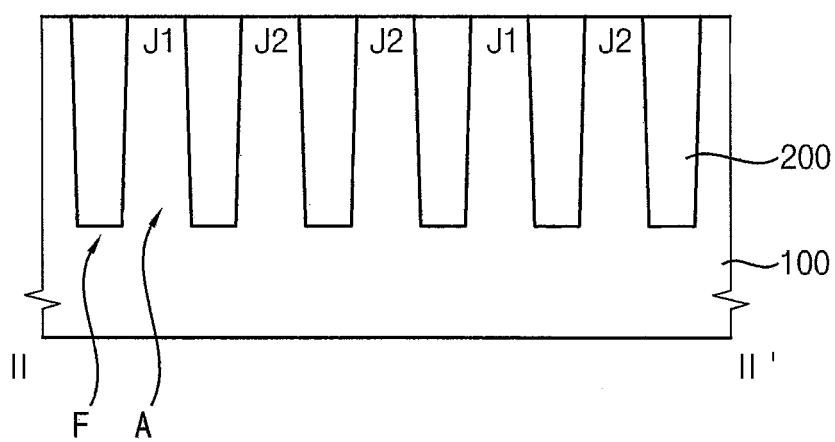
Figure 20B:
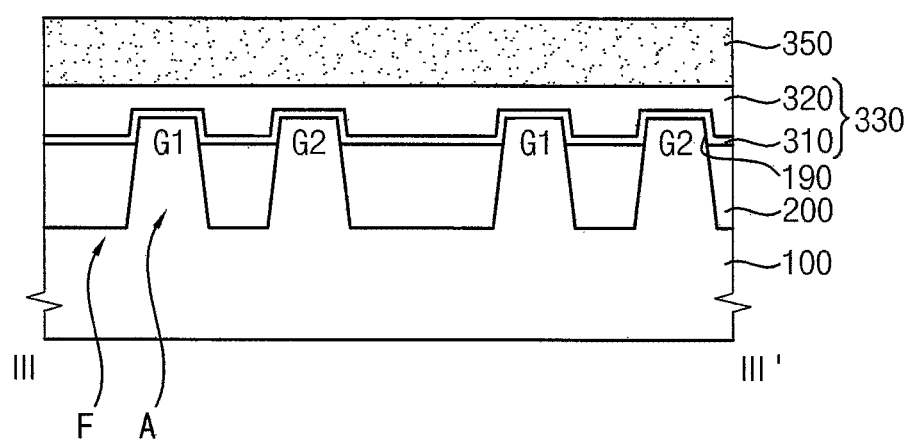
Figure 20C:
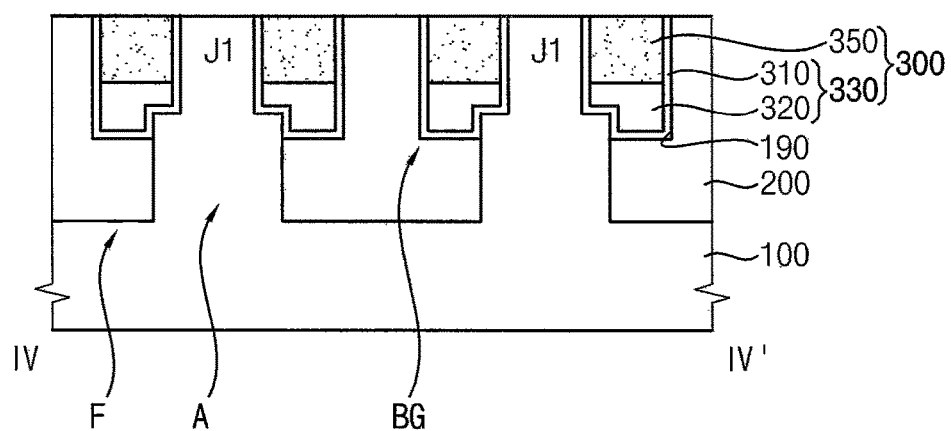

Referring to FIGS. 20A to 20C, the first conductive line 300 including the buried gate structure BG may be formed in the gate trench 190 in the first direction x.

For example, a preliminary gate insulation layer (not shown) may be formed on the substrate 100 along a surface profile of the gate trench 190 by a CVD process and a thermal oxidation process, so that the sidewall and the bottom of the gate trench 190 as well as the top surfaces of the junction area J and the device isolation layer 200 may be covered with the preliminary gate insulation layer. Then, a preliminary gate conductive layer (not shown) may be formed on the preliminary gate insulation layer to a sufficient thickness to fill up the gate trench 190 by a physical vapor deposition (PVD) process or a sputter process.

Then, the preliminary gate conductive layer and the preliminary gate insulation layer may be partially removed from the substrate 100 by a planarization process until the top surfaces of the junction area J and the device isolation layer 200, so the preliminary gate insulation layer and the preliminary gate conductive layer may remain just in the gate trench 190. Thereafter, an upper portion of the residuals of the preliminary gate conductive layer may be further removed from the substrate by an etch-back process, and thus a lower portion of the gate trench 190 may be filled up with the residuals of the preliminary gate conductive layer. Therefore, the bottom and sidewall of the gate trench 190 may be covered with the gate insulation layer 130 and the gate conductive layer 320 may fill the lower portion of the gate trench 190 and extend along the first direction x. Thus, an upper surface of the gate conductive layer 320 may be lower than the top-most surface of the substrate 100.

A preliminary capping layer (not shown) may be formed on the substrate 100 to a sufficient thickness to fill up the upper portion of the gate trench 190 and then may be planarized until the top surface of the substrate is exposed. Thus, the preliminary capping layer may remain just in the upper portion of the gate trench 190. The residuals of the preliminary capping layer may fill up the upper portion of the gate trench 190 and cover the gate conductive layer 320, thereby forming the capping layer 350 extending in the first direction x on the gate conductive layer 320.

In some embodiments, the gate insulation layer 310 may comprise silicon oxide and the gate conductive layer 320 may comprise conductive materials such as polysilicon and low resistive metal or metallic compounds. In certain embodiments, the gate conductive layer 320 may include a barrier layer 321 comprising tungsten nitride (WN) and titanium nitride (TiN) and a conductive layer 322 comprising tungsten (W) and titanium (Ti). The capping layer 350 may comprise silicon nitride having good insulation and etch-resistance characteristics.

The gate insulation layer 310 and the gate conductive layer 320 may be formed into the gate line 330 extending in the first direction x and the capping layer 350 may extend along the same first direction x and protect the gate line 330 from surroundings. The gate line 330 and the capping layer 350 may be formed into the first conductive line functioning as the word line WL of the memory device.

Then, the junction separator 400 may be formed on the device isolation layer 200 around the junction areas J.

Figure 21A:
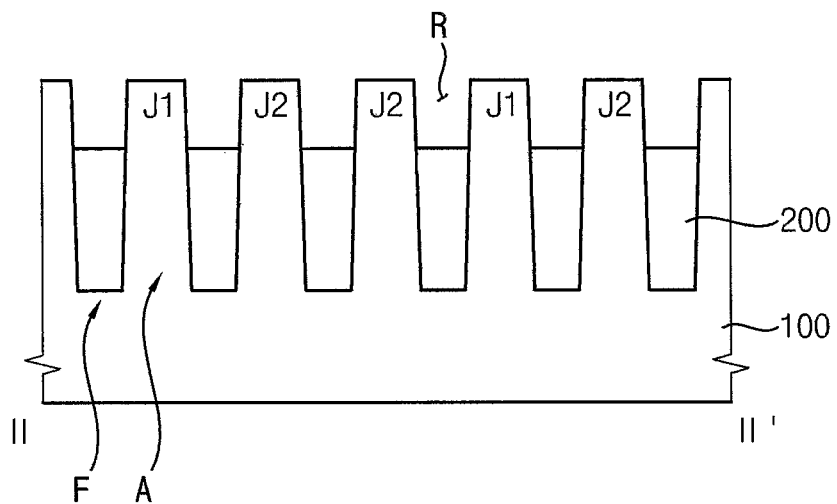
Figure 21B:
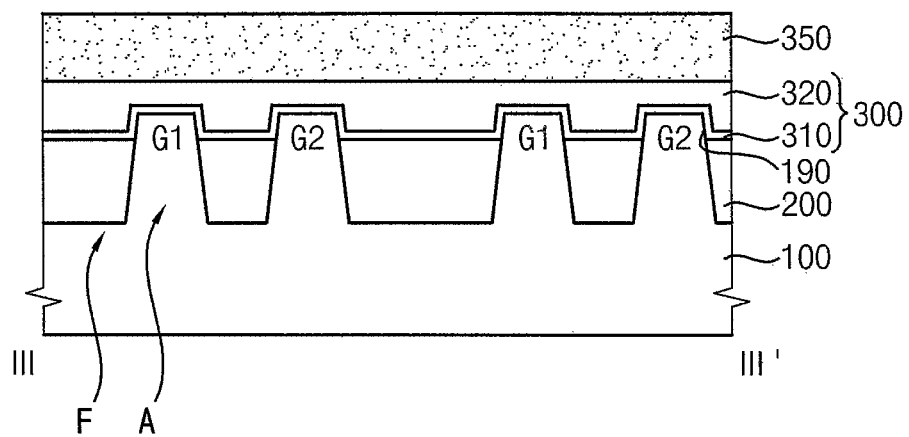
Figure 21C:
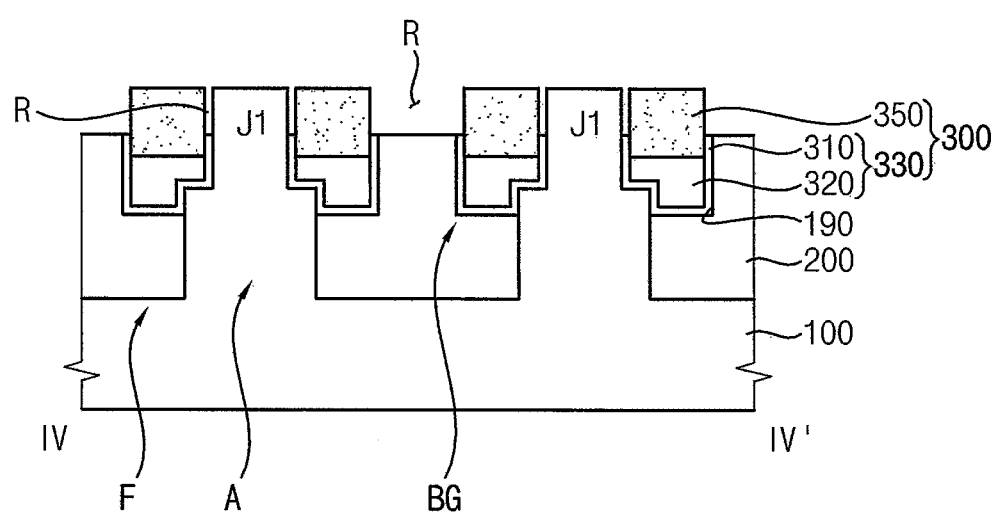

Referring to FIGS. 21A to 21C, upper portions of the device isolation layer 200 and the gate insulation layer 310 may be removed from the substrate 100 and an upper portion of the capping layer 350, thereby forming the recess R defined by the junction area J of the active region A and the capping layer 350.

In certain embodiments, since the device isolation layer 200 may just include the sidewall oxide layer, the device isolation layer 200 may be accurately removed to an expected depth by a wet etching process using a phosphoric aqueous solution as an etchant.

Since the gate insulation layer 310 may extend on the sidewalls of the gate trench 190 in the first direction x, a sidewall of the junction area J and a sidewall of the device isolation layer 200 may alternately contact gate insulation layer 310 in the first direction x and thus the removal of the device isolation layer 200 may reveal the gate insulation layer 200 in the first direction x. In such a case, the gate insulation layer 310 may be removed in the same wet etching process together with the device isolation layer 200 because both of the gate insulation layer 310 and the device isolation layer may include an oxide layer just like the gate oxide layer and the sidewall oxide layer.

Accordingly, the heights of the device isolation layer 200 and the gate insulation layer 310 may be reduced and the sidewall of the junction areas J and the sidewall of the capping layer 350 may be exposed in such a configuration that the upper surface of the gate device isolation layer 200 may be coplanar with the upper surface of the gate insulation layer 310.

Figure 22A:
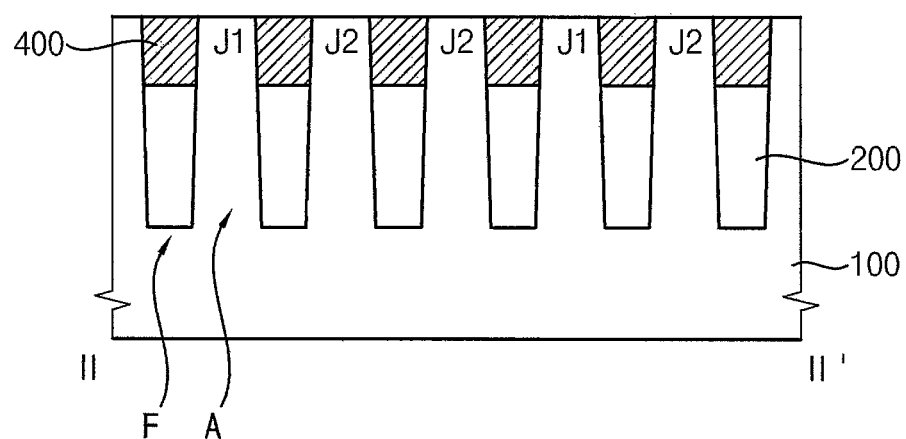
Figure 22B:
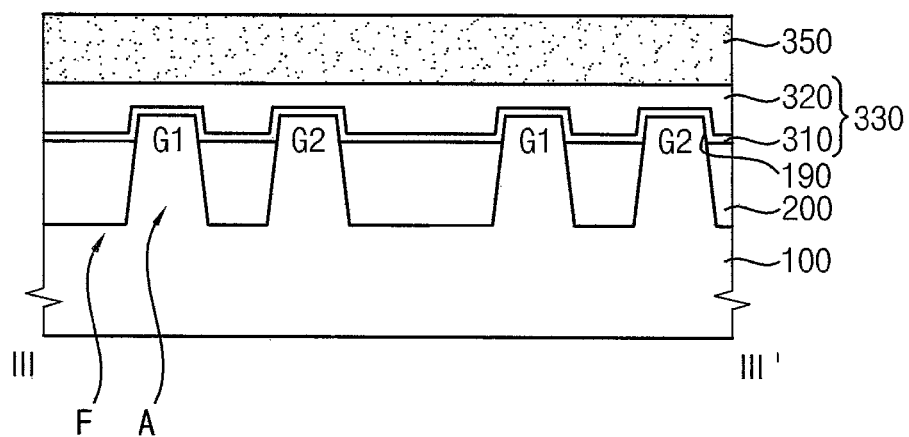
Figure 22C:
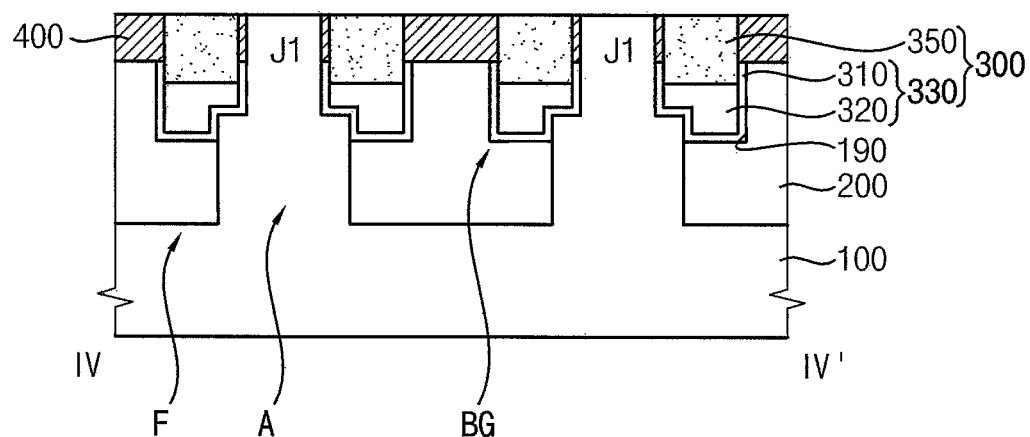

Referring to FIGS. 22A to 22C, a preliminary junction separator (not shown) having a lower etching rate than the device isolation layer 200 may be formed on the substrate 100 to a sufficient thickness to fill up the recess R, thus the junction areas J and the capping layer 350 may be covered with the preliminary junction separator. Then, the preliminary junction separator may be removed from the substrate 100 by a planarization process, thereby forming the junction separator 400 filling up the recess R.

For example, the preliminary junction separator may be formed to a sufficient thickness to fill up the recess R by a chemical vapor deposition (CVD) process. Then the preliminary junction separator may be partially removed by a chemical mechanical polishing (CMP) process or an etch-back process, until the upper surface of the junction areas J are exposed. Therefore, the preliminary junction separator may remain just in the recess R, forming the junction separator 400 of which the upper surface may be coplanar with the upper surfaces of the junction areas J and the capping layer 350.

The preliminary junction separator may comprise, for example, silicon nitride having an etching rate lower than the sidewall oxide layer of the device isolation layer 200.

Then, source and drain junctions S and D may be formed on the junction areas J and the second conductive line 600 and the charge storage element 800 may be formed in such a way that the second conductive line 600 contacts the drain junction D and the charge storage element 800 contacts the source junction S.

Figure 23A:
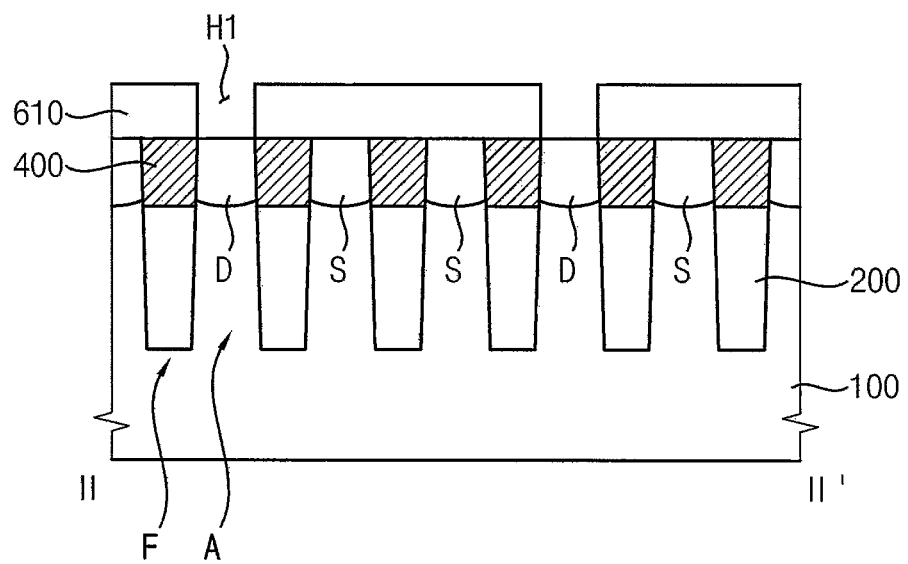
Figure 23B:
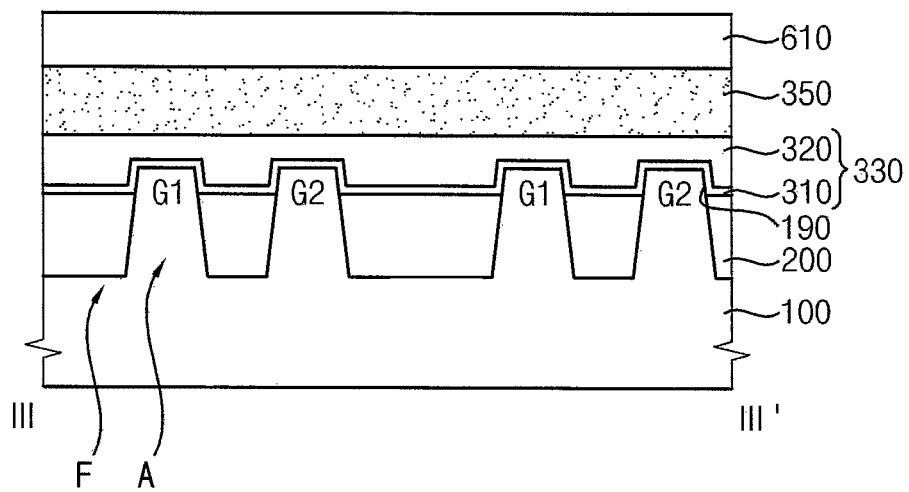
Figure 23C:
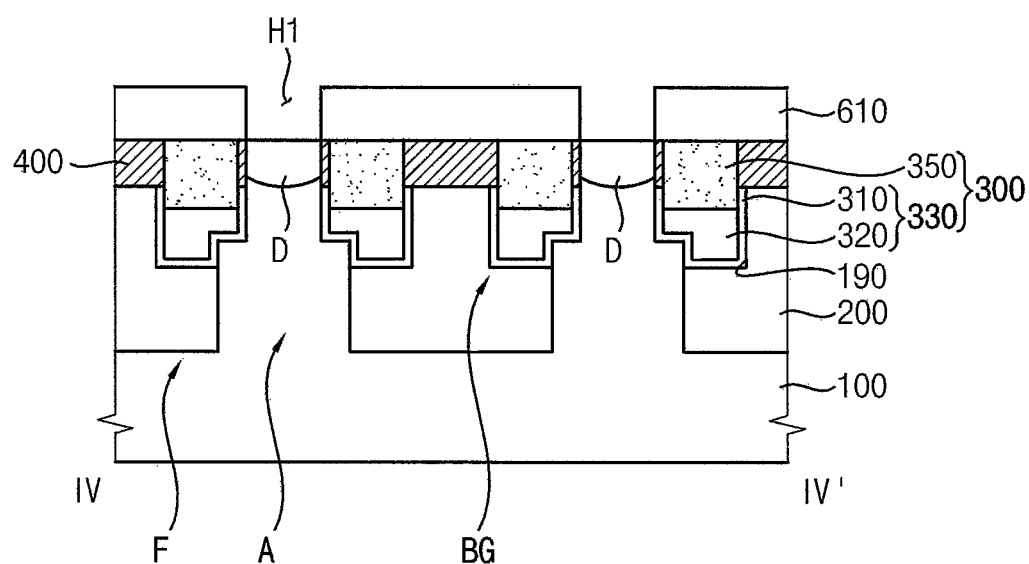

Referring to FIGS. 23A to 23C, a plurality of dopants may be implanted onto the junction areas J by an ion implantation process using the device isolation layer 200 and the capping layer 350 as an ion implantation mask, thereby forming the source and drain junctions S and D. The buried gate structure BG and a pair of the source and drain junctions S and D around the gate structure BG in the active line may be formed into a buried channel array transistor BCAT. Thus, the BCAT may have substantially the same structure as the semiconductor device 1000 shown in FIG. 1 in the present example embodiment.

Thus, a plurality of the capping layers 350 may extend in the first direction x and the junctions S and D that may be defined by the junction separator 400 may be arranged in a line between the neighboring capping layers 350.

Since a pair of the capping layers 350 may be arranged in a single active region A, the drain junction D may be formed at a central portion of the active region A and the source junction S may be formed at both end portions of the active region A.

Then, a first preliminary layer (not shown) may be formed on the substrate 100 having the junctions S and D, and a first contact hole H1 through which the drain junction D may be exposed may be formed through the first preliminary layer.

For example, the first preliminary layer may be uniformly formed on the substrate 100 by a CVD process, and a first mask pattern (not shown) may be formed on the first preliminary layer. The first preliminary layer may be partially removed by an etching process using the first mask pattern as an etching mask, thereby forming a first layer 610 having the first hole H1.

In the etching process for forming the first contact hole H1, the junction separator 400 may be significantly more etch-resistant than the first preliminary layer. Therefore, when the first contact hole H1 is misaligned with the drain junction D and thus the junction separator 400 may be partially exposed through the first contact hole H1, the junction separator 400 may still remain around the drain junction D after the etching process. Therefore, the drain junction D may be sufficiently isolated from neighboring source junctions S in spite of the misalignment in the etching process.

In case that the drain junction D would be enclosed just by the device isolation layer 200 without the junction separator 400, the device isolation layer 200, i.e., the sidewall oxide layer, may be etched off together with the first preliminary layer in the etching process for forming the first contact hole H1 due to the misalignment. Thus, the bit line contact 630 may be expanded toward the field region F around the drain junction D and the gap distance between the bit line contact 630 and the storage node contact 810 would be shortened, which may increase the possibility of electrical connection between the bit line contact 630 and the storage node contact 810 in a subsequent process.

However, the junction separator 400 may still remain around the drain junction D in the etching process for forming the first contact hole H1, so the drain junction D may be sufficiently insulated from the neighboring source junction S. Accordingly, although the storage node contact 810 may be expanded toward the field region F around the source junction S, the bit line contact 640 may be sufficiently prevented from the electrical connection with the storage node contact 810.

The first layer 610 may include an insulation layer or a conductive layer. When the first layer 610 comprises insulation materials such as an oxide, the first layer 610 may function as an insulation interlayer through which the bit line contacts may penetrate and thus the bit line contacts may be electrically insulated from each other by the first layer 610. In addition, when the first layer 610 may comprise conductive materials such as polysilicon, the first layer 610 may be used as a peripheral gate conductive layer (not shown) in a peripheral region of the substrate 100. For example, the peripheral gate conductive layer may be formed on the peripheral region simultaneously with the first layer 610.

Figure 24A:
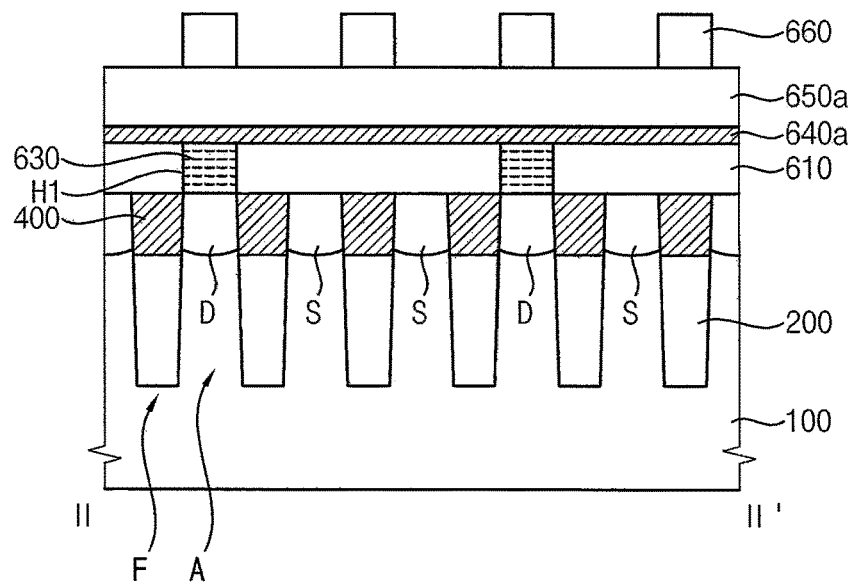
Figure 24B:
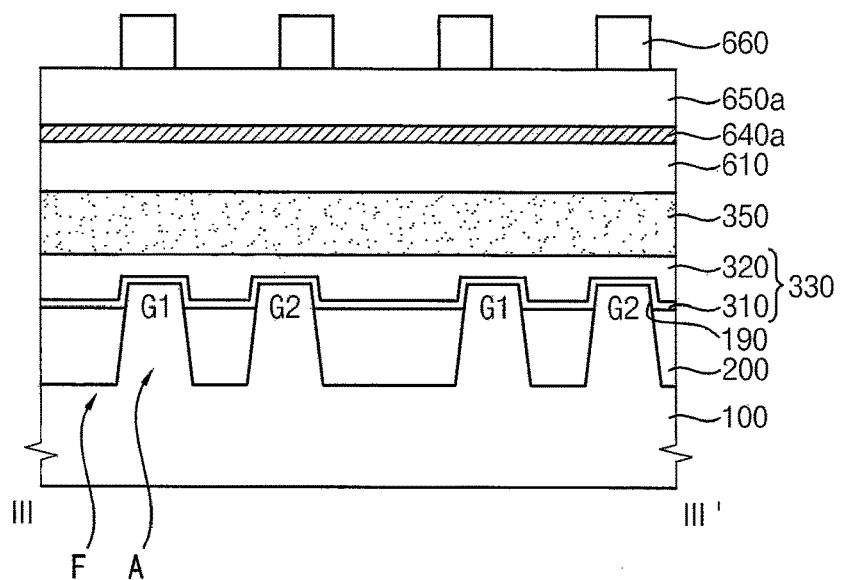
Figure 24C:
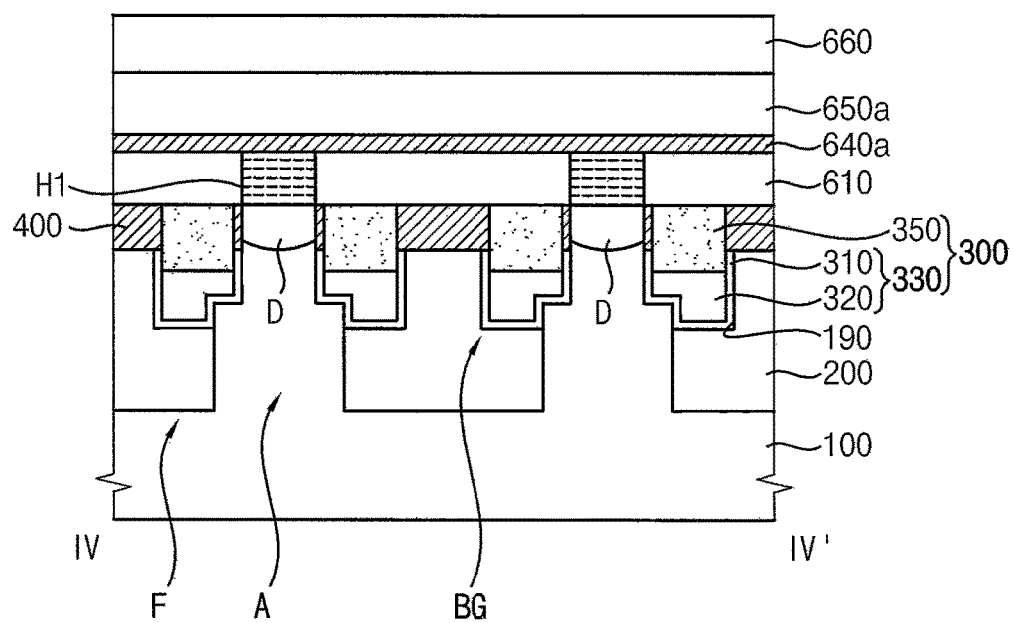

Referring to FIGS. 24A to 24C, a first conductive layer (not shown) may be formed on the first layer 610 to a sufficient thickness to fill up the first contact hole H1 after removing the first mask pattern and may be partially removed by a planarization process, thereby remaining only in the first contact hole H1. Therefore, the bit line contact 630 may be formed in the first contact hole H1. The bit line contact 630 may comprise, for example, polysilicon or a composite of the polysilicon and a metal.

Then, a second preliminary layer 640a may be formed on the first layer 610 having the bit line contact 630 therethrough and a preliminary bit line mask layer 650a may be formed on the second preliminary layer 640a. The second preliminary layer 640a may comprise, for example, a low resistive metal such as copper (Cu) and aluminum (Al) and the preliminary bit line mask layer 650a may comprise, for example, any one of silicon oxide, silicon nitride, and silicon oxynitride.

Then, a photoresist pattern 660 may be formed into a plurality of photoresist lines on the preliminary bit line mask layer 650a in such a way that the photoresist line may extend in the second direction y and the photoresist lines may be spaced apart by the same distance in the first direction x. Thus, the drain junctions D that may be arranged in a line along the second direction y may be commonly covered with each photoresist line of the photoresist pattern 660.

Figure 25A:
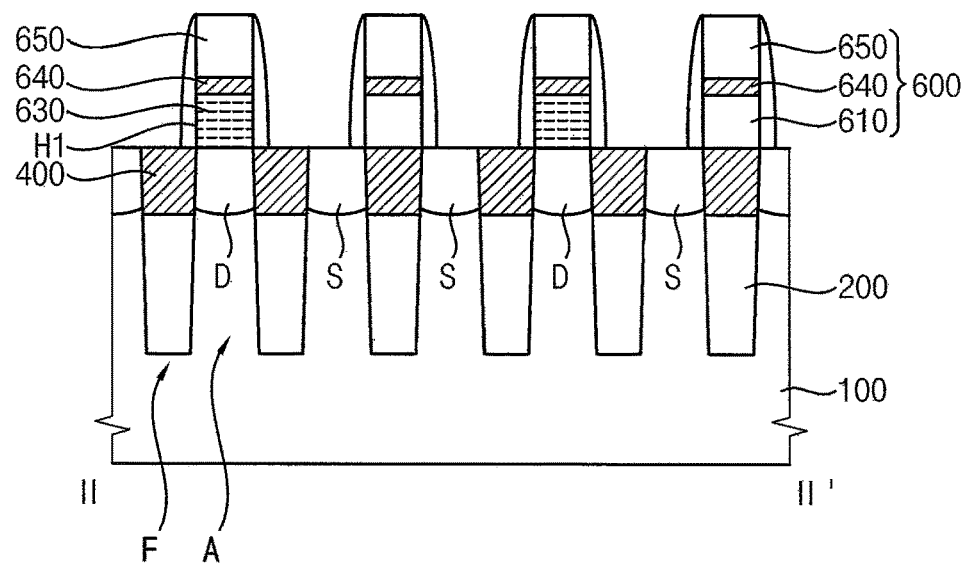
Figure 25B:
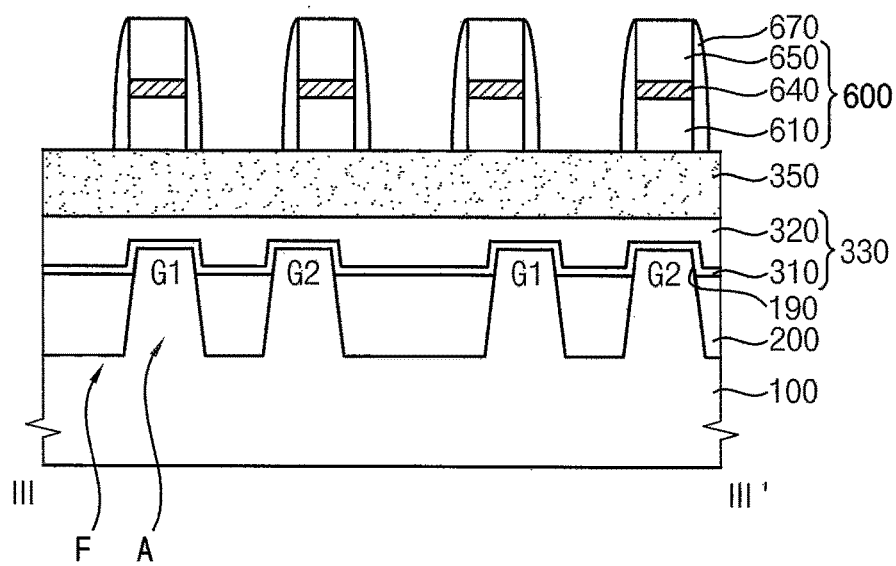
Figure 25C:
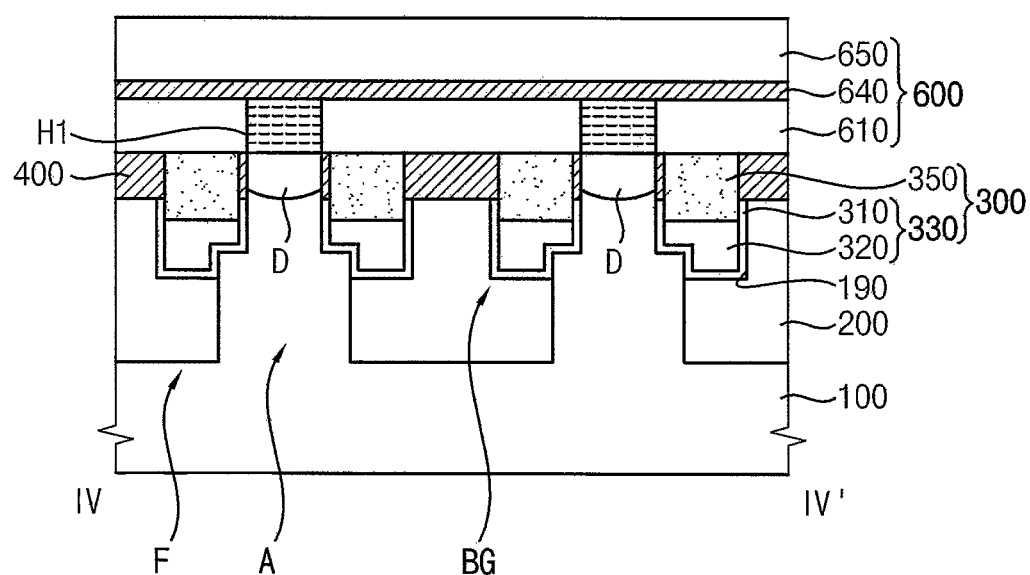

Referring to FIGS. 25A to 25C, the preliminary bit line mask layer 650a, the second preliminary conductive layer 640a and the first layer 610 may be sequentially and partially removed from the substrate 100 by an etching process using the photoresist pattern 660 as an etching mask. Thus, the second preliminary conductive layer 640a may be formed into the bit line 640 making contact with the drain junctions D along the second direction y and the preliminary bit line mask layer 650a may be formed into a bit line mask layer 650 extending on the bit line 640 along the second direction y. The first layer 610 may remain just under the bit line 640 along the second direction y, and the source junctions S, the junction separator 400 around the source junctions S, and the capping layer 350 between the neighboring bit lines 640 may be partially exposed to surroundings in the second direction y.

Therefore, the first layer 610, the bit line 640 and the bit line mask layer 650 may be sequentially stacked into a line that may cover the bit line contact in the second direction y, thereby forming the second conductive line 600 extending in the second direction y. no first layer 610 may be positioned on the bit line contact 630 and thus the bit line 640 may be directly contact with the bit line contact 630. Therefore, the drain junction D may be electrically connected to the bit line 640.

In one embodiment, a bit line spacer 670 is further formed on the sidewalls of the second conductive line 600.

Figure 26A:
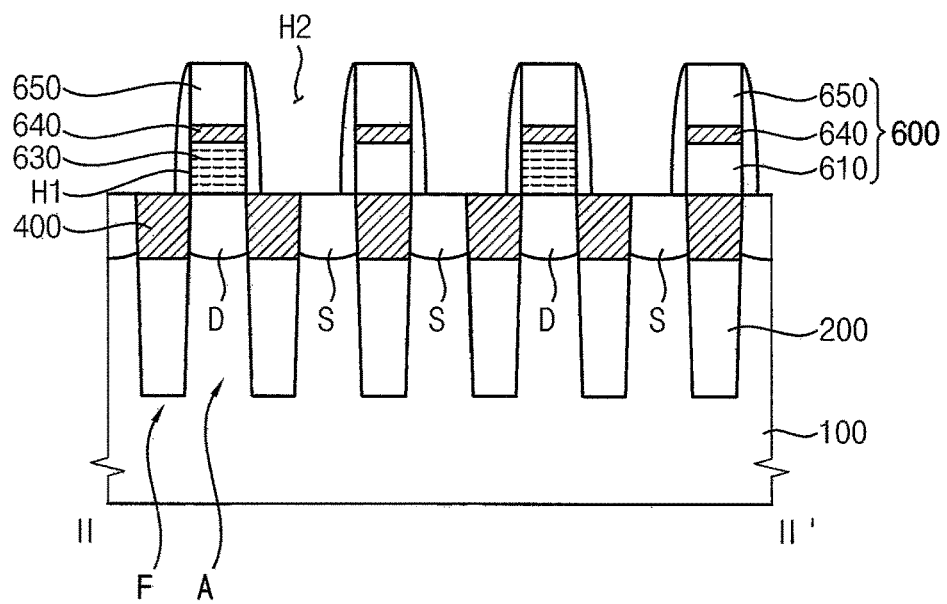
Figure 26B:
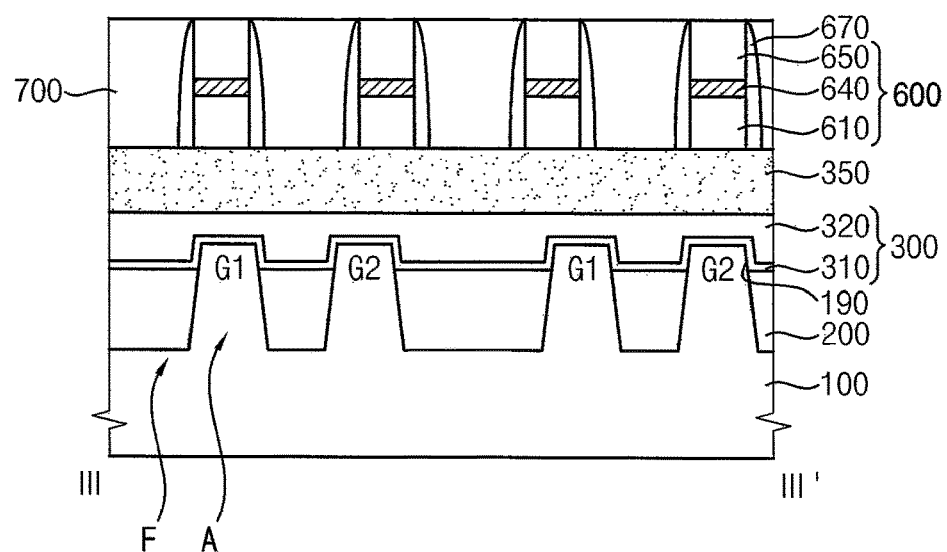
Figure 26C:
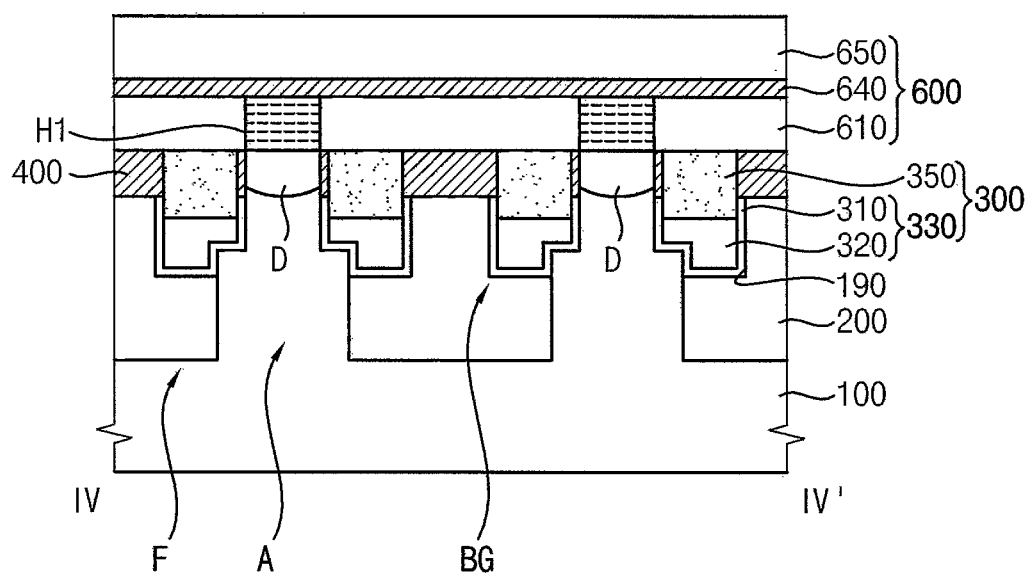

Referring to FIGS. 26A to 26C, a preliminary insulation layer (not shown) may be formed on the substrate 100 including the second conductive line 600 to a sufficient thickness to fill up a gap space between the neighboring second conductive lines 600. Then, the preliminary insulation layer may be planarized until a top surface of the second conductive line 600 is exposed, and thus the preliminary insulation layer may remain just in the gap space between the second conductive lines 600, thereby forming an insulation layer 700 filling up the gap space between the second conductive lines 600 and electrically isolating the neighboring second conductive lines 600. Then, the insulation layer 700 may be partially removed from the substrate 100 and the second contact hole H2 through which the source junction S may be exposed in the insulation layer 700.

For example, the insulation layer 700 may comprise silicon oxide and the second hole H2 may be formed by an etching process as a second mask pattern (not shown) as an etching mask.

The field region F around the source junction S may function as an alignment marginal area AMA of the etching process for forming the second contact hole H2, so that the second contact hole H2 may be expanded into the alignment marginal area AMA around the source junction S. Therefore, when the second contact hole H2 is misaligned with the source junction S, the junction separator 400 around the source junction S may also be exposed through the second contact hole H2. For example, the junction separator 400 may be exposed through the second contact hole H2 together with the source junction S in case of the misalignment in the etching process.

Since the etching rate of the junction separator 400 may be sufficiently small in the etching process for forming the second contact hole H2, the junction separator 400 may still remain around the source junction S when completing the etching process. Particularly, the junction separator 400 may function as an etch stop layer in the etching process for forming the second contact hole H2.

In a case in which the source junction S would be enclosed just by the device isolation layer 200 without the junction separator 400, the device isolation layer 200 may be etched off together with the preliminary insulation layer in the etching process for forming the second contact hole H2 due to the misalignment. Thus, the device isolation layer 200, i.e., the sidewall oxide layer, in the alignment marginal area AMA may also be etched off from the substrate 100 and thus the second contact hole H2 may be expanded to cover the alignment marginal area AMA. The storage node contact 810 in the second contact hole H2 would be positioned much closer to the bit line contact 630 on the drain junction D in the first contact hole H1. Thus, the storage node contact 810 and the bit line contact 630 would be likely to be electrically connected to each other due to the misalignment between the source junction S and the second contact hole H2.

However, the junction separator 400 may still remain around the source junction S in the etching process for forming the second contact hole H2, and thus the source junction S may be sufficiently separated and isolated from the neighboring drain junction D by the junction separator 400. Accordingly, although the storage node contact 810 may be expanded on the alignment marginal area AMA around the source junction S, the electrical connection between the bit line contact 640 and the storage node contact 810 may be sufficiently prevented by the junction separator 400.

Figure 27A:
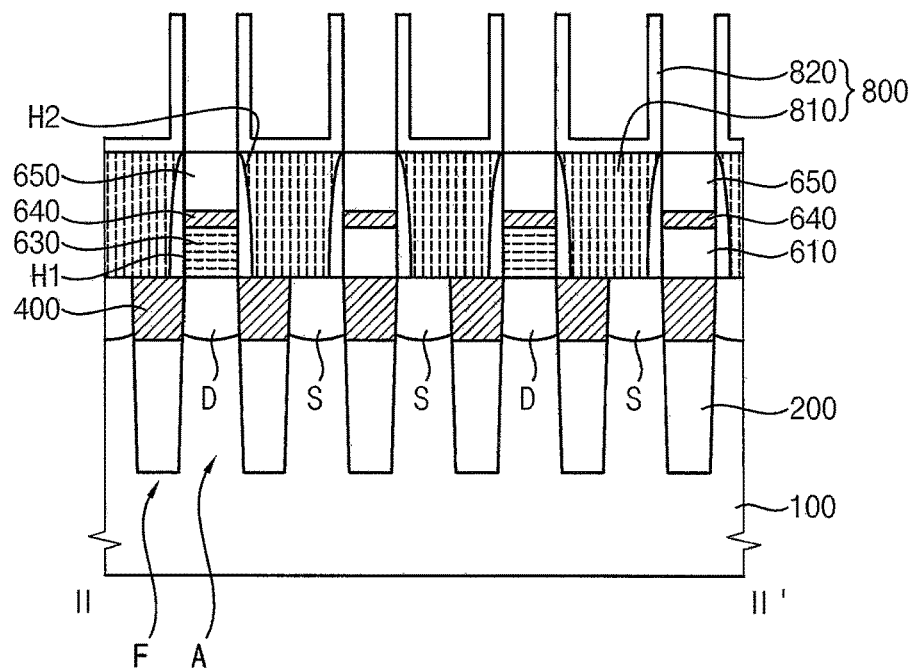
Figure 27B:
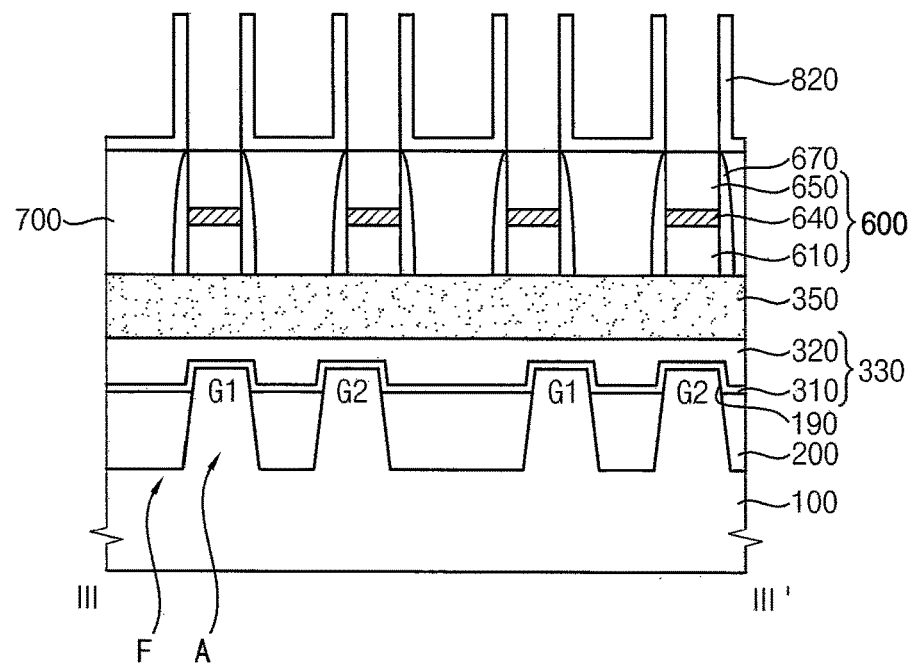
Figure 27C:
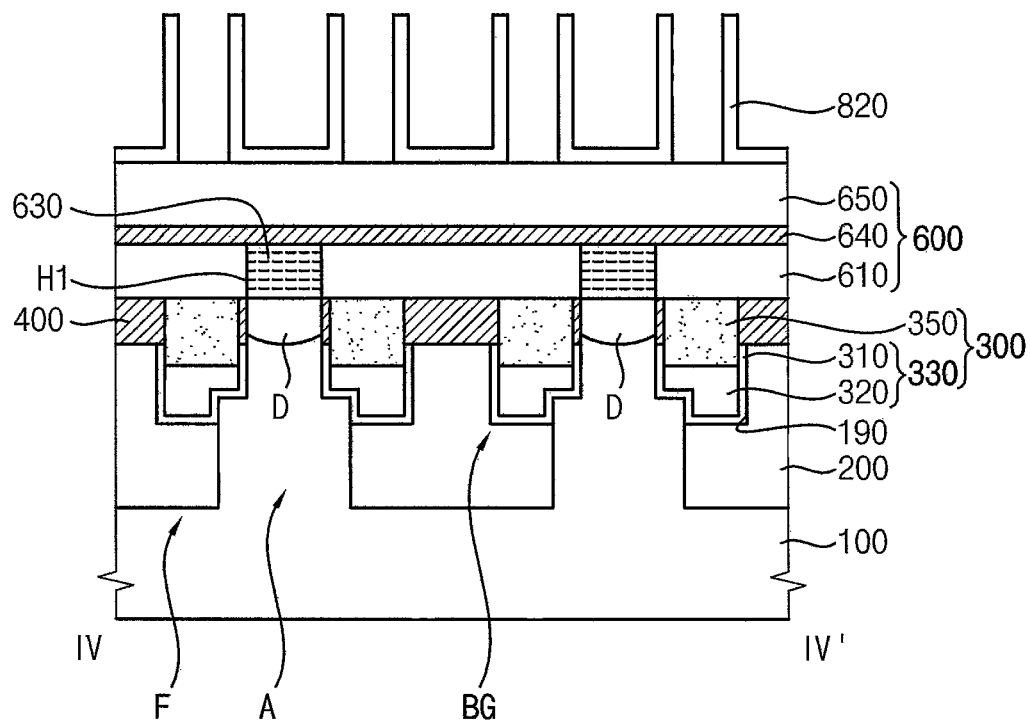

Referring to FIGS. 27A to 27C, a third preliminary conductive layer (not shown) may be formed on the insulation layer 700 to a sufficient thickness to fill up the second contact hole H2 and may be planarized by a planarization process, thereby forming the storage node contact 810 in the second contact hole H2. Thereafter, a capacitor 820 may be formed in such a way that a lower electrode of the capacitor 820 may contact the storage node contact 810. Accordingly, the source junction S may be electrically connected to the capacitor through the storage node contact 810, thereby forming the charge storage element 800.

The storage node contact 810 may be sufficiently insulated from the drain junction D by the junction separator 400 in spite of the misalignment between the second contact hole H2 and the source junction S. Thus, the electrical shortage between the storage node contact 810 and the bit line contact 630 may be sufficiently prevented in case of the cell size reduction and high integration degree of the memory devices.

Figure 28A:
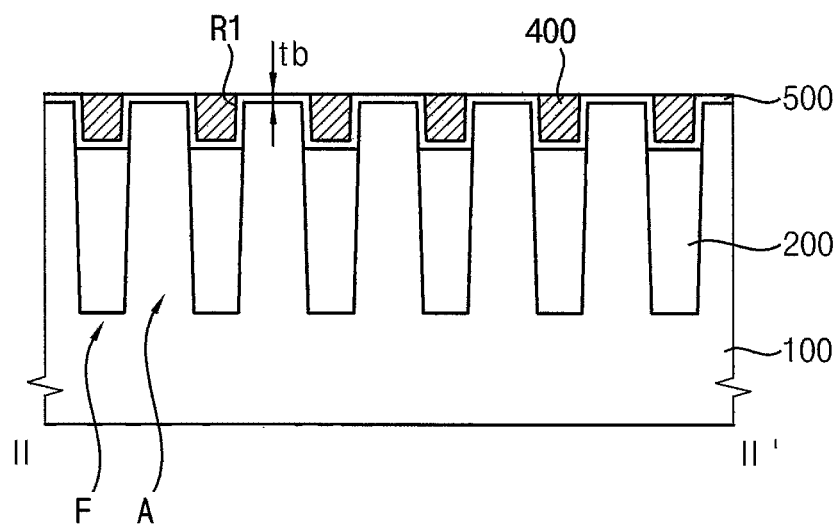
FIGS. 28A to 28C are cross-sectional views illustrating process steps for a method of manufacturing memory devices including the semiconductor device shown in FIG. 5 in accordance with certain example embodiments of the present inventive concept.
Figure 28B:
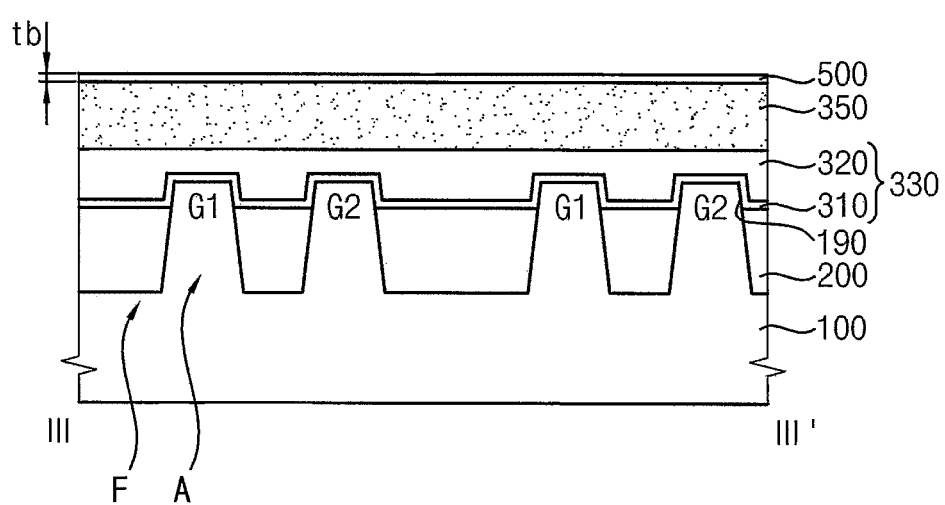
Figure 28C:
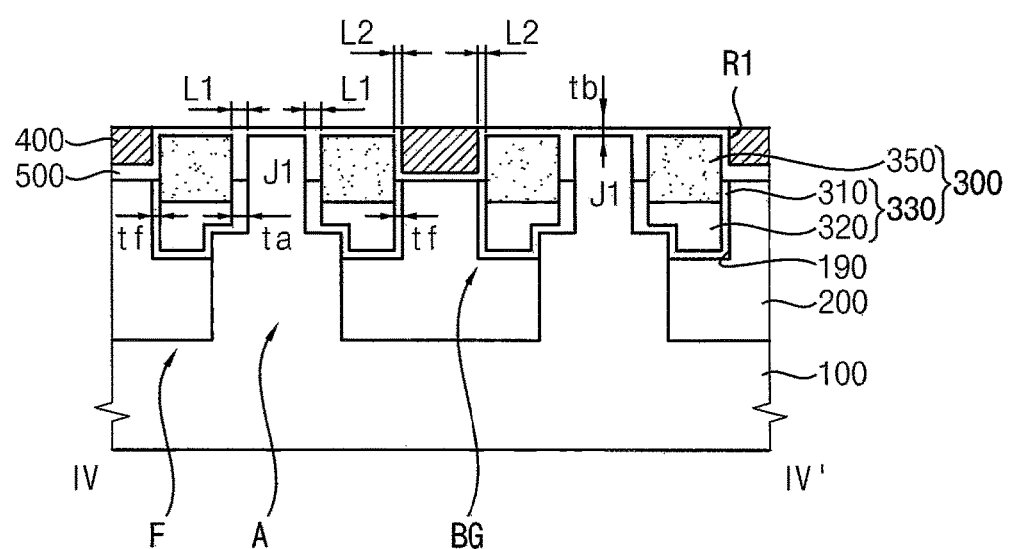

FIGS. 28A to 28C are cross-sectional views illustrating process steps for a method of manufacturing memory devices including the semiconductor device shown in FIG. 5 in accordance with an example embodiment. In FIGS. 28A to 28C, the same reference numerals denote the same elements in FIGS. 5 and 2.

Referring to FIGS. 28A to 28C, the recess R may be formed on the substrate 100 by the same process as described with reference to FIGS. 19A to 21C and the buffer layer 500 may be formed on the substrate 100 along a surface profile of the recess R.

For example, the buffer layer 500 may be formed the upper surface and the sidewall of the capping layer 350, the upper surface of the device isolation layer 200, the upper surface of the gate insulation layer 310 and the upper surface and the sidewall of the junction area J by an atomic layer deposition (ALD) process. For example, a silicon oxide layer may be formed as the buffer layer 500.

Particularly, the buffer layer 500 may be formed to a thickness corresponding to an active gap distance L1 between the capping layer 350 and the junction area J, so that the gap space between the capping layer 350 and the first and second junction areas J1 and J2 may be filled up with the buffer layer 500.

When a thermal oxidation process is performed and the silicon oxide layer is formed on the bottom and the sidewalls of the gate trench 190 as the gate insulation layer 310, the silicon oxide layer is formed to be thicker on the sidewall of the junction area J than on the sidewall of the device isolation layer 200 because a greater amount of silicon (Si) may be provided with the junction area J in the thermal oxidation process while a relatively smaller amount of silicon (Si) may be provided with the device isolation layer 200. For that reason, the gate insulation layer 310 may have an active thickness $t_a$ on the sidewall of the junction area J and a field thickness $t_f$ on the sidewall of the device isolation layer 200 in such a way that the active thickness $t_a$ may be greater than the field thickness $t_f$. Therefore, when completing the partial removal of the gate insulation layer 310 together with the device isolation layer 200, the active gap distance L1 may be greater than a field gap distance L2 between the device isolation layer 200 and the capping layer 350.

The ALD process for forming the buffer layer 500 may be controlled in such a way that the buffer layer may have a thickness corresponding to the active gap distance L1, and thus the buffer layer 500 may uniformly cover the capping layer 350 and the junction area J. Therefore, the recess R between the neighboring junction areas J may be reduced into the reduced recess R1 of which the volume may be reduced as much as the buffer layer 500.

High etch-resistive materials such as silicon nitride may be deposited on the buffer layer 500 to a sufficient thickness to fill up the reduced recess R1, thereby forming a preliminary junction separator (not shown) on the buffer layer 500. Thereafter, the preliminary junction separator may be planarized until the capping layer 350 and the junction area J are exposed in such a way that the preliminary junction separator remains only in the reduced recess R1, thereby forming the junction separator 400 in the reduced recess R1.

Since the upper surface of the junction separator 400 may be coplanar with the upper surface of the buffer layer 500, the junction separator 400 may be isolated like an island between the first-directed neighboring junctions J by the buffer layer 500, as shown in FIG. 6.

Thereafter, dopants may be implanted onto the junctions J by an ion implantation process and the source and drain junctions S and D may be formed on the junctions J of the active region A. The source and drain junctions S and D may constitute a buried channel array transistor together with the buried gate structure BG, as shown in FIG. 5.

Then, the second conductive line 600 contacting the drain junction D and the charge storage element 800 contacting the source junction S may be further formed on the substrate 100 by substantially the same process as described with reference to FIGS. 23A to 27C, thereby forming the memory device shown in FIGS. 16A and 16B.

Particularly, when the second contact hole H2 is expanded toward the alignment marginal area AMA in the field region F, the buffer layer 500 around the source junction S may also be removed in the etching process for forming the second contact hole H2 and thus the sidewall of the second junction area J2 may be exposed to the second contact hole H2. Accordingly, the storage node contact 810 may contact the upper sidewall as well as the upper surface of the second junction J2, and thus the contact area may be enlarged between the storage node contact 810 and the source junction S.

Figure 29A:
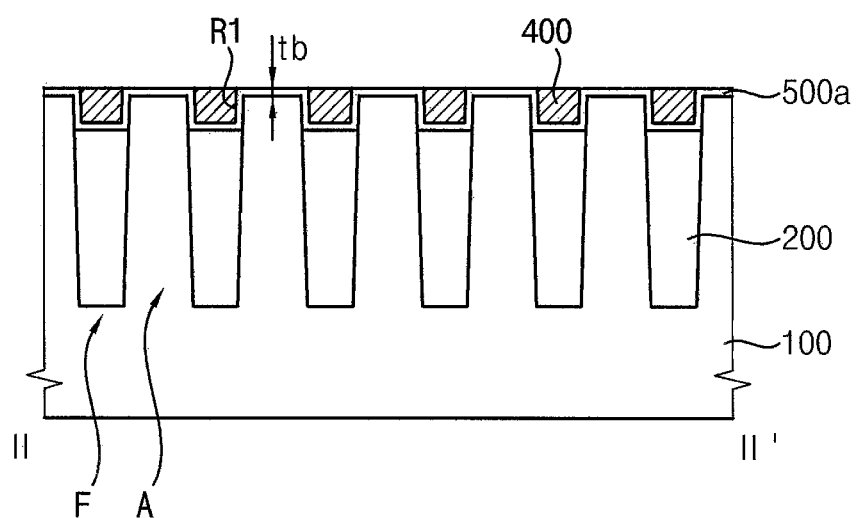
FIGS. 29A to 29C are cross-sectional views illustrating process steps for a method of manufacturing memory devices including the semiconductor device shown in FIG. 8 in accordance with certain example embodiments of the present inventive concept.
Figure 29B:
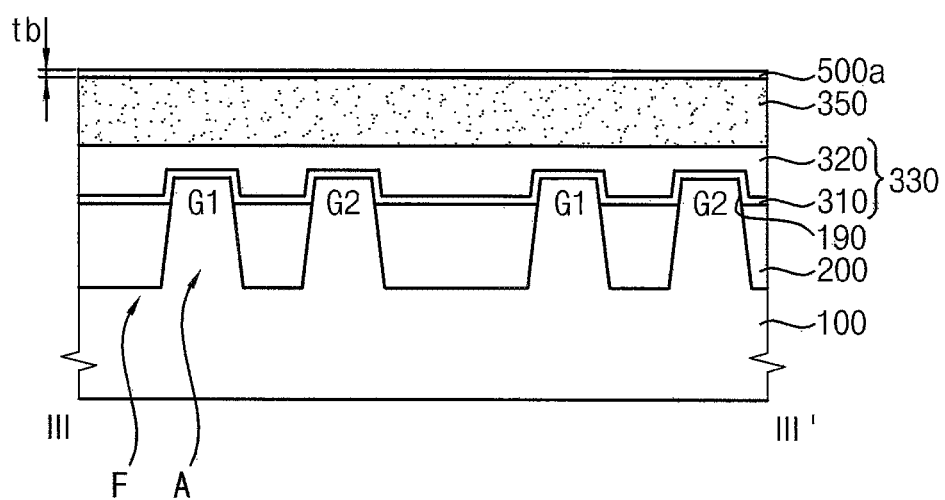
Figure 29C:
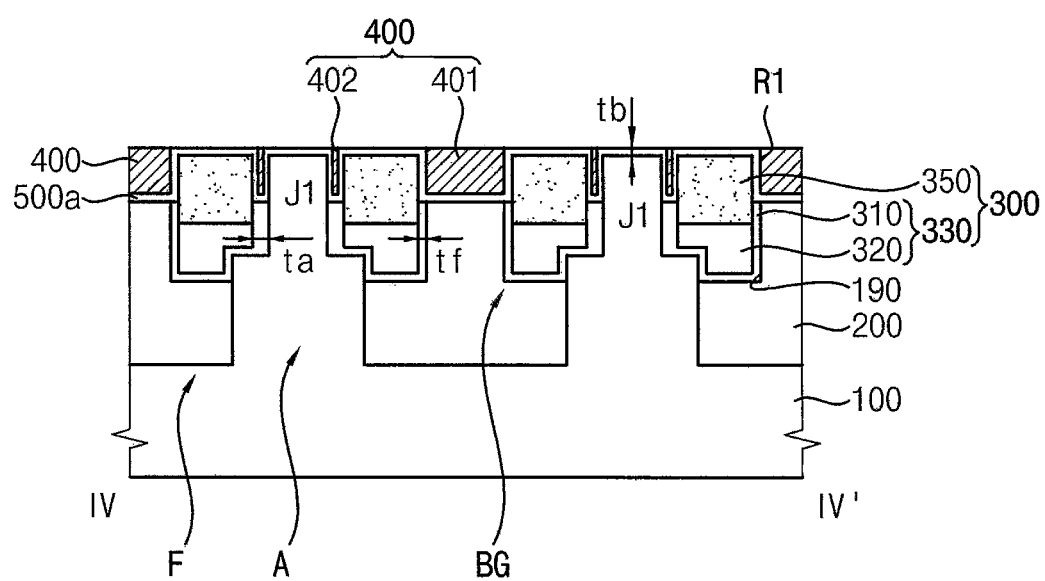

FIGS. 29A to 29C are cross-sectional views illustrating process steps for a method of manufacturing memory devices including the semiconductor device shown in FIG. 8 in accordance with an example embodiment. In FIGS. 29A to 29C, the same reference numerals denote the same elements in FIGS. 8 and 2.

Referring to FIGS. 29A to 29C, the recess R may be formed on the substrate 100 by the same process as described with reference to FIGS. 19A to 21C and the reduced buffer layer 500a may be formed on the substrate 100 along a surface profile of the recess R.

For example, the reduced buffer layer 500a may be formed on the upper surface and the sidewall of the capping layer 350, the upper surface of the device isolation layer 200, the upper surface of the gate insulation layer 310, and the upper surface and the sidewall of the junction area J by an atomic layer deposition (ALD) process based on the deposition conditions by which the thickness $t_b$ of the reduced buffer layer 500a may be smaller than the thickness of the gate insulation layer 310. Therefore, the separation strap 402 may be interposed between the junction area J and the capping layer 350. For example, a silicon oxide layer may be formed as the reduced buffer layer 500a.

When the reduced buffer layer 500a is formed to the thickness $t_b$ smaller than the active gap distance L1, a residual space may be provided between the capping layer 350 and the junction area J after forming the reduced buffer layer 500a.

Therefore, the insulation materials filling the residual space may be formed into the separation strap 402 by which the gate area G and the junction area J may be isolated from each other and the insulation materials filling the reduced recess Ra between the neighboring junction areas J in the first direction x may be formed into the planar separator 401 by which the neighboring junction areas J may be isolated from each other. Therefore, the junction separator 400 may include the planar separator 401 and the separation strap 402.

In the present example embodiment, an upper surface of the junction separator 400 may be coplanar with an upper surface of the reduced buffer layer 500a, and thus the reduced buffer layer 500a may be shaped into a loop enclosing the junction area J and the combination of the junction area J and the reduced buffer layer 500a may be isolated in the junction separator 400 like an island, as shown in FIG. 9.

Thereafter, dopants may be implanted onto the junctions J by an ion implantation process and the source and drain junctions S and D may be formed on the junctions J of the active region A. The source and drain junctions S and D may constitute a buried channel array transistor together with the buried gate structure BG, as shown in FIG. 8.

Then, the second conductive line 600 contacting the drain junction D and the charge storage element 800 contacting the source junction S may be further formed on the substrate 100 by substantially the same process as described with reference to FIGS. 23A to 27C, thereby forming the memory device shown in FIGS. 17A and 17B.

Particularly, since the separation strap 402 may be interposed between the gate area G and the junction area J, the electrical insulation performance between the buried gate structure BG and the junctions S and D and thus the gate-induced drain leakage (GDIL) may be effectively minimized in the memory device.

Figure 30A:
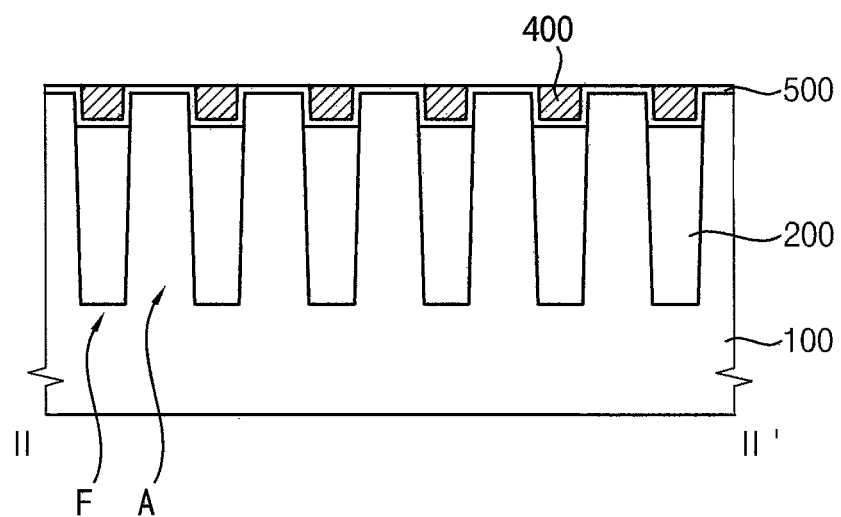
FIGS. 30A to 30C are cross-sectional views illustrating process steps for a method of manufacturing memory devices including the semiconductor device shown in FIG. 11 in accordance with certain example embodiments of the present inventive concept.
Figure 30B:
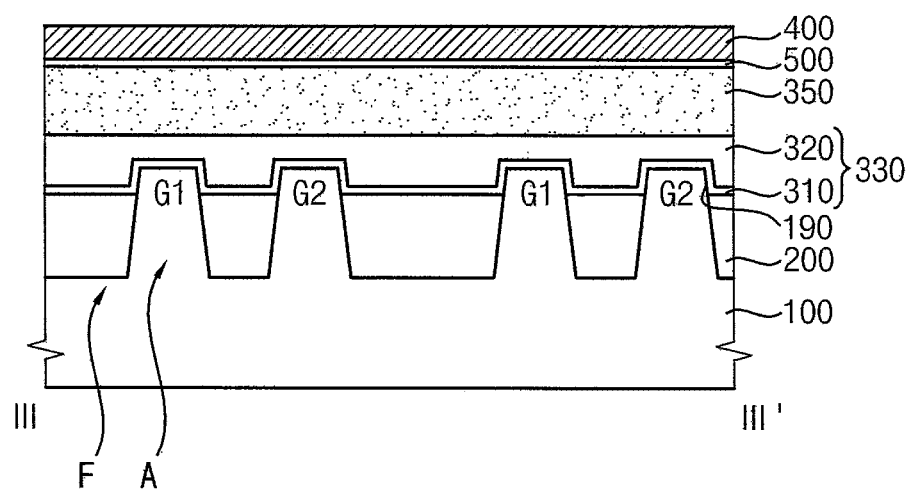
Figure 30C:
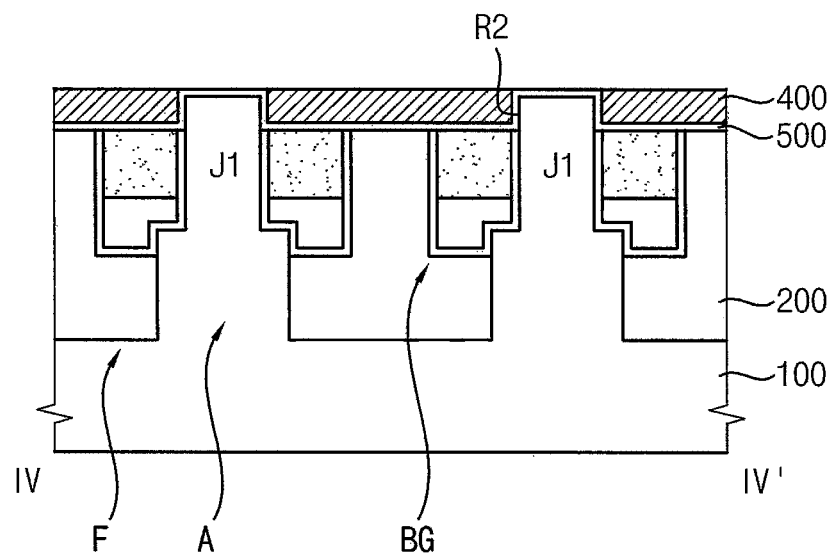

FIGS. 30A to 30C are cross-sectional views illustrating process steps for a method of manufacturing memory devices including the semiconductor device shown in FIG. 11 in accordance with an example embodiment. In FIGS. 30A to 30C, the same reference numerals denote the same elements in FIGS. 11 and 2.

Referring to FIGS. 30A to 30C, the recess R may be formed on the substrate 100 by the same process as described with reference to FIGS. 19A to 21C and may be expanded along the second direction y, thereby forming the expanded recess R2. The buffer layer 500 and the junction separator 400 may fill up the expanded recess R2.

For example, after completing the formation of the recess R by the removal of the upper portions of the device isolation layer 200 and the gate insulation layer 310, an upper portion of the capping layer 350 may be further removed from the substrate 100 in such a way that the upper surfaces of the capping layer 350, the device isolation layer 200 and the gate insulation layer 310 may be coplanar with one another. Thus, the junction area J may be higher than the device isolation layer 200, the capping layer 350 and the gate insulation layer 310, and the recess R may be expanded over the capping layer 350, thereby forming the expanded recess R2 in which the junction areas may protrude from the device isolation layer 200.

Then, the buffer layer 500 may be formed on the substrate 100 along a surface profile of the protruding junction areas J by the ALD process. The buffer layer 500 may include the silicon oxide layer.

High etch-resistive materials such as silicon nitride may be deposited on the buffer layer 500 to a sufficient thickness to fill up the expanded recess R2, thereby forming a preliminary junction separator (not shown) on the buffer layer 500. Thereafter, the preliminary junction separator may be planarized until the junction area J is exposed and thus the preliminary junction separator may remain only in the expanded recess R2, thereby forming the junction separator 400 in the expanded recess R2.

Therefore, the buffer layer 500 may be shaped into a loop enclosing the junction area J and the combinations of the loop-shaped buffer layer 500 and the junction area J may be isolated by the junction separator 400 like islands.

Thereafter, dopants may be implanted onto the junctions J by an ion implantation process and the source and drain junctions S and D may be formed on the junctions J of the active region A. The source and drain junctions S and D may constitute a buried channel array transistor together with the buried gate structure BG, as shown in FIG. 11.

Then, the second conductive line 600 contacting the drain junction D and the charge storage element 800 contacting the source junction S may be further formed on the substrate 100 by substantially the same process as described with reference to FIGS. 23A to 27C, thereby forming the memory device shown in FIGS. 18A and 18B.

Figure 31:
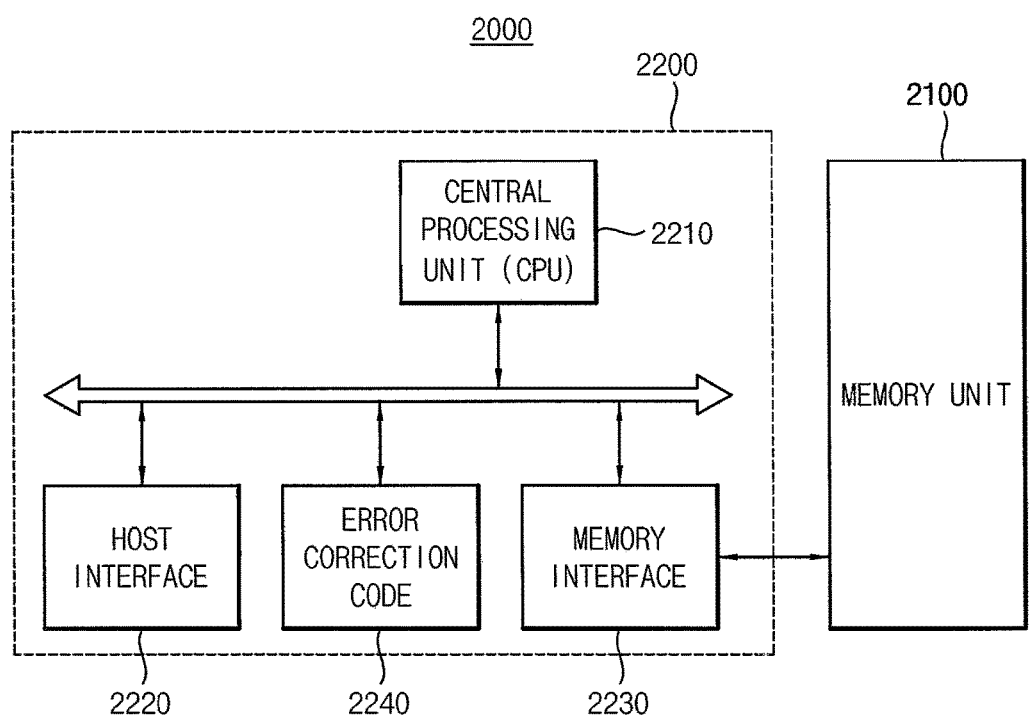
FIG. 31 is a block diagram illustrating a memory card including semiconductor devices in accordance with certain example embodiments.

FIG. 31 is a block diagram illustrating a memory card including one or more semiconductor devices in accordance with example embodiments.

Referring to FIG. 31, an electronic device such as the memory card 2000 in accordance with an example embodiment may include one or more of the semiconductor devices and/or memory devices described in detail with reference to FIGS. 1 to 30C.

For example, the memory card 2000 may include a memory unit 2100 including a plurality of memory devices and storing data transferred from an external host (not shown) and a memory controller 2200 electrically connected to the host and controlling data transfer between the memory unit and the host.

The memory unit 2100 may include one of the dynamic random access memory (DRAM) devices described in detail with reference to FIGS. 1 to 30C and electronic data may be transferred and stored to the memory unit 2100 from the host. The storage capacity of the memory unit 2100 may be determined by the number and capacity of the DRAM device, and thus the performance of the memory card 2000 may be determined by the performance of the DRAM device.

The memory controller 2200 may include a central process unit (CPU) 2210 for controlling the data transfer between the host and the memory unit 2100, a host interface 2220 having a data transfer protocol of the host, a memory interface 2230 connected to the memory unit 2100 and an error correction code 2240 for detecting and correcting errors of the electronic data in the memory unit 2100. In some embodiments, the CPU 2210 may further include supplemental memory devices for an operational buffer memory. The supplemental memory device may include, for example a static random access memory (SRAM) device.

The DRAM device in the memory unit 2100 may include any one of the semiconductor devices shown in FIGS. 1, 5, 8 and 11, so the junction separator 400 on the device isolation layer 200 may sufficiently separate and insulate the bit line contact and the storage node contact from each other in a small occupation area, thereby preventing the electrical connection or the electrical shortage between the bit line contact and the storage node contact in spite of the cell size reduction of the DRAM device.

Accordingly, the operational reliability of the memory card 2000 may be sufficiently improved due to the operational reliability of the memory devices of the memory unit 2100 in spite of the cell size reduction and high integration degree of the DRAM devices. Particularly, when one or more DRAM devices of the memory unit 2100 are manufactured into a buried channel array transistor (BCAT) structure, the memory card 2000 may have sufficiently high integration degree and system stability together with considerably high storage capacity and operation speed.

Figure 32:
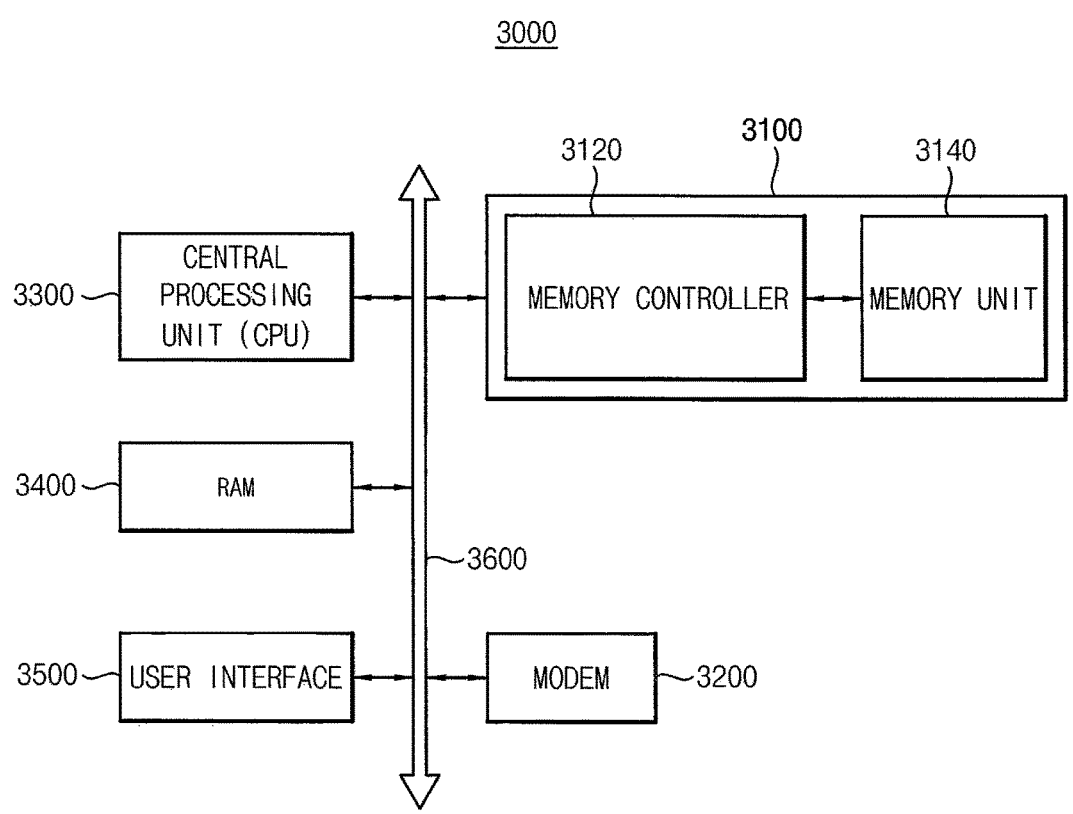
FIG. 32 is a block diagram illustrating an electronic system having semiconductor devices in accordance with certain example embodiments.

FIG. 32 is a block diagram illustrating an electronic system having one or more semiconductor devices in accordance with example embodiments.

Referring to FIG. 32, the electronic system 3000 in accordance with an example embodiment may include one or more semiconductor devices and/or memory devices shown in FIGS. 1 to 30C. The electronic system 3000 may include various mobile systems (e.g., a smart phone and a tablet computer) and traditional computer systems (e.g., a laptop computer system and a desktop computer system).

For example, the electronic system 3000 may include a memory system 3100 and a central process unit (CPU) 3300, a random access memory (RAM) device and a user interface 3500 that may be connected to the memory system 3100 through a system bus line 3600. The memory system 3100 may store electronic data that may be processed at the CPU 3300 or may be transferred from the external data source.

The memory system 3100 may include a memory unit 3140 and a memory controller 3120. The memory unit 3140 and the memory controller 3120 may have the same structure as the memory card 2000 shown in FIG. 31, and thus the memory unit 3140 and the memory controller 3120 may be the same semiconductor devices and memory devices as described in detail with reference to FIGS. 1 and 30C. Therefore, the junction separator on the device isolation layer may sufficiently separate and insulate the bit line contact and the storage node contact from each other in a small occupation area, thereby preventing the electrical connection or the electrical shortage between the bit line contact and the storage node contact in spite of the cell size reduction of the DRAM device.

Accordingly, the operational reliability of the memory card 2000 may be sufficiently improved due to the operational reliability of the memory devices of the memory unit 2100 in spite of the cell size reduction and high integration degree of the DRAM devices. Particularly, when the DRAM devices of the memory unit 3140 may be manufactured into the buried channel array transistor (BCAT) structure, the memory unit 3140 may have sufficiently high integration degree and system stability together with considerably high storage capacity and operation speed.

According to the example embodiments of the disclosed semiconductor devices and the method of manufacturing the same, the junction separator may be provided on the device isolation layer between the neighboring source junction and drain junction in a buried channel array transistor and the junction separator may have an improved etch resistance and electrical insulation than the device isolation layer.

Thus, although the storage node contact may expand over the alignment marginal area of the field region around the source junction due to the misalignment of the source junction and the storage node contact hole, the electrical shortage between the neighboring bit line contact and the storage node contact may be sufficiently prevented by the junction separator. Since the junction separator may be significantly more etch-resistive than the device isolation layer such as the sidewall oxide layer, the high insulating materials may be still remain in the neighborhood of the source junction including the alignment marginal area and thus the source junction may be sufficiently isolated by the junction separator in spite of the cell size reduction. The drain junction D may also be defined and insulated by the same junction separator in the same way. Therefore, the electrical connection between the neighboring source and drain junctions may be prevented by the junction separator when the semiconductor devices are downsized with high integration degree, thereby improving the operational reliability and stability of the semiconductor devices.

The disclosed embodiments of the junction separator may be applied to various electronic industry fields such as the semiconductor memory, display driving integrated chips (DDI), and communication integrated chips.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a substrate having an active region defined by a device isolation layer and at least a gate trench linearly extending in a first direction to cross the active region, the active region having a gate area at a bottom of the gate trench and a junction area at a surface of the substrate;

a first conductive line filling the gate trench and extending in the first direction, the first conductive line having a buried gate structure on the gate area of the active region;

a junction including implanted dopants at the junction area of the active region; and a junction separator on the device isolation layer and defining the junction, the junction separator formed of an insulative material and having an etch resistance greater than that of the device isolation layer.

2. The semiconductor device of claim 1, wherein the first conductive line includes a gate insulation layer covering a bottom surface and side surfaces of the gate trench, a gate line filling a lower portion of the gate trench on the gate insulation layer and a capping layer filling an upper portion of the gate trench on the gate line.

3. The semiconductor device of claim 2, wherein the capping layer and the junction are protrude from the device isolation layer, and the junction separator is arranged on the gate insulation layer and the device isolation layer contacting a side surface of the capping layer such that an upper surface of the junction separator is coplanar with an upper surface of the capping layer.

4. The semiconductor device of claim 3, wherein the device isolation layer includes a sidewall oxide layer and the junction separator includes a silicon nitride layer.

5. The semiconductor device of claim 2, further comprising a buffer layer on the substrate on which the capping layer and the junction are protrude from the device isolation layer, such that the buffer layer is arranged along a surface profile of the substrate to thereby cover the capping layer, the device isolation layer, and the junction and the junction separator is arranged on the buffer layer.

6. The semiconductor device of claim 5, wherein the buffer layer includes a silicon oxide layer, the junction separator includes a silicon nitride layer, the capping layer includes a silicon nitride layer, and the device isolation layer includes a sidewall oxide layer.

7. The semiconductor device of claim 5, wherein the buffer layer has a thickness smaller than that of the gate insulation layer such that the buffer layer is shaped into a ring which encloses the junction and is isolated by the junction separator.

8. The semiconductor device of claim 2, further comprising a buffer layer on the substrate on which the junction protrudes from the device isolation layer, and the capping layer and the device isolation layer have a same upper surface in such a configuration that the buffer layer is arranged along a surface profile of the substrate to thereby cover the device isolation layer, the capping layer and the protruded junction and the junction separator is arranged on the buffer layer.

9. The semiconductor device of claim 1, wherein a pair of the gate trenches crosses a single active region of the substrate such that a pair of the gate areas is provided on the single active region and the junction area includes a first junction area at a central portion of the active region between the gate areas and a second junction area at both end portions of the active region, and wherein the buried gate structure is arranged on each of the gate areas and the junction includes a drain junction arranged on the first junction area at the central portion of the active region and a source junction arranged on the second junction area at both end portions of the active region, thereby providing a pair of buried cell array transistors on the single active region.

10. The semiconductor device of claim 9, further comprising a second conductive line extending in a second direction and contacting the drain junction, and a charge storage element contacting the source junction.

* * * * *